(12) United States Patent  
Yamashita et al.

(10) Patent No.: US 7,635,850 B2  
(45) Date of Patent: Dec. 22, 2009

(54) ION IMPLANTER

(75) Inventors: Takatoshi Yamashita, Kyoto (JP); Tadashi Ikejiri, Kyoto (JP); Kohei Tanaka, Kyoto (JP); Weijiang Zhao, Kyoto (JP); Hideyuki Tanaka, Miyagi (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 241 days.

(21) Appl. No.: 11/870,333

(22) Filed: Oct. 10, 2007

(65) Prior Publication Data

US 2008/0135777 A1 Jun. 12, 2008

Related U.S. Application Data

(60) Provisional application No. 60/874,006, filed on Dec. 11, 2006.

(30) Foreign Application Priority Data

Oct. 11, 2006 (JP) ............... P.2006-278094

(51) Int. Cl.  
*H01J 37/317* (2006.01)  
*H01J 37/147* (2006.01)  
*H01J 3/14* (2006.01)

(52) U.S. Cl. .............. 250/492.21; 250/423 R; 250/396 R; 250/397; 250/281; 250/294; 250/298; 250/299

(58) Field of Classification Search ............ 250/492.21, 250/397, 396 R, 423 R, 281, 294, 298, 299; 335/210

See application file for complete search history.

(56) References Cited

U.S. PATENT DOCUMENTS 7,326,941 B2 * 2/2008 Chen et al. ............. 250/492.21  
2008/0135753 A1 * 6/2008 Yamashita et al. .......... 250/310

FOREIGN PATENT DOCUMENTS

JP 2004-152557 5/2004  
JP 2005-327713 11/2005

* cited by examiner

*Primary Examiner*—Nikita Wells  
(74) *Attorney, Agent, or Firm*—Finnegan, Henderson, Farabow, Garrett & Dunner, LLP

(57) ABSTRACT

An analyzing electromagnet constituting an ion implanter has a first inner coil, a second inner coil, three first outer coils, three second outer coils, and a yoke. The inner coils are saddle-shaped coils cooperating with each other to generate a main magnetic field which bends an ion beam in the X direction. Each of the outer coils is a saddle-shaped coil which generates a sub-magnetic field correcting the main magnetic field. Each of the coils has a configuration where a notched portion is disposed in a fan-shaped cylindrical stacked coil configured by: winding a laminations of an insulation sheet and a conductor sheet in multiple turn on an outer peripheral face of a laminated insulator; and forming a laminated insulator on an outer peripheral face.

20 Claims, 56 Drawing Sheets

FIG. 3
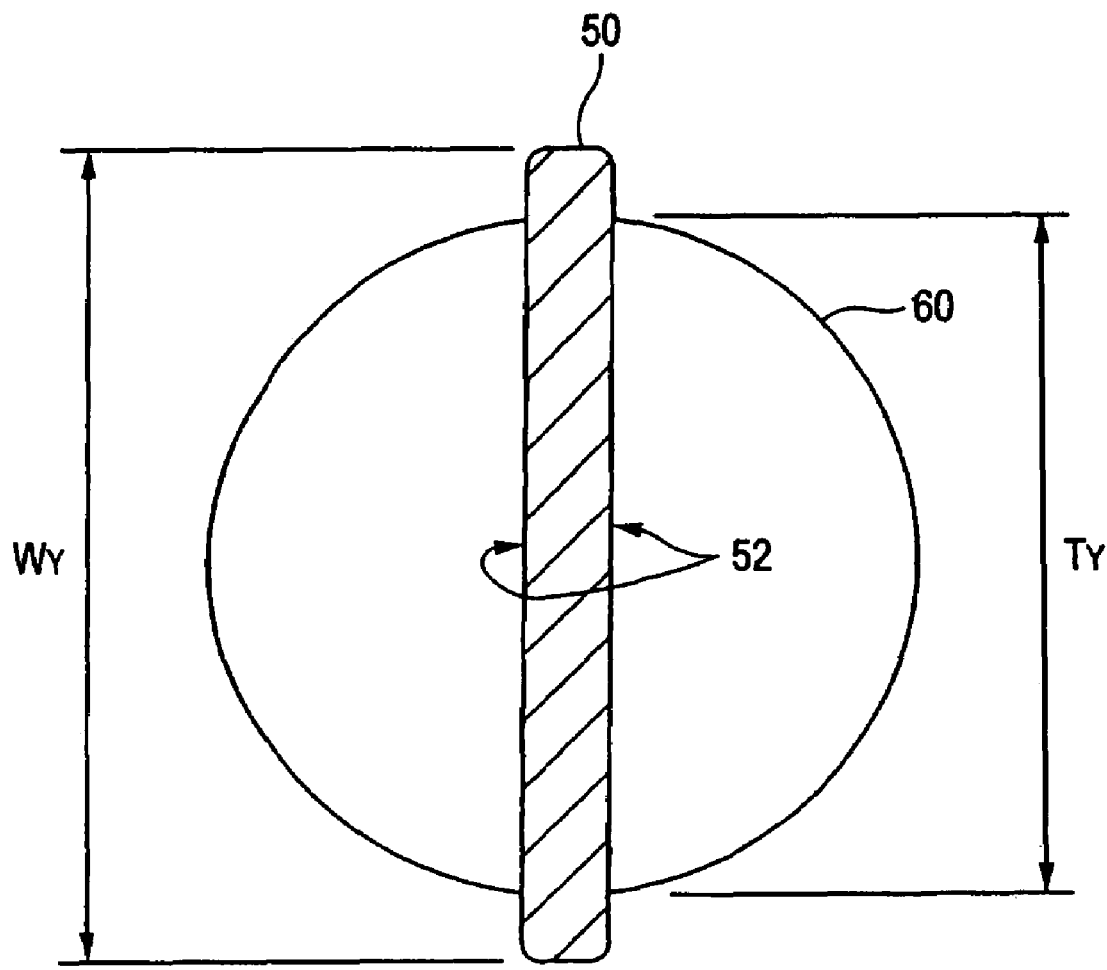
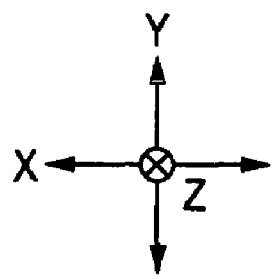

FIG. 8
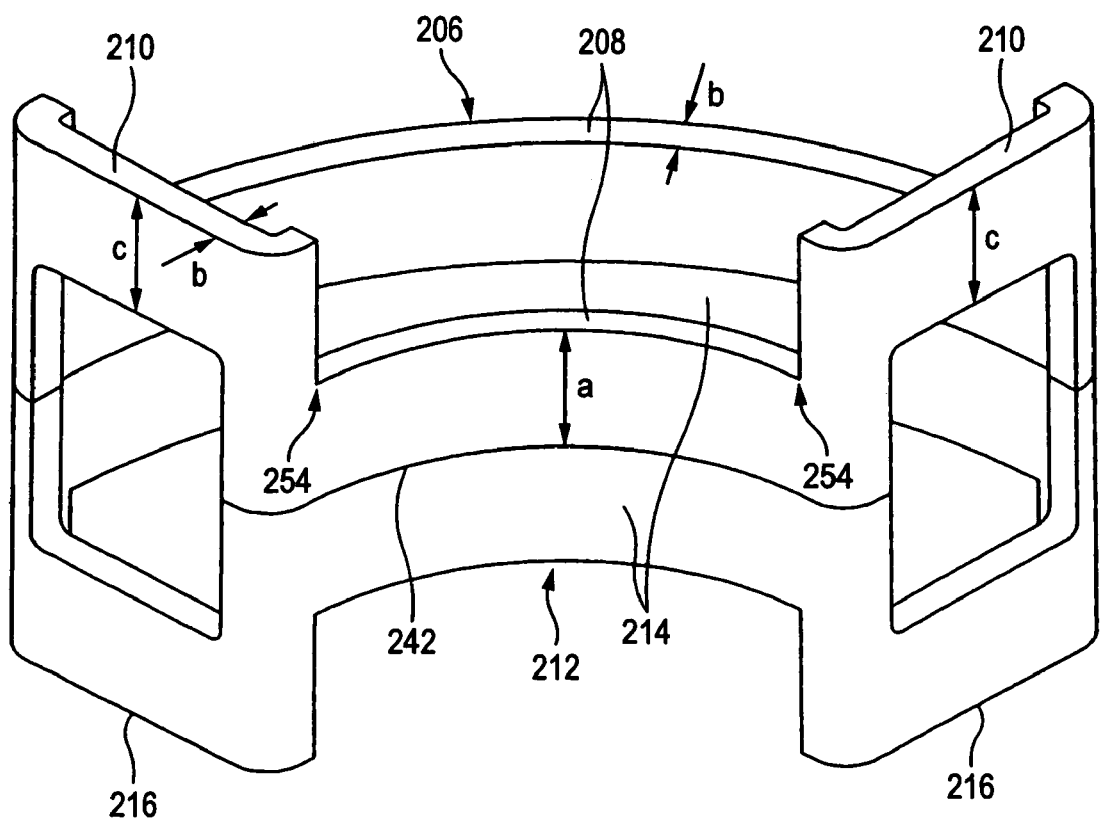
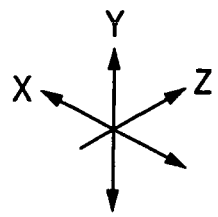

FIG. 21
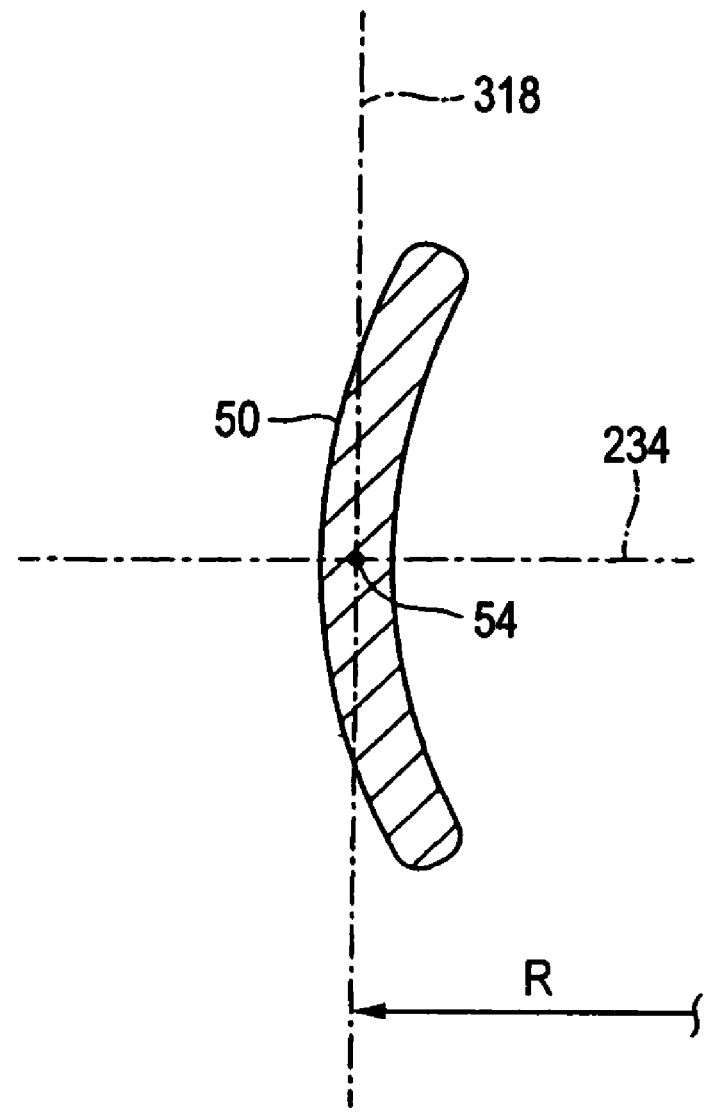
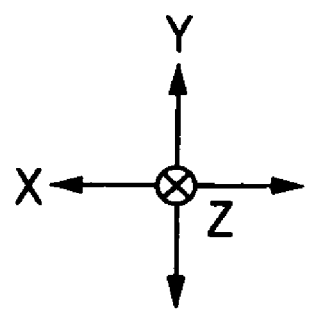

ION IMPLANTER

CROSS REFERENCE TO RELATED APPLICATIONS

This application claims the priority of Japanese Patent Application No. 2006-278094, filed Oct. 11, 2006, and claims the benefit of U.S. Provisional Application No. 60/874,006, filed Dec. 11, 2006, the contents of both of which are incorporated herein by reference.

TECHNICAL FIELD

The present disclosure relates to an ion implanter in which a ribbon-like ion beam is passed through an analyzing electromagnet to perform momentum analysis (for example, mass analysis) of the ion beam, and then caused to be incident on a substrate, thereby performing ion implantation on the substrate.

RELATED ART

In order to, for example, perform ion implantation on a large substrate, an ion beam having a ribbon like (this is called also a sheet-like or a strip-like, the same shall apply hereinafter) shape is sometimes used.

An example of an ion implanter in which a ribbon-like ion beam is passed through an analyzing electromagnet to perform momentum analysis (for example, mass analysis, the same shall apply hereinafter) of the ion beam, and then caused to be incident on a substrate, thereby performing ion implantation on the substrate is disclosed in, for example, Patent Reference 1.

An example of an analyzing electromagnet which is directed to momentum analysis of a ribbon-like ion beam is disclosed in, for example, Patent Reference 2.

A conventional analyzing electromagnet disclosed in Patent Reference 2 will be described with reference to FIG. 56. In the figure, in order to facilitate the understanding of the shapes of coils 12, 18, a yoke 36 is indicated by two-dot chain lines. The traveling direction of an ion beam 2 is set as the Z direction, and two directions which are substantially orthogonal to each other in a plane that is substantially orthogonal to the Z direction are set as the X and Y directions, respectively. In the analyzing electromagnet 40, then, the ribbon-like ion beam 2 which extends in the Y direction is vertically elongated incidents on an inlet 24 and is emitted from an outlet 26.

The analyzing electromagnet 40 has a configuration in which the upper and lower or two coils 12, 18 such as shown in FIG. 1 of Patent Reference 2 are combined with the yoke 36 corresponding to a yoke shown in FIG. 21 of the reference.

The coil 12 is a saddle-shaped coil (in Patent Reference 2, referred to as a banana-shaped coil), and has: one set of body portions (in Patent Reference 2, referred to as coil main portions) 14 that are opposed to each other across a path (beam path) of the ion beam 2; and one set of connecting portions (in Patent Reference 2, referred to as end raised portions) 16 that are obliquely raised so as to avoid the beam path, and connect end portions of the body portions 14 in the Z direction with each other. The connecting portions 16 are obliquely raised in the inlet 24 and the outlet 26 in order that the ion beam 2 is prevented from hitting the portions and a beam passing region is ensured.

Also the coil 18 is a saddle-shaped coil having a similar structure as the coil 12 (however having a shape which is plane symmetrical to the coil 12), and has one set of body portions 20 and one set of connecting portions 22.

Each of the coils 12, 18 is a multi-turn coil in which a conductor where the periphery is coated by an insulator (coated conductor) is wound many times, and produced by a method in which a coil having a fan-like plan-view shape is bent in the vicinities of the both ends to form the connecting portions 16, 22. As the conductor, usually, a hollow conductor through which a cooling medium (for example, cooling water) can flow is used. In the specification, "insulation" means electrical insulation.

The yoke 36 collectively surrounds the outer sides of the body portions 14, 20 of the coils 12, 18.

[Patent Reference 1] JP-A-2005-327713 (Paragraph 0010, FIGS. 1 to 4)

[Patent Reference 2] JP-A-2004-152557 (Paragraphs 0006 and 0022, FIGS. 1 and 21)

The analyzing electromagnet 40 has the following problems.

(1) In the inlet 24 and the outlet 26, the projection distances $L_1$ by which the connecting portions 16, 22 are projected from the yoke 36 in the directions of beam incidence and emission are large. This is caused mainly by the following reasons.

(a) In order to allow the ribbon-like ion beam 2 which is elongated in the Y direction to deflect as uniformly as possible, the body portions 14, 20 of the coils 12, 18 must be set so as to be vertically elongated by increasing the dimension a in the Y direction (more vertically elongated than the example shown in FIG. 56). As described above, in the coils 12, 18, a bending process is applied to fan-shaped coils to form the connecting portions 16, 22. Therefore, the dimension a is reflected substantially directly in the projection distance $L_1$. As the dimension a is more increased, consequently, also the projection distance $L_1$ is more increased.

(b) In the coils 12, 18, the connecting portions 16, 22 are formed by applying a bending process to fan-shaped coils as described above. Because of restrictions on the bending process, relatively large bent portions 30, 32 are inevitably formed in the vicinities of borders between the body portions 14, 20 and the connecting portions 16, 22. The existence of the bent portions 30, 32 causes the distance $L_2$ between end portions of the yoke 36 and end portions of the connecting portions 16, 22 to be increased. Because the distance $L_2$ is included in the projection distance $L_1$, the projection distance $L_1$ is increased. Because of restrictions on the bending process, as the dimension a is more increased, the radii curvature of the bent portions 30, 32 must be more increased, and the distance $L_2$ and therefore the projection distance $L_1$ are further prolonged.

The projection distance $L_1$ can be indicated by the following expression.

$$L_1 = a + L_2. \qquad [\text{Exp. 1}]$$

(c) The connecting portions 16, 22 are obliquely raised. Therefore, this also causes the increasing of the projection distance $L_1$.

As described above, when the projection distances $L_1$ of the connecting portions 16, 22 from the yoke 36 are large, the analyzing electromagnet 40 is accordingly enlarged, and also the area required for installing the analyzing electromagnet 40 is increased. Therefore, also an ion implanter is enlarged, and also the area required for installing the ion implanter is increased. Furthermore, the weight of the analyzing electromagnet 40 is increased. Moreover, the possibility that the magnetic field generated by the connecting portions 16, 22 which are outside the yoke 36 (this magnetic field is also called a fringe field) disturbs the form (the shape and the attitude, the same shall apply hereinafter) of the ion beam 2 is increased.

(2) The power consumption of the coils 12, 18 is large. This is caused mainly by the following reasons.

(a) The connecting portions 16, 22 do not generate a magnetic field for deflecting the ion beam 2. As described above, the projection distances $L_1$ of the connecting portions 16, 22 are large. Therefore, the lengths of the connecting portions 16, 22 are correspondingly increased, and the power consumption is wastefully large in the connecting portions 16, 22. This causes the power consumption of the coils 12, 18 to be increased.

(b) As described above, the coils 12, 18 are multi-turn coils of a coated conductor. Therefore, it is difficult to increase the ratio of the conductor area (i.e., the space factor of the conductor) in the section of the coil 12, 18. Accordingly, the power loss is correspondingly large, and the power consumption is increased. In the case where the coated conductor is a hollow conductor, the space factor of the conductor is more reduced, so that the power loss is further enlarged. Therefore, the power consumption is further increased.

As described above, when the power consumption of the coils 12, 18 is large, the power consumption of the analyzing electromagnet 40 is large, and therefore also that of the ion implanter is large.

SUMMARY

Exemplary embodiments of the present invention reduce the projection distances of connecting portions of a coil, thereby enabling the size and power consumption of an analyzing electromagnet to be reduced, and therefore enabling the size and power consumption of an ion implanter to be reduced.

One of the ion implanters according to a first aspect of the present invention is (a) an ion implanter in which a traveling direction of an ion beam is set as a Z direction, two directions which are substantially orthogonal to each other in a plane that is substantially orthogonal to the Z direction are set as X and Y directions, respectively, and a ribbon-like ion beam in which a dimension in the Y direction is larger than a dimension in the X direction is transported to irradiate a substrate, thereby performing ion implantation, wherein the ion implanter comprises:

an ion source that generates the ribbon-like ion beam in which the Y-direction dimension is larger than a dimension in the Y direction of the substrate;

an analyzing electromagnet which bends the ion beam from the ion source in the X direction to analyze a momentum, and which forms a focus of an ion beam of a desired momentum, in a downstream side;

an analysis slit which is disposed in a vicinity of the focus of the ion beam from the analyzing electromagnet, and which cooperates with the analyzing electromagnet to analyze the momentum of the ion beam;

an accelerating/decelerating device which bends the ion beam passed through the analysis slit, in the X direction by means of an electrostatic field, and which accelerates or decelerates the ion beam by means of the electrostatic field; and a substrate driving device which, at an implanting position where the ion beam passed through the accelerating/decelerating device is caused to be incident on the substrate, moves the substrate in a direction intersecting with a principal face of the ion beam, (b) the analyzing electromagnet comprises:

a coil having: one set of body portions that are opposed to each other in the X direction across the beam path through which the ion beam passes; and at least one set of connecting portions that connect end portions of the body portions in the Z direction with each other, while avoiding the beam path, the coil generating a magnetic field which bends the ion beam in the X direction; and a yoke which collectively surrounds outer sides of the body portions of the coil, and (c) the coil of the analyzing electromagnet has a configuration in which a notched portion is disposed in a fan-shaped cylindrical stacked coil while leaving the body portions and the connecting portions, the stacked coil being configured by: stacking laminations of an insulation sheet and conductor sheet in which a principal face extends along the Y direction, on an outer peripheral face of a laminated insulator, while winding the laminations in multiple turns; and forming a laminated insulator on an outer peripheral face of the stack.

In the analyzing electromagnet constituting the ion implanter, the coil is configured so that the notched portion is disposed in the fan-shaped cylindrical stacked coil as described above while leaving the body portions and the connecting portions, and hence the connecting portions are in a state where the portions are extended in the Y direction from end portions of the body portions in substantially parallel. Even in the case where the dimension in the Y direction of the body portions is increased, therefore, the case is coped with by correspondingly increasing the dimension in the Y direction of the connecting portions. As a result, the projection distances of the connecting portions in the directions of beam incidence and emission are not increased. According to the structure, the distances by which the connecting portions of the coil are projected from the yoke in the directions of beam incidence and emission can be reduced.

In accordance with that the projection distances of the connecting portions of the coil can be reduced, also the lengths of the connecting portions can be shortened, and hence wasteful power consumption in the connecting portions can be reduced. Moreover, the coil has the structure in which the conductor sheets are stacked with interposing the insulation sheet therebetween. As compared with a multi-turn coil in which a coated conductor is wound many times, therefore, the space factor of the conductor is high, and the power loss is correspondingly low. Consequently, the power consumption can be reduced.

As a result, the size and power consumption of the analyzing electromagnet can be reduced, and therefore the size and power consumption of the ion implanter can be reduced.

According to a second aspect of the present invention, the analyzing electromagnet may be configured so that the analyzing electromagnet comprises:

a first coil which is a saddle-shaped coil having: one set of body portions that are opposed to each other in the X direction across the beam path through which the ion beam passes, and that cover about a half or more of one side of the ion beam in the Y direction; and one set of connecting portions that connect end portions of the body portions in the Z direction with each other, while avoiding the beam path, the first coil cooperating with a second coil to generate a magnetic field which bends the ion beam in the X direction;

the second coil which is a saddle-shaped coil having: one set of body portions that are opposed to each other in the X direction across the beam path, and that cover about a half or more of another side of the ion beam in the Y direction; and one set of connecting portions that connect end portions of the body portions in the Z direction with each other, while avoiding the beam path, the second coil being disposed overlappingly with the first coil in the Y direction, and cooperating with the first coil to generate a magnetic field which bends the ion beam in the X direction; and a yoke which collectively surrounds outer sides of the body portions of the first and second coils, and each of the first and second coils of the analyzing electromagnet has a configuration in which a notched portion is disposed in a fan-shaped cylindrical stacked coil while leaving the body portions and the connecting portions, the stacked coil being configured by: stacking laminations of an insulation sheet and conductor sheet in which a principal face extends along the Y direction, on an outer peripheral face of a laminated insulator, while winding the laminations in multiple turns; and forming a laminated insulator on an outer peripheral face of the stack.

According to a third aspect of the present invention, the analyzing electromagnet may be configured so that the analyzing electromagnet comprises:

an inner coil having: one set of body portions that are opposed to each other in the X direction across the beam path through which the ion beam passes; and a connecting portion which connects end portions of the body portions in the Z direction with each other, while avoiding the beam path, the inner coil generating a main magnetic field which bends the ion beam in the X direction;

one or more first outer coils which are saddle-shaped coils having: one set of body portions that are outside the inner coil, and that are opposed to each other in the X direction across the beam path; and one set of connecting portions that connect end portions of the body portions in the Z direction with each other, while avoiding the beam path, the first outer coils generating a sub-magnetic field which assists or corrects the main magnetic field;

one or more second outer coils which are saddle-shaped coils having: one set of body portions that are outside the inner coil, and that are opposed to each other in the X direction across the beam path; and one set of connecting portions that connect end portions of the body portions in the Z direction with each other, while avoiding the beam path, the second outer coils being disposed overlappingly with the first outer coils in the Y direction, and generating a sub-magnetic field which assists or corrects the main magnetic field; and a yoke which collectively surrounds outer sides of the body portions of the inner coil, and the first and second outer coils, and each of the inner coil, and the first and second outer coils of the analyzing electromagnet has a configuration in which a notched portion is disposed in a fan-shaped cylindrical stacked coil while leaving the body portions and the connecting portions, the stacked coil being configured by: stacking laminations of an insulation sheet and conductor sheet in which a principal face extends along the Y direction, on an outer peripheral face of a laminated insulator, while winding the laminations in multiple turns; forming a laminated insulator on an outer peripheral face of the stack; stacking laminations of an insulation sheet and conductor sheet in which a principal face extends along the Y direction, on an outer peripheral face of the stack, while winding the laminations in multiple turns; and forming a laminated insulator on an outer peripheral face of the stack.

According to a fourth aspect of the present invention, the analyzing electromagnet may be configured so that the analyzing electromagnet comprises:

a first inner coil which is a saddle-shaped coil having: one set of body portions that are opposed to each other in the X direction across the beam path through which the ion beam passes, and that cover about a half or more of one side of the ion beam in the Y direction; and one set of connecting portions that connect end portions of the body portions in the Z direction with each other, while avoiding the beam path, the first coil cooperating with a second inner coil to generate a main magnetic field which bends the ion beam in the X direction;

the second inner coil which is a saddle-shaped coil having: one set of body portions that are opposed to each other in the X direction across the beam path, and that cover about a half or more of another side of the ion beam in the Y direction; and one set of connecting portions that connect end portions of the body portions in the Z direction with each other, while avoiding the beam path, the second inner coil being disposed overlappingly with the first inner coil in the Y direction, and cooperating with the first inner coil to generate the main magnetic field which bends the ion beam in the X direction;

one or more first outer coils which are saddle-shaped coils having: one set of body portions that are outside the first inner coil, and that are opposed to each other in the X direction across the beam path; and one set of connecting portions that connect end portions of the body portions in the Z direction with each other, while avoiding the beam path, the first outer coils generating a sub-magnetic field which assists or corrects the main magnetic field;

one or more second outer coils which are saddle-shaped coils having: one set of body portions that are outside the second inner coil, and that are opposed to each other in the X direction across the beam path; and one set of connecting portions that connect end portions of the body portions in the Z direction with each other, while avoiding the beam path, the second outer coils being disposed overlappingly with the first outer coils in the Y direction, and generating a sub-magnetic field which assists or corrects the main magnetic field; and a yoke which collectively surrounds outer sides of the body portions of the first and second inner coils, and the first and second outer coils, each of the first inner coil and the first outer coil of the analyzing electromagnet has a configuration in which a notched portion is disposed in a fan-shaped cylindrical stacked coil while leaving the body portions and the connecting portions, the stacked coil being configured by: stacking laminations of an insulation sheet and conductor sheet in which a principal face extends along the Y direction, on an outer peripheral face of a laminated insulator, while winding the laminations in multiple turns; forming a laminated insulator on an outer peripheral face of the stack; stacking laminations of an insulation sheet and conductor sheet in which a principal face extends along the Y direction, on an outer peripheral face of the stack, while winding the laminations in multiple turns; and forming a laminated insulator on an outer peripheral face of the stack, and each of the second inner coil and the second outer coil of the analyzing electromagnet has a configuration in which a notched portion is disposed in a fan-shaped cylindrical stacked coil while leaving the body portions and the connecting portions, the stacked coil being configured by: stacking laminations of an insulation sheet and conductor sheet in which a principal face extends along the Y direction, on an outer peripheral face of a laminated insulator, while winding the laminations in multiple turns; forming a laminated insulator on an outer peripheral face of the stack; stacking laminations of an insulation sheet and conductor sheet in which a principal face extends along the Y direction, on an outer peripheral face of the stack, while winding the laminations in multiple turns; and forming a laminated insulator on an outer peripheral face of the stack.

According to a fifth aspect of the present invention, the analyzing electromagnet may be configured so that the analyzing electromagnet further comprises one set of magnet poles which are inwardly projected from the yoke so as to be opposed to each other in the Y direction across the beam path.

According to a sixth aspect of the present invention, the ion implanter may be configured so that the ion implanter further comprises a focus correction lens which is disposed in at least one of between the ion source and the analyzing electromagnet, and between the analyzing electromagnet and the analysis slit, and which performs a correction of making a position of the focus of the ion beam coincident with a position of the analysis slit, by means of an electrostatic field.

According to a seventh aspect of the present invention, the focus correction lens may be configured so that the focus correction lens has inlet, intermediate, and outlet electrodes which are arranged in the ion beam traveling direction while forming gaps therebetween, each of the inlet, intermediate, and outlet electrodes of the focus correction lens has a pair of electrodes that are opposed to each other in the X direction across a gap through which the ion beam passes, and that are electrically conductive to each other, the inlet and outlet electrodes of the focus correction lens are maintained to a same potential, and the intermediate electrode is maintained to a potential which is different from the potential of the inlet and outlet electrodes, and which causes the focus of the ion beam to coincide with the position of the analysis slit.

According to an eighth aspect of the present invention, the accelerating/decelerating device may be configured so that the accelerating/decelerating device has first to third electrodes which are arranged in a sequence of the first electrode, the second electrode, and the third electrode in the ion beam traveling direction with starting from an upstream side, and accelerates or decelerates the ion beam in two stages between the first and second electrodes, and the second and third electrodes, the second electrode is configured by two electrode members which are opposed to each other in the X direction across the path of the ion beam, and to which different potentials are applied to deflect the ion beam in the X direction, and the third electrode is disposed along an orbit of an ion beam having a specific energy after the deflection.

According to a ninth aspect of the present invention, the ion implanter may be configured so that the ion implanter further comprises: an orbit control lens which is disposed between the analyzing electromagnet and the accelerating/decelerating device, which bends the ion beam in the Y direction by means of an electrostatic field, and which has inlet, intermediate, and outlet electrodes that are arranged in the ion beam traveling direction while forming gaps therebetween, wherein each of the inlet, intermediate, and outlet electrodes of the orbit control lens has a pair of electrodes that are opposed to each other in the X direction across a gap through which the ion beam passes, and that are electrically conductive to each other, the intermediate electrode of the orbit control lens has a convex surface which is curved in the Y direction, in each of upstream and downstream side faces in the ion beam traveling direction, each of the inlet and outlet electrodes of the orbit control lens has a concave surface in a face opposed to the convex surface of the intermediate electrode, the concave surface extending along the convex surface, and the inlet and outlet electrodes of the orbit control lens are maintained to a same potential, and the intermediate electrode is maintained to a potential which is different from the potential of the inlet and outlet electrodes, and which makes an orbit state in the Y direction of the ion beam derived from the orbit control lens to a desired state.

According to a tenth aspect of the present invention, the ion implanter may be configured so that the ion implanter further comprises: an orbit control lens which is disposed between the analyzing electromagnet and the accelerating/decelerating device, which bends the ion beam in the Y direction by means of an electrostatic field, and which has inlet, intermediate, and outlet electrodes that are arranged in the ion beam traveling direction while forming gaps therebetween, wherein each of the inlet, intermediate, and outlet electrodes of the orbit control lens has a pair of electrodes that are opposed to each other in the X direction across a gap through which the ion beam passes, and that are electrically conductive to each other, the intermediate electrode of the orbit control lens has a concave surface which is curved in the Y direction, in each of upstream and downstream side faces in the ion beam traveling direction, each of the inlet and outlet electrodes of the orbit control lens has a convex surface in a face opposed to the concave surface of the intermediate electrode, the convex surface extending along the concave surface, the inlet and outlet electrodes of the orbit control lens are maintained to a same potential, and the intermediate electrode is maintained to a potential which is different from the potential of the inlet and outlet electrodes, and which makes an orbit state in the Y direction of the ion beam derived from the orbit control lens to a desired state.

According to an eleventh aspect of the present invention, the ion implanter may be configured so that the ion implanter further comprises: a homogenizing lens which is disposed between the analyzing electromagnet and the accelerating/decelerating device, which, in the Y direction, has plural pairs of electrodes that are opposed to each other in the X direction across a gap through which the ion beam passes, and that are electrically conductive to each other, which bends orbits in plural places in the Y direction of the ion beam by means of an electrostatic field, and which homogenizes a beam current density distribution in the Y direction of the ion beam at the implanting position.

According to a twelfth aspect of the present invention, the ion implanter may be configured so that the ion implanter further comprises: a deflecting electromagnet that is disposed between the analyzing electromagnet and the implanting position, that generates a magnetic field extending along the X direction, in the beam path through which the ion beam passes, wherein the deflecting electromagnet comprises: a first magnetic pole pair having a pair of magnetic poles that are opposed to each other in the X direction across the beam path, and that cover about a half or more of one side of the ion beam in the Y direction; a second magnetic pole pair having a pair of magnetic poles that are opposed to each other in the X direction across the beam path, and that cover about a half or more of another side of the ion beam in the Y direction; and coils that generate opposite magnetic fields in a gap in the first magnetic pole pair, and in a gap in the second magnetic pole pair, wherein lengths in the ion beam traveling direction of the magnetic poles constituting the first and second magnetic pole pairs being larger as being further outward separated in the Y direction from a center of the beam path.

According to a thirteenth aspect of the present invention, the ion implanter may be configured so that the ion implanter further comprises: a deflecting electromagnet that is disposed between the analyzing electromagnet and the implanting position, that generates a magnetic field extending along the X direction, in the beam path through which the ion beam passes, wherein the deflecting electromagnet comprises: a first magnetic pole pair having a pair of magnetic poles that are opposed to each other in the X direction across the beam path, and that cover about a half or more of one side of the ion beam in the Y direction; a second magnetic pole pair having a pair of magnetic poles that are opposed to each other in the X direction across the beam path, and that cover about a half or more of another side of the ion beam in the Y direction; and coils that generate opposite magnetic fields in a gap in the first magnetic pole pair, and in a gap in the second magnetic pole pair, and wherein gap lengths in the first and second magnetic pole pairs are smaller as being further outward separated in the Y direction from a center of the beam path.

According to the present inventions set forth in the first to fourth aspects, each coil of the analyzing electromagnet is configured so that the notched portion is disposed in the fan-shaped cylindrical stacked coil as described above while leaving the body portions and the connecting portions, and hence the connecting portions are in a state where the portions are extended in the Y direction from end portions of the body portions in substantially parallel. Even in the case where the dimension in the Y direction of the body portions is increased, therefore, the case is coped with by correspondingly increasing the dimension in the Y direction of the connecting portions. As a result, the projection distances of the connecting portions in the directions of beam incidence and emission are not increased. According to the structure, the distances by which the connecting portions of the coil are projected from the yoke in the directions of beam incidence and emission can be reduced.

The size of the analyzing electromagnet can be reduced, and therefore the area required for installing the analyzing electromagnet can be reduced. Also the weight of the analyzing electromagnet can be reduced. Moreover, the possibility that the magnetic field generated by the connecting portions of the coil disturbs the form of the ion beam is reduced.

In accordance with that the projection distances of the connecting portions of each coil can be reduced, also the lengths of the connecting portions can be shortened, and hence wasteful power consumption in the connecting portions can be reduced. Moreover, each coil has the structure in which the conductor sheets are stacked with interposing the insulation sheet therebetween. As compared with a multi-turn coil in which a coated conductor is wound many times, therefore, the space factor of the conductor is high, and the power loss is correspondingly low. Consequently, the power consumption can be reduced.

As a result, in accordance with the miniaturization of the analyzing electromagnet, the size of the ion implanter can be reduced, and therefore the area required for installing the ion implanter can be reduced. Also the weight of the ion implanter can be reduced. Moreover, in accordance with the reduction of the power consumption of the analyzing electromagnet, the power consumption of the ion implanter can be reduced.

Furthermore, the present inventions set forth in the first to fourth aspects can attain the following effects.

The ion implanter comprises the ion source that generates the ribbon-like ion beam in which the Y-direction dimension is larger than the dimension in the Y direction of the substrate. As compared with the case where dispersion or widening in the Y direction of the ion beam is used, therefore, ion implantation can be performed at a high processing speed (throughput), even on a large substrate. This effect is more remarkable in the case where the substrate to be processed, and therefore the ion beam have a large Y-direction dimension.

The accelerating/decelerating device can perform not only acceleration/deceleration of the ion beam, but also the X-direction deflection of the ion beam. Therefore, an ion beam of a desired energy can be selectively derived, and energy contamination can be suppressed. Furthermore, these functions can be realized in the single accelerating/decelerating device. As compared with the case where an energy analyzer is separately disposed, therefore, the transportation path of the ion beam can be shortened. Accordingly, the transport efficiency of the ion beam can be improved.

The present invention set forth in the second aspect can attain the following further effect. Namely, since the analyzing electromagnet comprises the first and second coils, it is possible to easily cope with an ion beam having a large Y-direction dimension.

The present invention set forth in the third aspect can attain the following further effect. Namely, since the analyzing electromagnet comprises the first and second outer coils in addition to the inner coil, it is possible to generate a magnetic field in which the homogenization of the magnetic flux density distribution in the Y direction is high, in the beam path of the ion beam. As a result, the disturbance of the form of the ion beam at emission can be suppressed to a low level. This effect is more remarkable in the case where the ion beam has a large Y-direction dimension.

The present invention set forth in the fourth aspect can attain the following further effects. Namely, since the analyzing electromagnet comprises the first and second outer coils in addition to the first and second inner coils, it is possible to easily cope with an ion beam having a large Y-direction dimension, and also to generate a magnetic field in which the homogenization of the magnetic flux density distribution in the Y direction is high, in the beam path of the ion beam. As a result, the disturbance of the form of the ion beam at emission can be suppressed to a low level. This effect is more remarkable in the case where the ion beam has a large Y-direction dimension.

The present invention set forth in the fifth aspect can attain the following further effect. Namely, since the analyzing electromagnet further comprises the magnetic poles, the magnetic field can be easily concentrated in the gap between the magnetic poles, and hence it is possible to easily generate a magnetic field of a high magnetic flux density in the beam path.

The present invention set forth in the sixth aspect can attain the following further effect. Namely, since the ion implanter comprises the focus correction lens which performs the correction of making the position of the focus of the ion beam from the analyzing electromagnet coincident with the position of the analysis slit, by means of the electrostatic field, it is possible to prevent the focus of the ion beam from being deviated from the position of the analysis slit by an influence of space charges. As a result, while compensating the influence of space charges, both the transport efficiency of the ion beam and the resolution can be enhanced.

The present invention set forth in the seventh aspect can attain the following further effect. Namely, since the focus correction lens functions as a unipotential lens (in other words, an einzel lens, the same shall apply hereinafter), the position of the focus of the ion beam can be corrected without changing the energy of the ion beam.

The present invention set forth in the eight aspect can attain the following further effects. Namely, in the accelerating/decelerating device, the ion beam can be deflected by the portion of the second electrode which is dividedly configured by two electrode members, thereby attaining the effect of energy separation. The existence of the third electrode enables an ion beam having a specific energy to be efficiently derived, and ions other than the ion beam, and neutral particles can be efficiently blocked by the third electrode. Therefore, energy contamination can be suppressed more effectively. Particularly, it is empirically known that, in the deceleration mode, neutral particles are easily generated by charge conversion in ion deceleration between the first and second electrodes. Even when many neutral particles are generated, however, they straightly travel and impinge on the third electrode to be blocked. Therefore, neutral particles can be effectively eliminated in the accelerating/decelerating device.

Furthermore, the ion beam can be accelerated in two stages, and, before acceleration in the latter one of the stages, can be deflected. Therefore, the deflection is facilitated. Moreover, electrons which are generated by collision of unwanted ions are bent by the second electrode to prevent the electrons from reaching the first electrode. Therefore, the energy of X rays generated by collision of the electrons can be lowered.

The present inventions set forth in the ninth and tenth aspects can attain the following further effects. Namely, the orbit control lens functions as a unipotential lens, and hence the orbit state in the Y direction of the ion beam can be set to a desired one without changing the energy of the ion beam.

Moreover, as described above, the intermediate electrode constituting the orbit control lens has the concave surfaces which are curved in the Y direction, and the inlet and outlet electrodes have the surfaces extending along the concave surfaces, respectively. Therefore, the homogenization in the Y direction of the electric field distribution in the gap between the electrodes is extremely improved. As a result, even when the dimension in the Y direction is large, the orbit state in the Y direction of the ion beam can be set to a desired one with high homogenization.

The present invention set forth in the eleventh aspect can attain the following further effect. Namely, since the homogenizing lens is provided, the beam current density distribution in the Y direction of the ion beam at the implanting position can be homogenized, and the homogenization of the ion implantation on the substrate can be enhanced. This effect is more remarkable in the case where the substrate to be processed, and therefore the ion beam have a large Y-direction dimension.

The present inventions set forth in the twelfth and thirteenth aspects can attain the following further effect. Namely, in the gaps between the first magnetic pole pair and the second magnetic pole pair, the ion beam is bent more strongly as the ion beam is further outward separated in the Y direction from the center of the beam path. According to the configuration, the orbit state of the ion beam can be controlled.

Other features and advantages may be apparent from the following detailed description, the accompanying drawings and the claims.

BRIEF DESCRIPTION OF THE DRAWINGS

FIG. 3 is a view showing an example of dimensional relationships in the Y direction between an ion beam and a substrate.

FIG. 8 is a perspective view showing first and second inner coils shown in FIG. 7.

FIG. 21 is a view showing an example of an ion beam having a distorted form immediately after it is emitted from the analyzing electromagnet.

DETAILED DESCRIPTION (1) About Whole Ion Implanter

Figure 1:
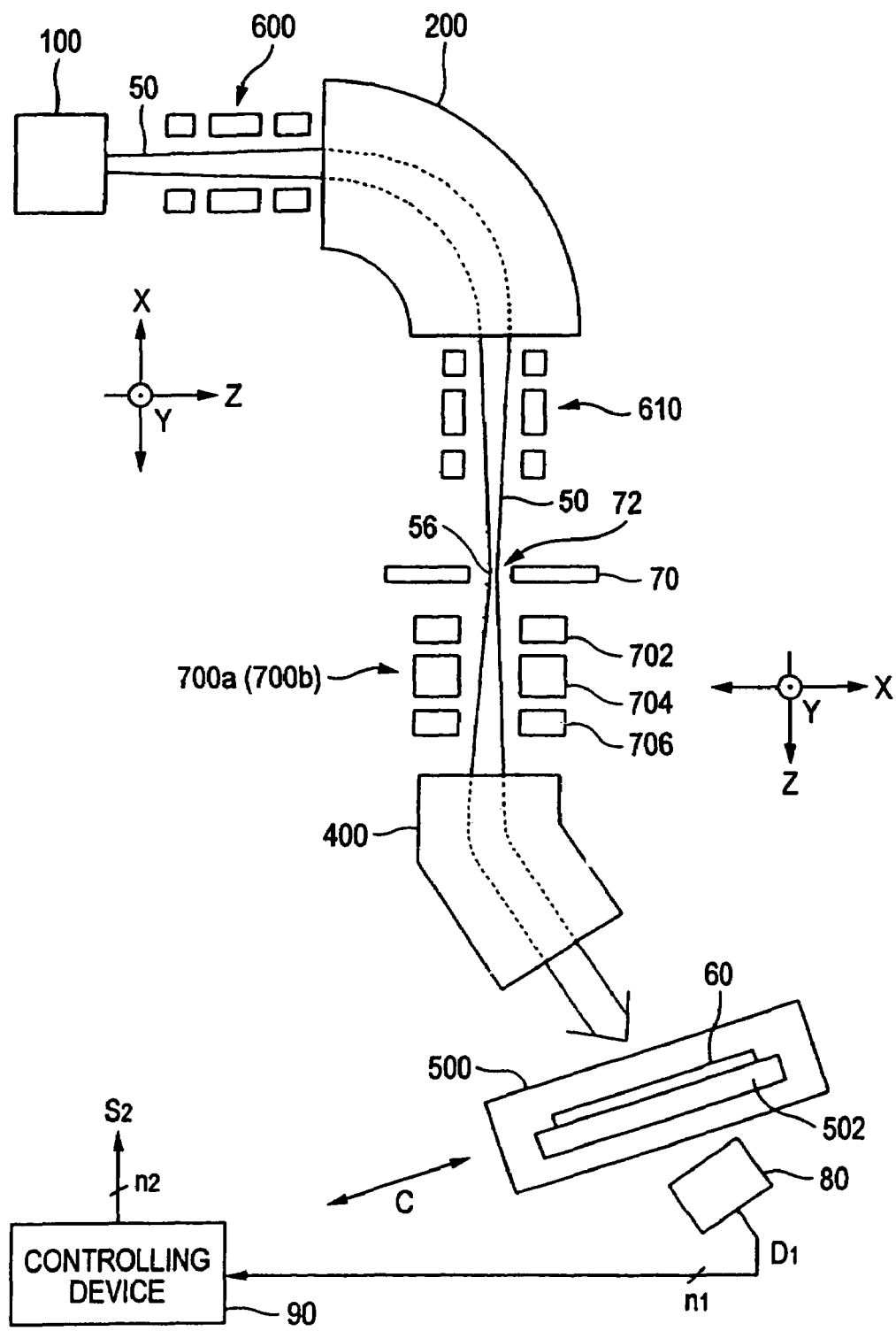
FIG. 1 is a schematic plan view showing an embodiment of the ion implanter of the invention.

FIG. 1 is a schematic plan view showing an embodiment of the ion implanter of the invention. In the specification and the drawings, the traveling direction of an ion beam 50 is always set as the Z direction, and two directions which are substantially orthogonal to each other in a plane that is substantially orthogonal to the Z direction are set as X and Y directions, respectively. For example, the X and Z directions are horizontal directions, and the Y direction is a vertical direction. The Y direction is a constant direction, but the X direction is not an absolute direction but changes in accordance with the position of the ion beam 50 on the path (for example, see FIGS. 1 and 4, and the like). In the specification, the case where ions constituting the ion beam 50 are positive ions will be described as an example.

The ion implanter is an ion implanter for irradiating a substrate 60 with the ribbon-like ion beam 50 to perform ion implantation, and comprises: an ion source 100 that generates the ribbon-like ion beam 50; an analyzing electromagnet 200 which bends the ion beam 50 from the ion source 100 in the X direction to analyze a momentum, and which forms a focus (the focus in the X direction, the same shall apply hereinafter) 56 of the ion beam 50 of a desired momentum, in a downstream side; and a substrate driving device 500 which, at an implanting position where the ion beam 50 passed through the analyzing electromagnet 200 is caused to be incident on the substrate 60, moves (see the arrow C) the substrate 60 in a direction intersecting with the principal face 52 (see FIGS. 2 and 3) of the ion beam 50.

The path of the ion beam 50 from the ion source 100 to the substrate 60 is in a vacuum vessel which is not shown, and maintained to a vacuum atmosphere.

In the specification, "principal face" does not mean an end face of a ribbon-like or sheet-like member (for example, the ion beam 50, and insulation sheets 266, 267 and conductor sheets 268, 269 which will be described later), but means a larger face of the member. The term "downstream side" or "upstream side" means the downstream side or the upstream side in the traveling direction Z of the ion beam 50. The ion beam 50 generated from the ion source 100, and the ion beam 50 derived from the analyzing electromagnet 200 are different from each other in content. Namely, the former is the ion beam before momentum analysis, and the latter is that after momentum analysis. The difference between the ion beams is obvious. In the specification, therefore, the ion beams are not distinguished from each other, and the both are indicated as the ion beam 50.

Figure 2:
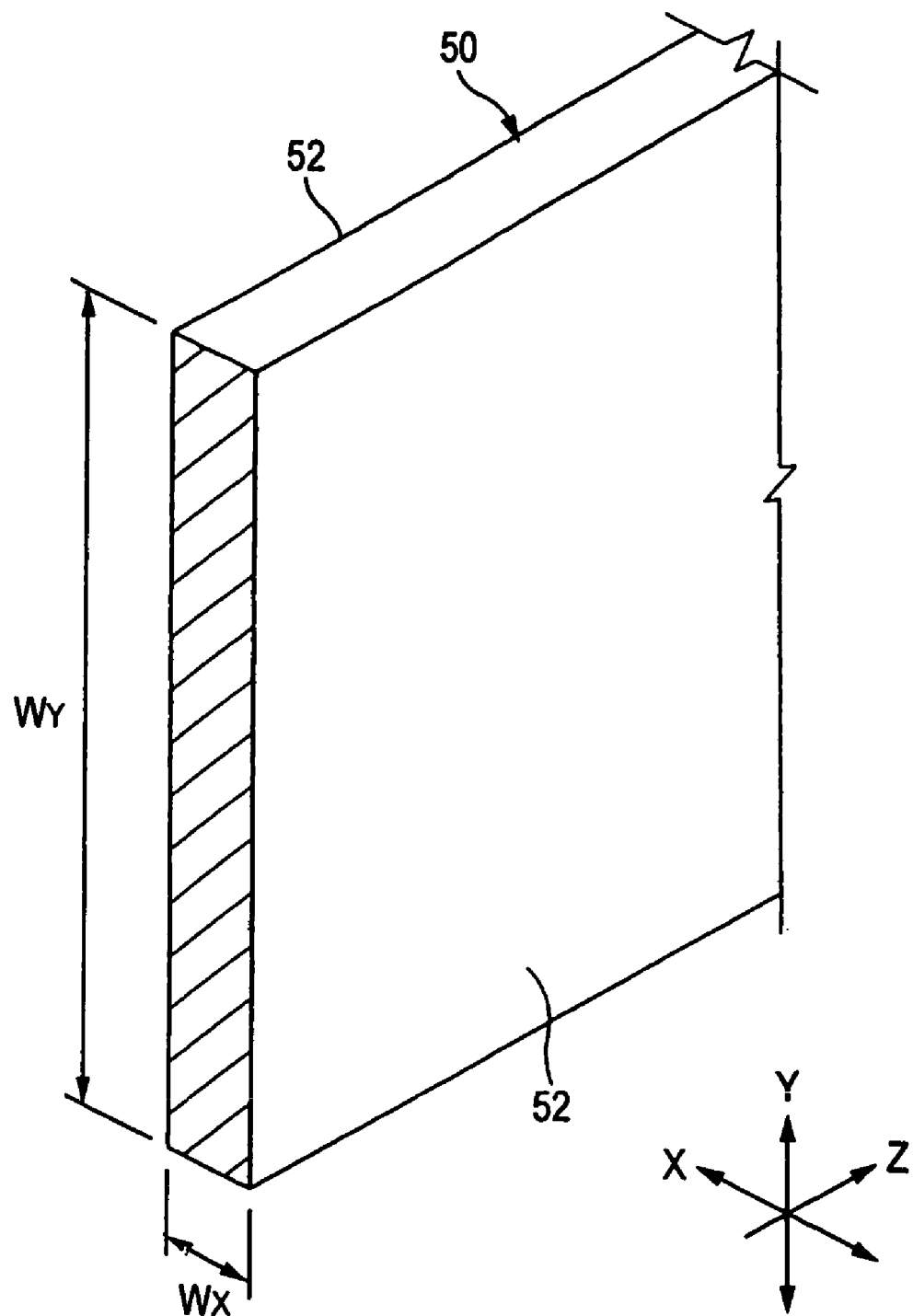
FIG. 2 is a schematic perspective view partially showing an example of a ribbon-like ion beam.

The ion beam 50 which is generated from the ion source 100 and transported to the substrate 60 has a ribbon-like shape in which, as shown in FIG. 2, for example, the dimension $W_Y$ in the Y direction is larger than the dimension $W_X$ in the X direction, or namely $W_Y > W_X$. Although the ion beam 50 has a ribbon-like shape, this does not mean that the dimension $W_X$ in the X direction is as thin as paper or cloth. For example, the dimension $W_X$ in the X direction of the ion beam 50 is about 30 to 80 mm, and, although depending on the dimension of the substrate 60, the dimension $W_Y$ in the Y direction is about 300 to 500 mm. The plane in which the ion beam 50 is larger, i.e., the plane along the YZ plane is the principal face 52.

The ion source 100 generates the ribbon-like ion beam 50 in which, as in an example shown in FIG. 3, the dimension $W_Y$ in the Y direction is larger than the dimension $T_Y$ in the Y direction of the substrate 60. When the dimension $T_Y$ is 300 to 400 mm, for example, the dimension $W_Y$ is about 400 to 500 mm.

For example, the substrate 60 is a semiconductor substrate, a glass substrate, or another substrate. The plan-view shape of the substrate is circular or rectangular.

In the vicinity of a focus 56 of the ion beam 50 emitted from the analyzing electromagnet 200, a slit 70 which cooperates with the analyzing electromagnet 200 to analyze the momentum of the ion beam 50 is disposed. As shown also in FIG. 27, the analysis slit 70 has a slit 72 which extends substantially parallel to the Y direction. The reason why the analysis slit 70 is disposed in the vicinity of the focus 56 of the ion beam 50 is that both the transport efficiency of the ion beam 50 and the resolution of momentum analysis are enhanced.

The ion implanter further comprises: focus correction lenses 600, 610 which correct the position of the focus 56 of the ion beam 50; orbit control lenses 700a, 700b which control the orbit state in the Y direction of the ion beam 50; and an accelerating/decelerating device 400 which performs deflection and acceleration/deceleration of the ion beam 50. These components will be described later in detail.

(2) About Analyzing Electromagnet 200

Hereinafter, the whole configuration of the analyzing electromagnet 200, details of the structures of coils, methods of producing the coils, features, control method, and other examples of the analyzing electromagnet 200, and the like will be sequentially described.

(2-1) Whole Configuration of Analyzing Electromagnet 200

Figure 4:
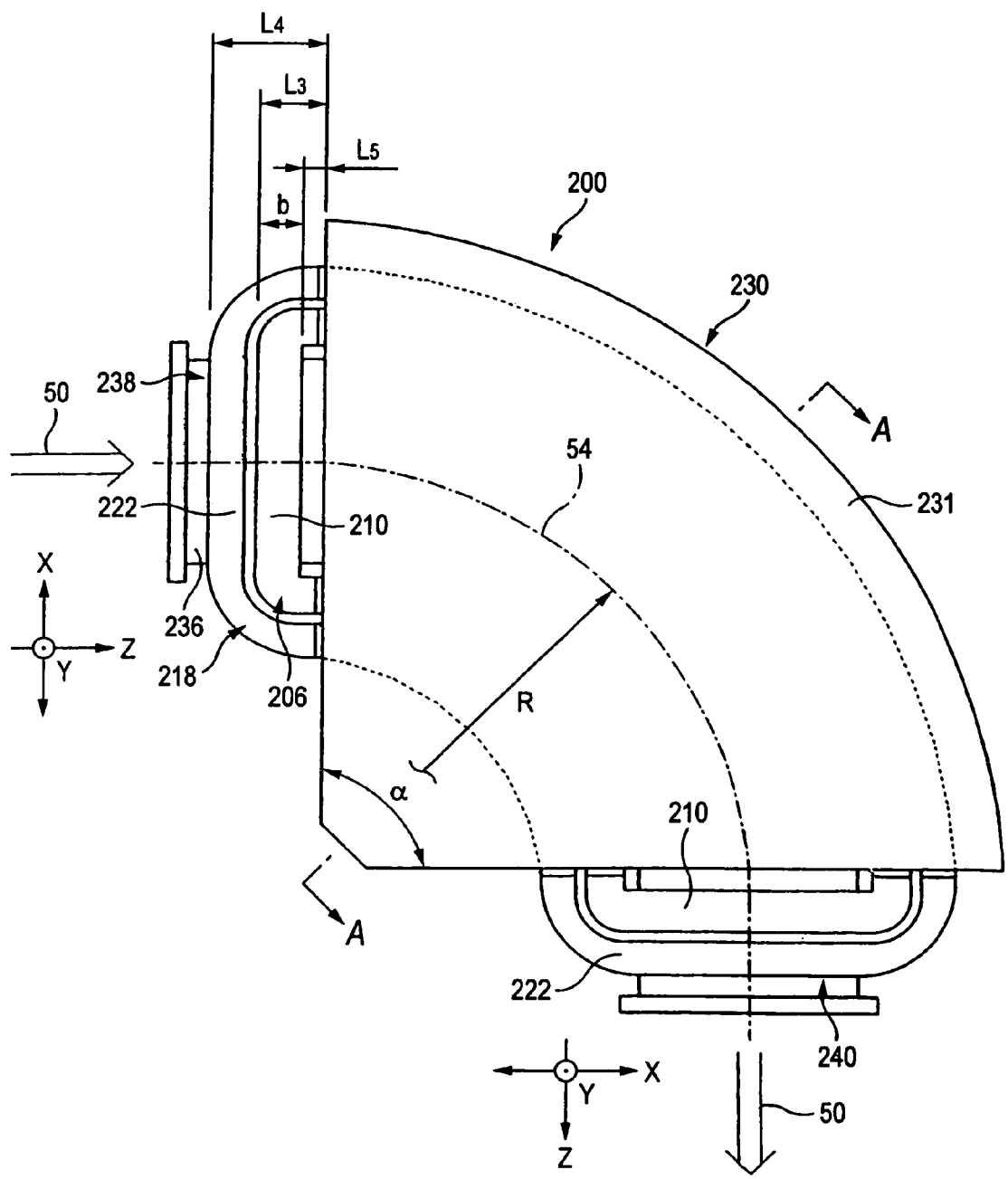
FIG. 4 is a plan view showing an example of an analyzing electromagnet shown in FIG. 1.
Figure 5:
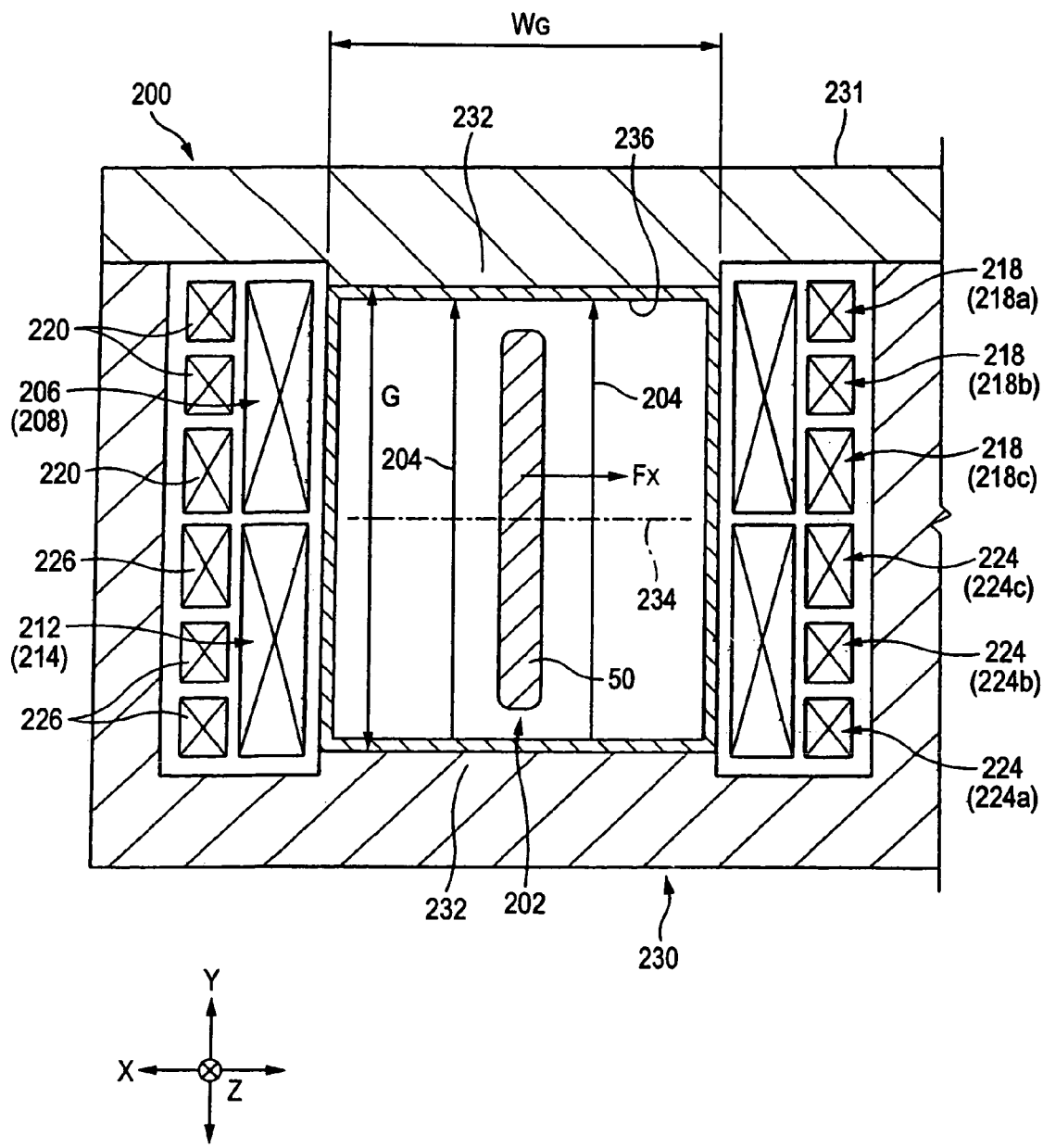
FIG. 5 is a section view taken along the line A-A of FIG. 4.
Figure 6:
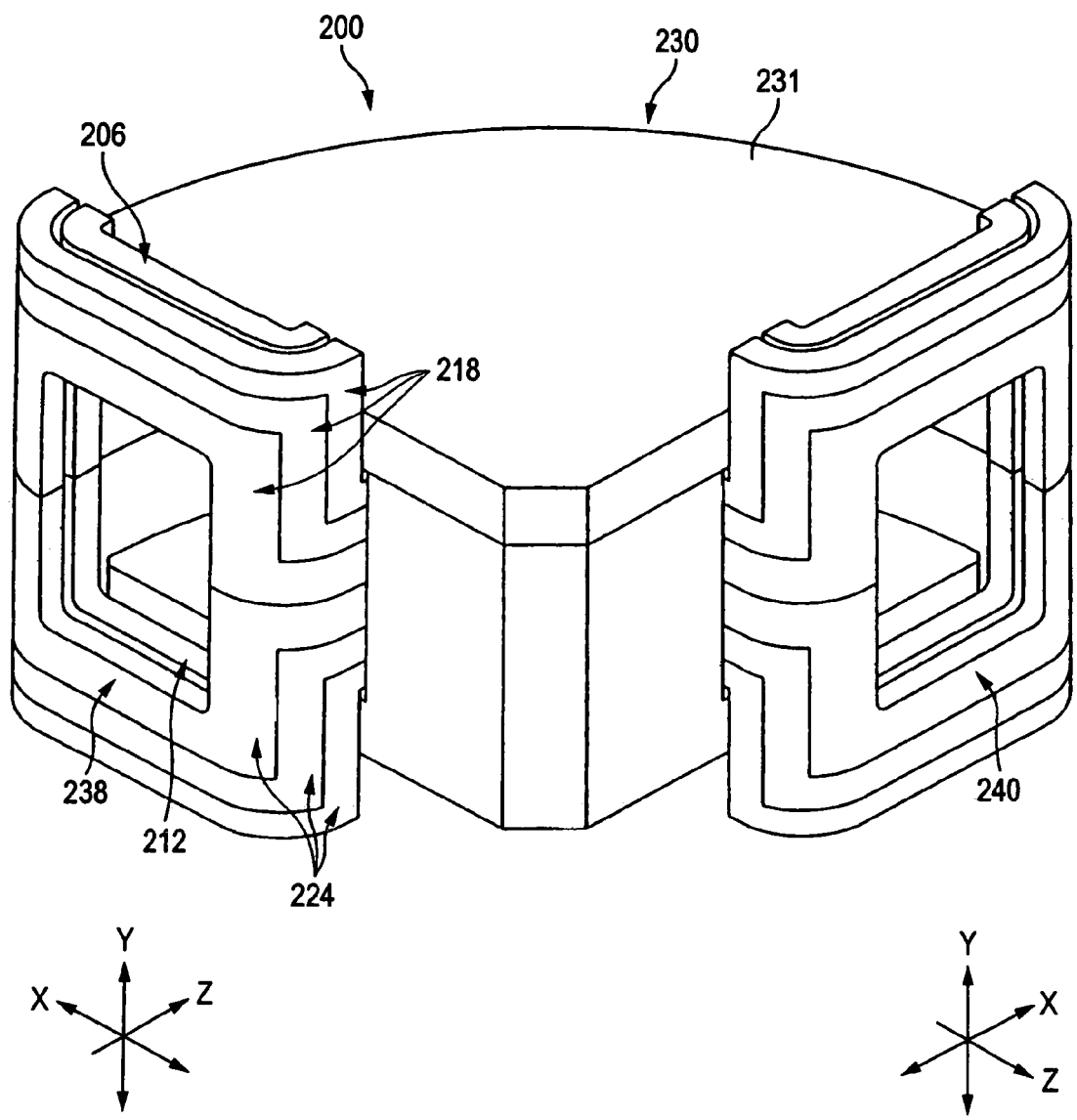
FIG. 6 is a perspective view showing the analyzing electromagnet shown in FIG. 4, with omitting a vacuum vessel.

An example of the analyzing electromagnet 200 is shown in FIGS. 4 to 6, etc. FIG. 6 shows the analyzing electromagnet with omitting the vacuum vessel 236. The analyzing electromagnet 200 is configured so that the ribbon-like ion beam 50 impinges on the electromagnet, a magnetic field along the Y direction is generated in a beam path 202 through which the ion beam 50 passes, and the ion beam 50 is bent in the X direction to perform momentum analysis. The magnetic field is diagrammatically shown by magnetic force lines 204 in FIG. 5 and the like. When the ion beam 50 impinges on the analyzing electromagnet 200, the ion beam 50 in traveling is subjected by the magnetic field to the Lorentz force $F_X$ which is rightward directed as viewed in the traveling direction Z, thereby rightward deflected. As a result, the momentum analysis is performed. The center orbit 54 of the ion beam 50 is indicated by the one-dot chain line in FIG. 4, and its radius of curvature is shown by R. The angle (deflection angle) at which the ion beam 50 is deflected by the analyzing electromagnet 200 is indicated by α.

For example, the radius of curvature R is 300 to 1,500 mm, and the deflection angle α is 60 to 90 deg. FIG. 4 exemplarily shows the case where the deflection angle α is 90 deg.

Figure 7:
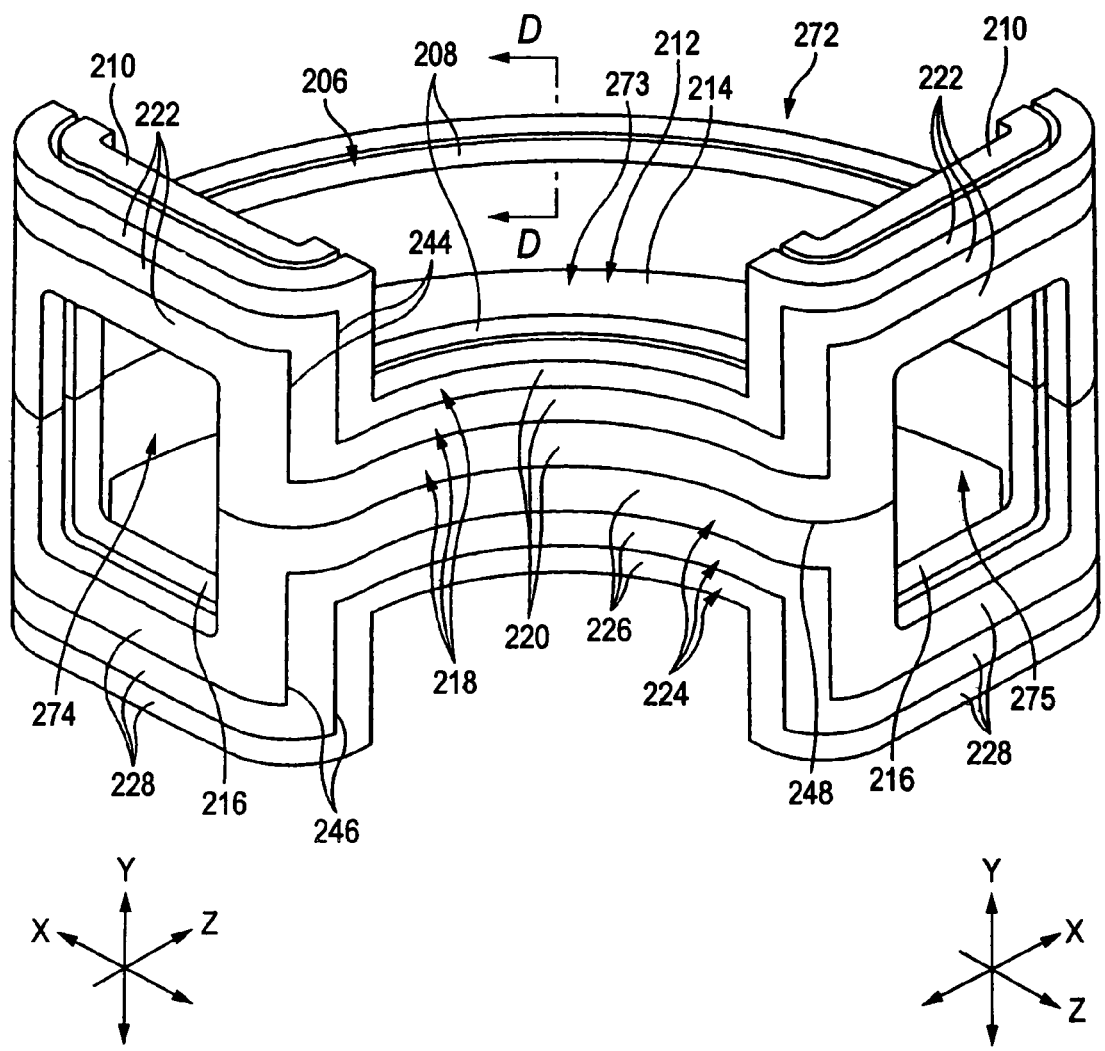
FIG. 7 is a perspective view showing the analyzing electromagnet shown in FIG. 4.

Also referring to FIG. 7, the analyzing electromagnet 200 comprises a first inner coil 206, a second inner coil 212, one or more (in the embodiment, three) first outer coils 218, one or more (in the embodiment, three) second outer coils 224, a yoke 230, and one set of magnetic poles 232. The beam path 202 is surrounded by the vacuum vessel 236 made a nonmagnetic material, and maintained to a vacuum atmosphere. The vacuum vessel 236 is also called an analyzer tube.

The first and second inner coils 206, 212 are extracted and shown in FIG. 8. The coils are understood more easily with reference to the figure.

In this example, the coils 206, 212, 218, 224 have a shape which is substantially plane-symmetrical in the Y direction about a symmetry plane 234 (see FIG. 5 and the like) that passes the center in the Y direction of the beam path 202, and that is parallel to the XZ plane. A coil 320 (see FIGS. 22 and 24 and the like), first coil 326, and second coil 328 (see FIG. 25) which will be described later are configured in a similar manner. When such plane symmetry configuration is employed, a magnetic field with high symmetry in the Y direction can be easily generated in the beam path 202. This contributes to the suppression of the disturbance of the form of the ion beam 50 at emission from the analyzing electromagnet 200.

Figure 9:
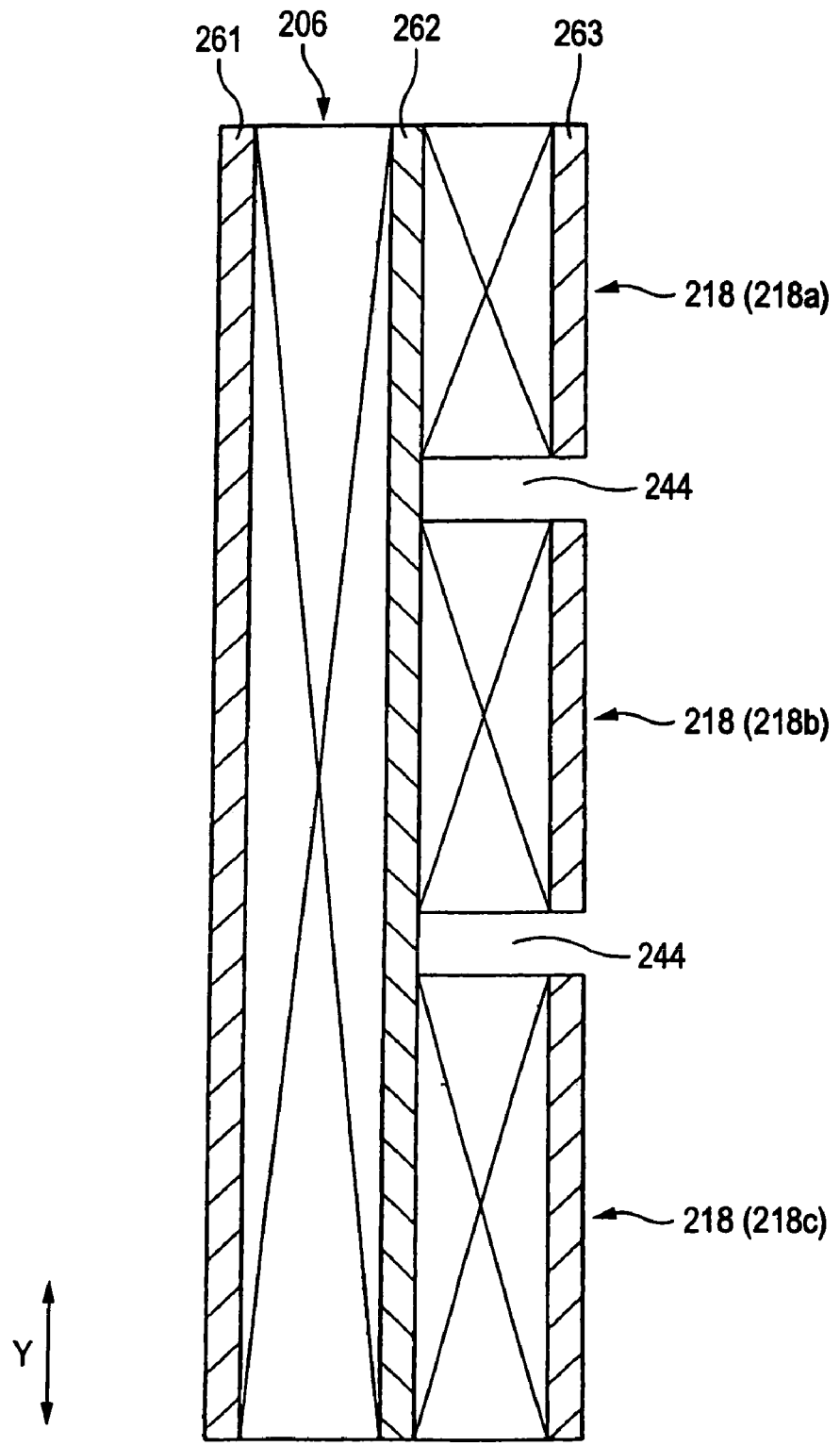
FIG. 9 is a schematic view enlargedly showing sections of the first inner and outer coils taken along the line D-D of FIG. 7.
Figure 13:
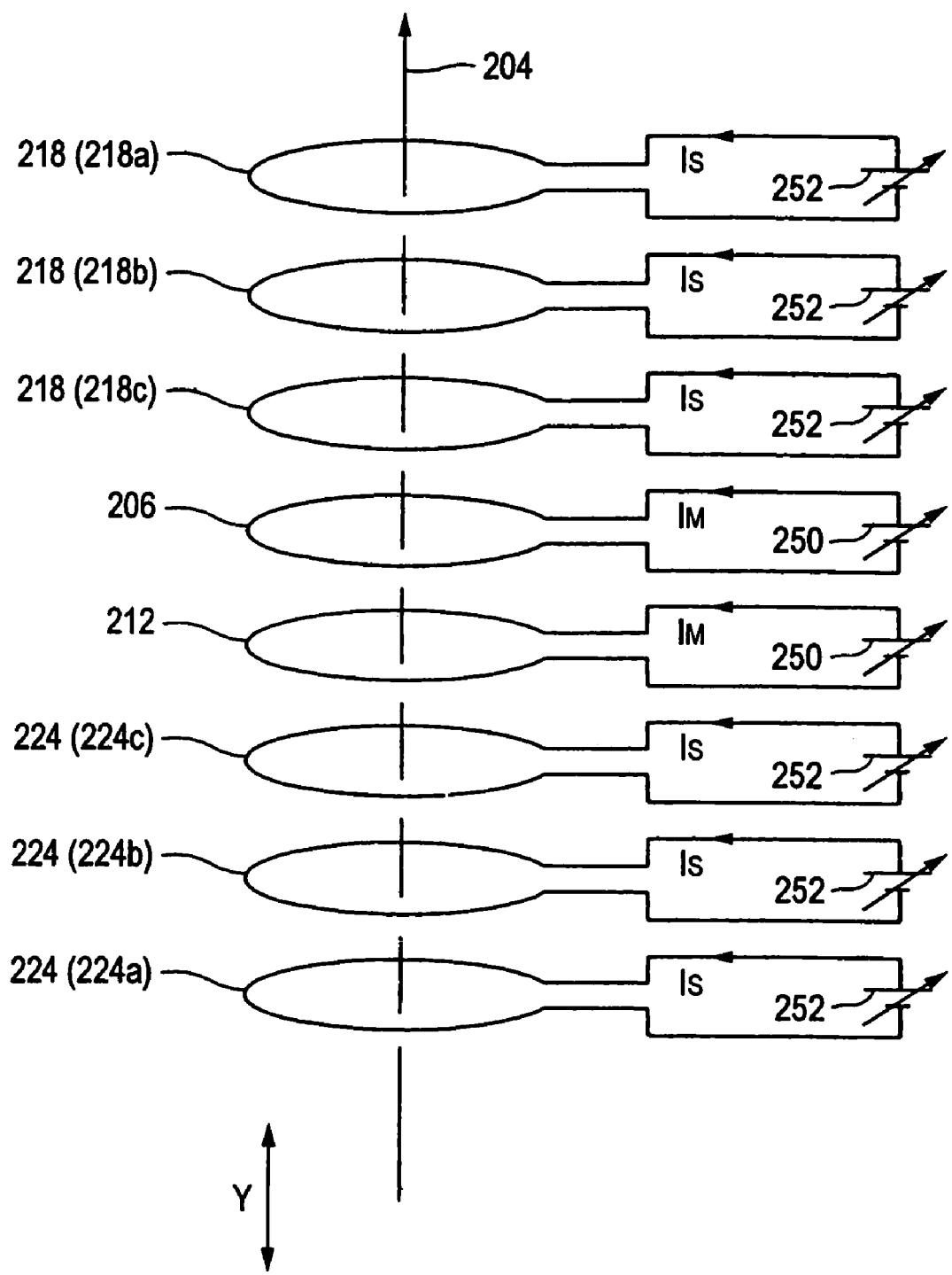
FIG. 13 is a view showing an example of a power source configuration for coils of the analyzing electromagnet shown in FIG. 4.

Hereinafter, when the plural first outer coils 218 and plural second outer coils 224 are to be distinguished from one another, as shown in FIGS. 5, 9, 13, and the like, the first outer coils 218 are denoted as first outer coils 218a, 218b, 218c with starting from the upper side in the Y direction, and the second outer coils 224 are denoted as second outer coils 224a, 224b, 224c with starting from the lower side in the Y direction because the second outer coils are plane-symmetrical with respect to the first outer coils 218 as described above.

In the case where a numeral denoting a component, for example, the coil 206 is underlined in the drawings, it indicates that such a numeral indicates the whole of the component such as the coil.

Figure 12:
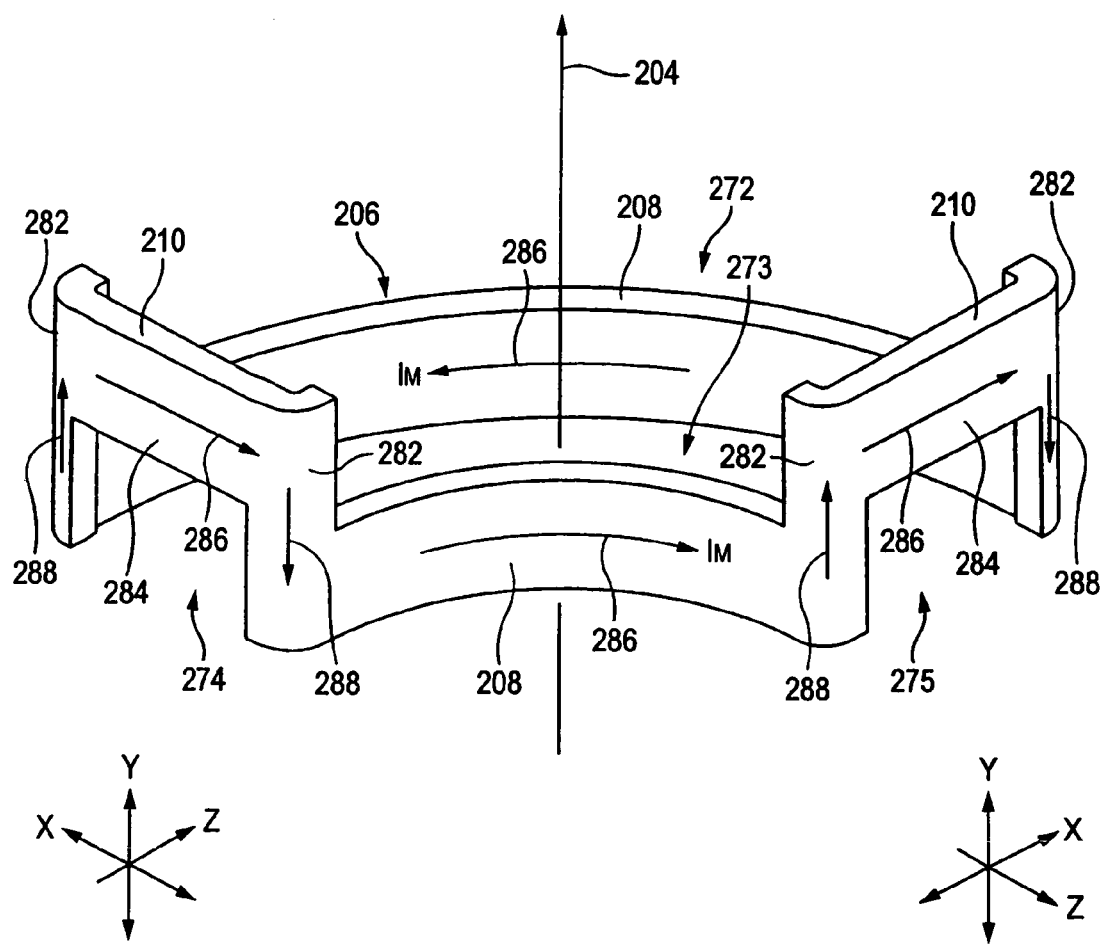
FIG. 12 is a perspective view showing a first inner coil shown in FIG. 8.

Referring mainly to FIGS. 8 and 12, the first inner coil 206 is a saddle-shaped coil having: one set of body portions 208 that are opposed to each other in the X direction across the beam path 202, and that cover about a half or more (in other words, substantially a half or more) of one side (in the embodiment, the upper side) of the ion beam 50 in the Y direction; and one set of connecting portions 210 that connect end portions of the body portions 208 in the Z direction (in other words, the end portion on the side of an inlet 238 of the analyzing electromagnet 200, and that on the side of an outlet 240, this is also applicable to the other coils) with each other, while avoiding the beam path 202. The first inner coil cooperates with the second inner coil 212 to generate a main magnetic field which bends the ion beam 50 in the X direction. The main magnetic field is a magnetic field by which the ion beam 50 is mainly bent at a substantially predetermined radius of curvature R.

The first inner coil 206 is called a saddle-shaped coil because, when viewed as a whole, the coil has a saddle-like shape. The same shall apply to the other coils 212, 218, 224, and the coils 326, 328 which will be described later.

In order to prevent the ion beam 50 from impinging on the connecting portions 210, and to reduce influences exerted on the ion beam 50 by magnetic fields generated by the portions, the connecting portions are separated from the beam path 202 toward the upper side in the Y direction. For the same purpose as the above, connecting portions of the other coils are separated from the beam path 202 toward the upper or lower side in the Y direction.

Referring mainly to FIG. 8, the second inner coil 212 is a saddle-shaped coil having: one set of body portions 214 that are opposed to each other in the X direction across the beam path 202, and that cover about a half or more (in other words, substantially a half or more) of the other side (in the embodiment, the lower side) of the ion beam 50 in the Y direction; and one set of connecting portions 216 that connect end portions of the body portions 214 in the Z direction with each other, while avoiding the beam path 202. The second inner coil is disposed overlappingly with the first inner coil 206 in the Y direction, and cooperates with the first inner coil 206 to generate a main magnetic field which bends the ion beam 50 in the X direction. Namely, the second inner coil 212 generates magnetic force lines 204 which are identical in direction with those of the first inner coil 206.

The second inner coil 212 has similar dimensions and structure as the first inner coil 206. Usually, also the number of turns of the conductor (specifically, the conductor sheet 268, see FIG. 10 and the like) is equal to that of the first inner coil 206. As described above, however, the second inner coil has a plane-symmetrical shape about the symmetry plane 234 with respect to the first inner coil 206. The connecting portions 216 are disposed on the opposite side (i.e., the lower side) in the Y direction with respect to the connecting portions 210 across the beam path 202.

Although indicated by a line in FIG. 8, a slight (for example, about 20 mm) gap 242 is formed between the first inner coil 206 and the second inner coil 212. In the gap, cooling plates 312 (see FIG. 19) which are two in total, and which will be described later can be disposed, or one cooling plate is on the side of the first inner coil 206, and one cooling plate is on the side of the second inner coil 212.

Referring mainly to FIG. 7, each of the first outer coils 218 is a saddle-shaped coil having: one set of body portions 220 that are outside the first inner coil 206, and that are opposed to each other in the X direction across the beam path 202; and one set of connecting portions 222 that connect end portions of the body portions 220 in the Z direction with each other, while avoiding the beam path 202. The first outer coils generate a sub-magnetic field which assists or corrects the main magnetic field. The first outer coils 218 are disposed overlappingly with each other in the Y direction.

Specifically, lateral portions (portions corresponding to a lateral portion 284 shown in FIG. 12) of the body portions 220 and connecting portions 222 of each first outer coil 218 are disposed overlappingly with each other in the Y direction. Although, strictly speaking, it is difficult to say that vertical portions (portions corresponding to a vertical portion 282 shown in FIG. 12) of the connecting portions 222 are overlappingly disposed as described above, it can be said that, when viewed as a whole, the first outer coils 218 are disposed overlappingly with each other in the Y direction. The second outer coils 224 are configured in a similar manner.

The first outer coils 218 have a substantially similar structure as the first inner coil 206. However, the dimension in the Y direction is smaller than that of the first inner coil 206, and also the number of turns of the conductor is usually smaller than that of the first inner coil 206. The first outer coils 218 have the same number of turns of the conductor (specifically, the conductor sheet 269, see FIG. 10 and the like). In the embodiment, the first outer coils 218 have different Y-direction dimensions. Alternatively, they have the same Y-direction dimension. The second outer coils 224 are configured in a similar manner.

For example, the Y-direction dimensions of the body portions and connecting portions in the first and second inner coils 206, 212, are about 230 mm, those in the first and second outer coils 218a, 224a are about 50 mm, those in the first and second outer coils 218b, 224b are about 60 mm, and those in the first and second outer coils 218c, 224c are about 100 mm.

Although indicated by lines in FIG. 7, slight gaps 244, 246, 248 are formed respectively between the first outer coils 218, between the second outer coils 224, and between the lowest first outer coil 218 (218c) and the uppermost second outer coil 224 (224c) (see also FIG. 9). In the gaps, the cooling plates 312 (see FIG. 19) which will be described later can be disposed. For example, the dimensions of the gaps 244, 246 are about 10 mm, and the dimension of the gap 248 corresponds to that of the gap 242 or is about 20 mm. The gaps 244, 246 are disposed in the whole periphery along the respective outer coils 218, 224.

The first outer coils 218 may generate a magnetic field of the same direction as or opposite to that generated by the first and second inner coils 206, 212. Alternatively, the direction of the magnetic field may be inverted by a control. The second outer coils 224 are configured in a similar manner. A part of the magnetic force lines (magnetic field) generated by the body portions 220 of the first outer coils 218 spreads toward the beam path 202 (in other words, leaks), so that the main magnetic field is affected. Therefore, the first outer coils 218 can generate the sub-magnetic field which assists or corrects the main magnetic field. In this case, each of the first outer coils 218 exerts an effect of assisting or correcting the magnetic field in a region in the vicinity of the inner side of the coil. The second outer coils 224 are configured in a similar manner.

Referring mainly to FIG. 7, each of the second outer coils 224 is a saddle-shaped coil having: one set of body portions 226 that are outside the second inner coil 212, and that are opposed to each other in the X direction across the beam path 202; and one set of connecting portions 228 that connect end portions of the body portions 226 in the Z direction with each other, while avoiding the beam path 202. The second outer coils generate a sub-magnetic field which assists or corrects the main magnetic field. The second outer coils 224 are disposed overlappingly with each other in the Y direction, and with the first outer coils 218 in the Y direction.

The second outer coils 214 have a substantially similar structure as the second inner coil 212. However, the dimension in the Y direction is smaller than that of the second inner coil 212, and also the number of turns of the conductor is usually smaller than that of the second inner coil 212. The numbers of turns of the conductor (specifically, the conductor sheet) and Y-direction dimensions of the second outer coils 224 are as described above.

An example of the number of turns of each conductor will be described. The numbers of turns of the first and second inner coils 206, 212 are about 110 turns, and those of the first and second outer coils 218, 224 are about 85 turns.

A substantially whole of each of the body portions 208, 214, 220, 226 of the coils is positioned in the yoke 230, and hence it can be said that the portion is a portion which generates a desired magnetic field (the main magnetic field or the sub-magnetic field) in the beam path 202. A body portion 322 of the coil 320 which will be described later is configured in a similar manner.

It can be said that the connecting portions 210, 216, 222, 228 of the coils are portions which electrically connect the end portions of the respective one set of body portions in the Z direction with each other, and which cooperate with the body portions to form a loop-like conduction path. Connecting portions 324, 325 of the coil 320 which will be described later are configured in a similar manner.

FIG. 5 is a longitudinal section view taken along the line A-A of FIG. 4, and therefore shows the body portions 208, 214, 220, 226 of the coils 206, 212, 218, 224. Also FIGS. 24 to 26 which will be described later show the body portions of the coils.

The yoke 230 is made of a ferromagnetic material, and collectively surrounds the outer sides of the body portions 208, 214, 220, 226 of the coils 206, 212, 218, 224. The thus configured yoke 230 also exerts an effect that a leakage magnetic field to the outside can be reduced. The yoke 230 has a so-called fan-like plan-view shape as shown in FIG. 4. The section shape (a section along the XY plane) of the yoke 230 is a rectangular frame-like shape. The thus configured yoke 230 is also called a window-frame type yoke.

In the embodiment, an upper yoke 231 constituting the yoke 230 is detachable. The manner of using the upper yoke 231 will be described later.

The one set of magnetic poles 232 are made of a ferromagnetic material, and inward protruded by, for example, about 15 mm from the yoke 230 so as to be opposed to each other in the Y direction across the beam path 202. The plan-view shape of each magnetic pole 232 is an arcuate shape which extends along the center orbit 54 of the ion beam 50 shown in FIG. 4. This shape is also called a fan-like shape. The gap length G between the magnetic poles 232 is somewhat (for example, by 100 to 150 mm) larger than the dimension $W_Y$ in the Y direction of the ion beam 50. The magnetic poles 232 are not essential. When the magnetic poles are disposed, however, the magnetic force lines 204 can be easily concentrated in the gap between the magnetic poles 232, and therefore it is facilitated to generate a magnetic field having a high magnetic flux density in the beam path 202.

For example, the gap length G between the magnetic poles 232 has a size which is equal to or larger than ½ of the radius of curvature R. When the radius of curvature R is 800 mm, specifically, the gap length G is, for example, 500 mm. Usually, the gap length G is larger than the width $W_G$ of the magnetic poles 232. Namely, $G \geqq W_G$. According to such dimensional relationships, the magnetic poles 232 and the yoke 230 can be prevented from being unnecessarily enlarged.

Figure 10:
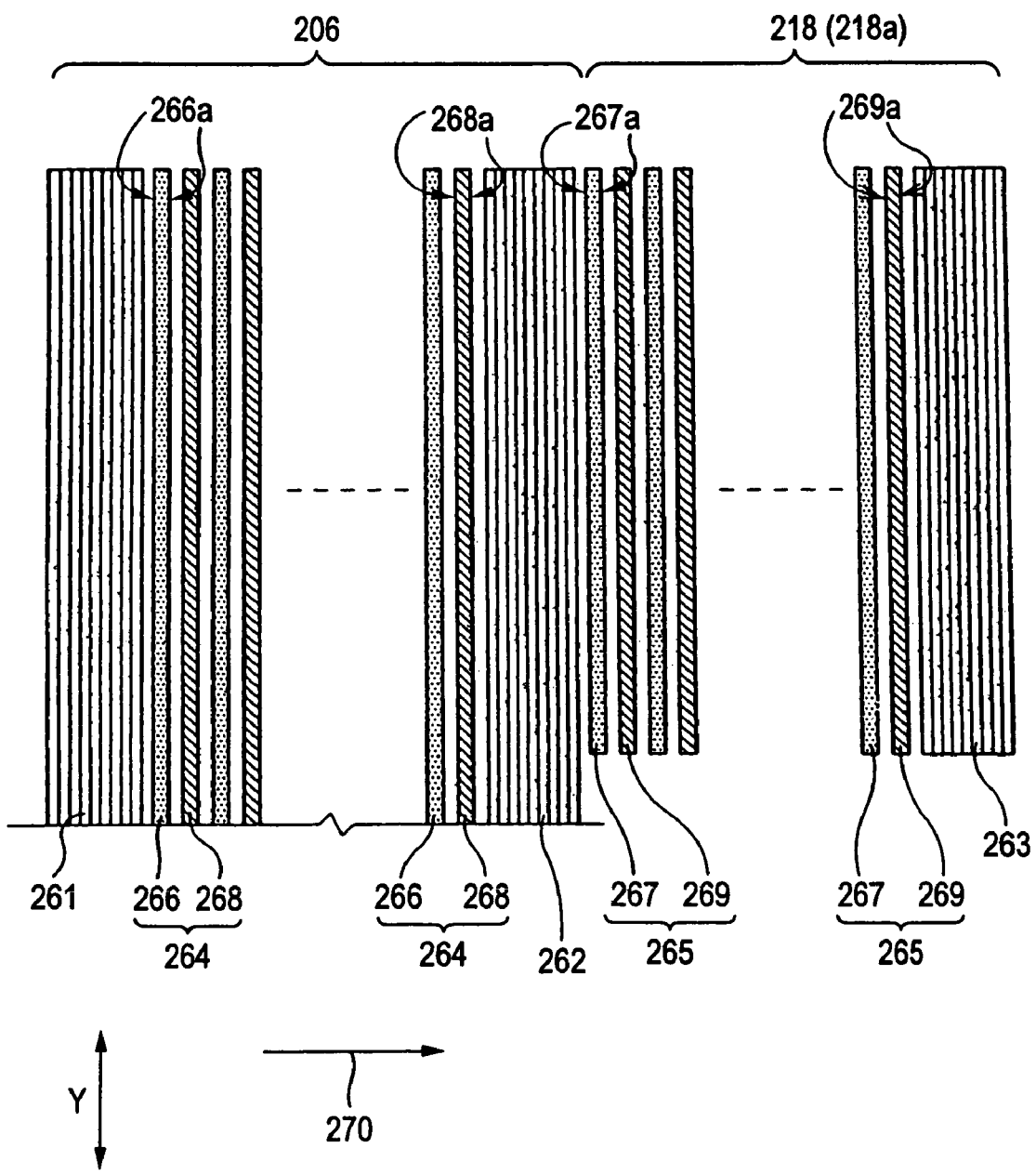
FIG. 10 is a section view explodedly showing the first inner coil and the uppermost first outer coil shown in FIG. 9.

In FIGS. 5 to 7, gaps are seemed to exist between the first inner and outer coils 206, 218, and between the second inner and outer coils 212, 224. In the embodiment, a stacked insulator 262 shown in FIGS. 9 and 10 is interposed in the gaps.

(2-2) Structures of Coils, and the Like

Next, structures of the coils, and the like will be described in detail. FIG. 9 is a schematic view enlargedly showing sections of the first inner and outer coils taken along the line D-D of FIG. 7, and FIG. 10 is a section view explodedly showing the first inner coil and the uppermost first outer coil shown in FIG. 9.

The first inner and outer coils 206, 218 have a structure where notched portions 272 to 275 (see FIG. 7) are disposed in a fan-shaped cylindrical stacked coil 290 (see FIG. 14) while leaving the body portions 208, 220 and the connecting portions 210, 222. In the fan-shaped cylindrical stacked coil, a lamination (a set 264) of an insulation sheet 266 in which the principal face 266a extends along the Y direction, and a conductor sheet 268 in which the principal face 268a extends along the Y direction is stacked with being wound at several turns on the outer peripheral face of a first stacked insulator 261 (stacked in the direction of the arrow 270 intersecting with the Y direction, the same shall apply hereinafter), the second stacked insulator 262 is formed on the outer peripheral face of the lamination, a lamination (a set 265) of the insulation sheet 267 in which the principal face 267a extends along the Y direction, and the conductor sheet 269 in which the principal face 269a extends along the Y direction is stacked with being wound at several turns on the outer peripheral face of the insulator, and a third stacked insulator 263 is formed on the outside of the lamination.

In order to facilitate the understanding of the notched portions 272 to 275, the notched portions 272 to 275 of the first inner coil 206 are shown in FIG. 12. Similar notched portions 272 to 275 are disposed also in the first outer coils 218.

The yoke 230 is fitted into the two notched portions 272, 273 which are positioned in outer and inner directions of the radius of curvature R. Namely, they have a shape corresponding to the shape of the yoke 230. Notched portions 276 to 279 of the coil 320 which will be described later are configured in a similar manner. The two notched portions 274, 275 on the side of the traveling direction Z of the ion beam 50 form upper halves of the inlet 238 and the outlet 240, respectively.

The second stacked insulator 262 may be deemed to constitute the first inner coil 206 (FIG. 10 illustrates this case), or may be deemed to constitute the first outer coil 218, or may be deemed to be shared by the coils 206, 218.

Figure 14:
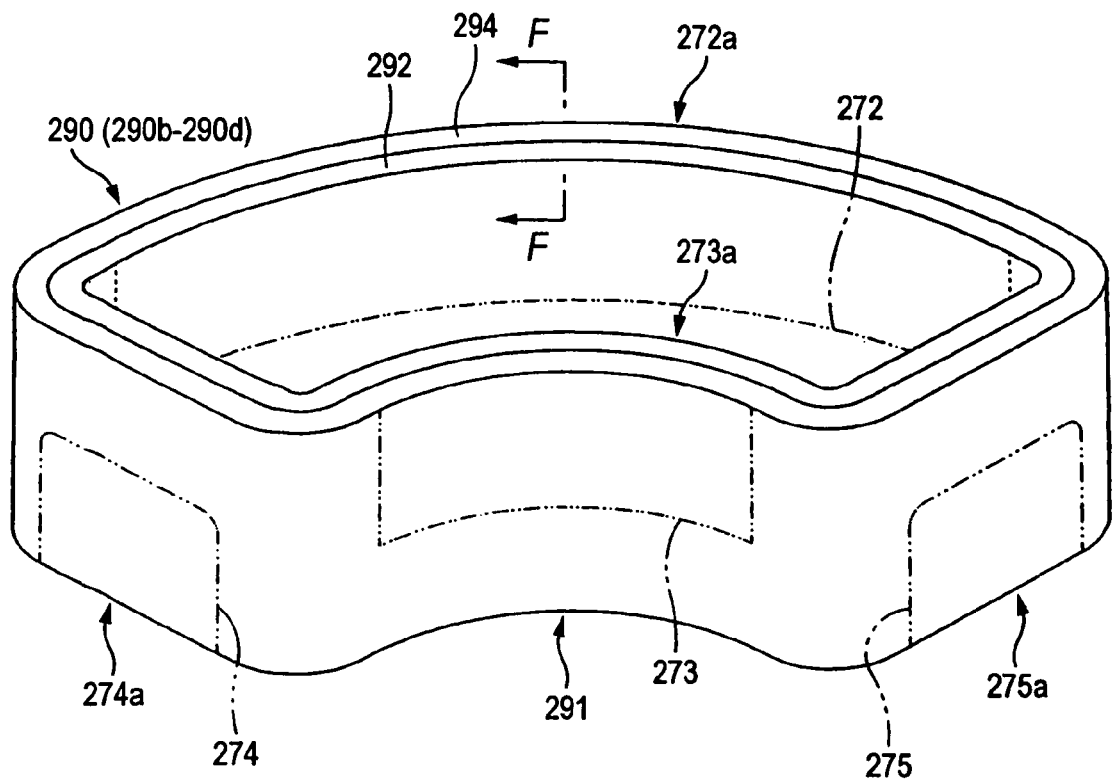
FIG. 14 is a perspective view showing an example of a stacked coil which is an original of the first and second inner coils shown in FIG. 7.
Figure 15:
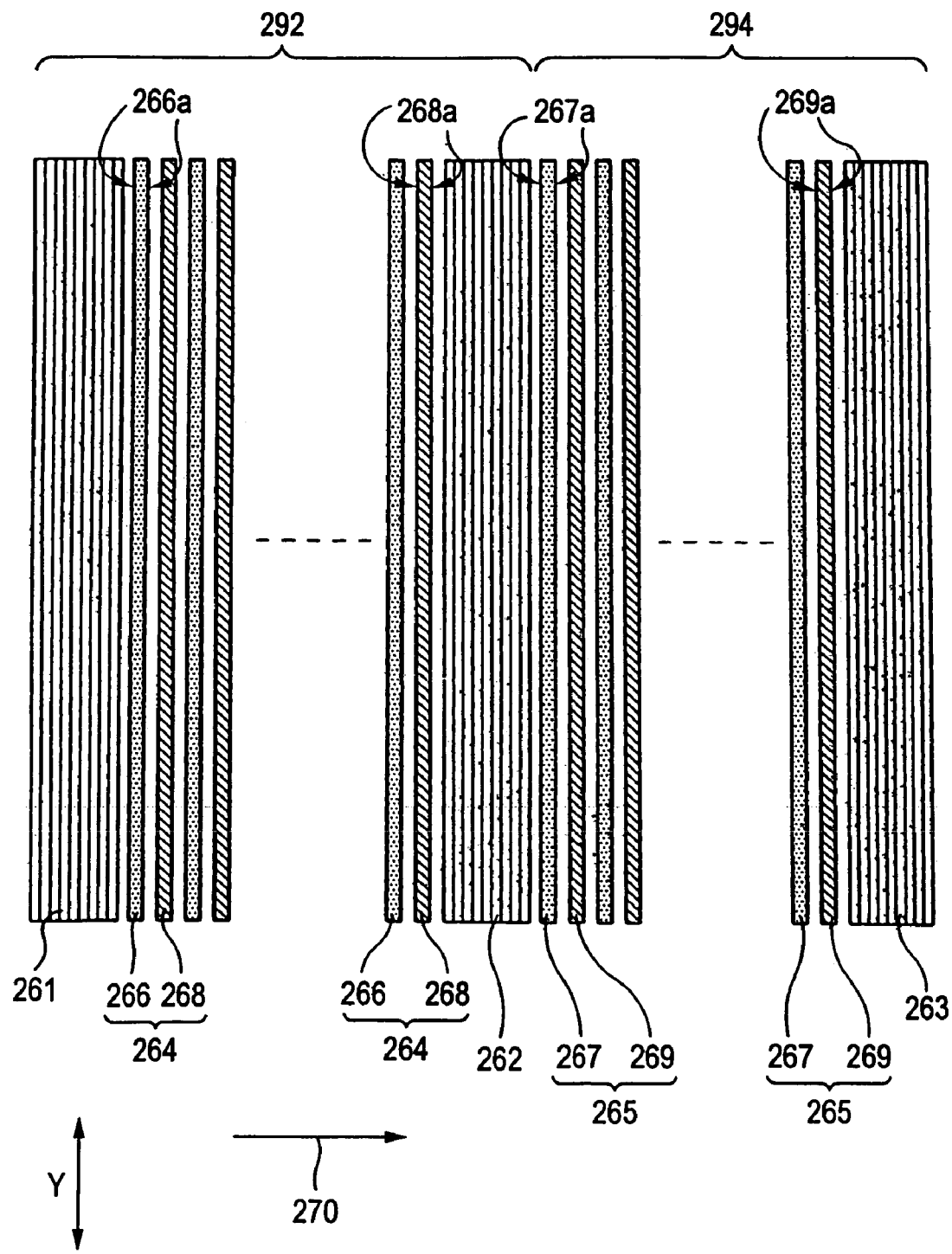
FIG. 15 is a view explodedly showing a section of the inner and outer coils, along the line F-F of FIG. 14.

FIG. 15 shows the section structure of the stacked coil 290 shown in FIG. 14. As shown in FIG. 15, the stacked coil is configured by inner and outer coils 292, 294 having the same section structure as that of FIG. 10. Also in this case, the second stacked insulator 262 may be deemed to constitute the inner coil 292 (FIG. 15 illustrates this case), or may be deemed to constitute the outer coil 294, or may be deemed to be shared by the coils 292, 294.

In the stacked coil 290, portions 272a to 275a respectively corresponding to the notched portions 272 to 275 are notched and removed by a cutting process or the like to form the notched portions 272 to 275. Then, the inner coil 292 is configured as the first inner coil 206, and the outer coil 294 is configured as the first outer coil 218.

Furthermore, the embodiment has a structure where, in order to divide the first outer coil 218 into three portions (three steps), the gaps 244 are disposed in the outer coil 294 of the stacked coil 290 by a cutting process or the like.

Figure 16:
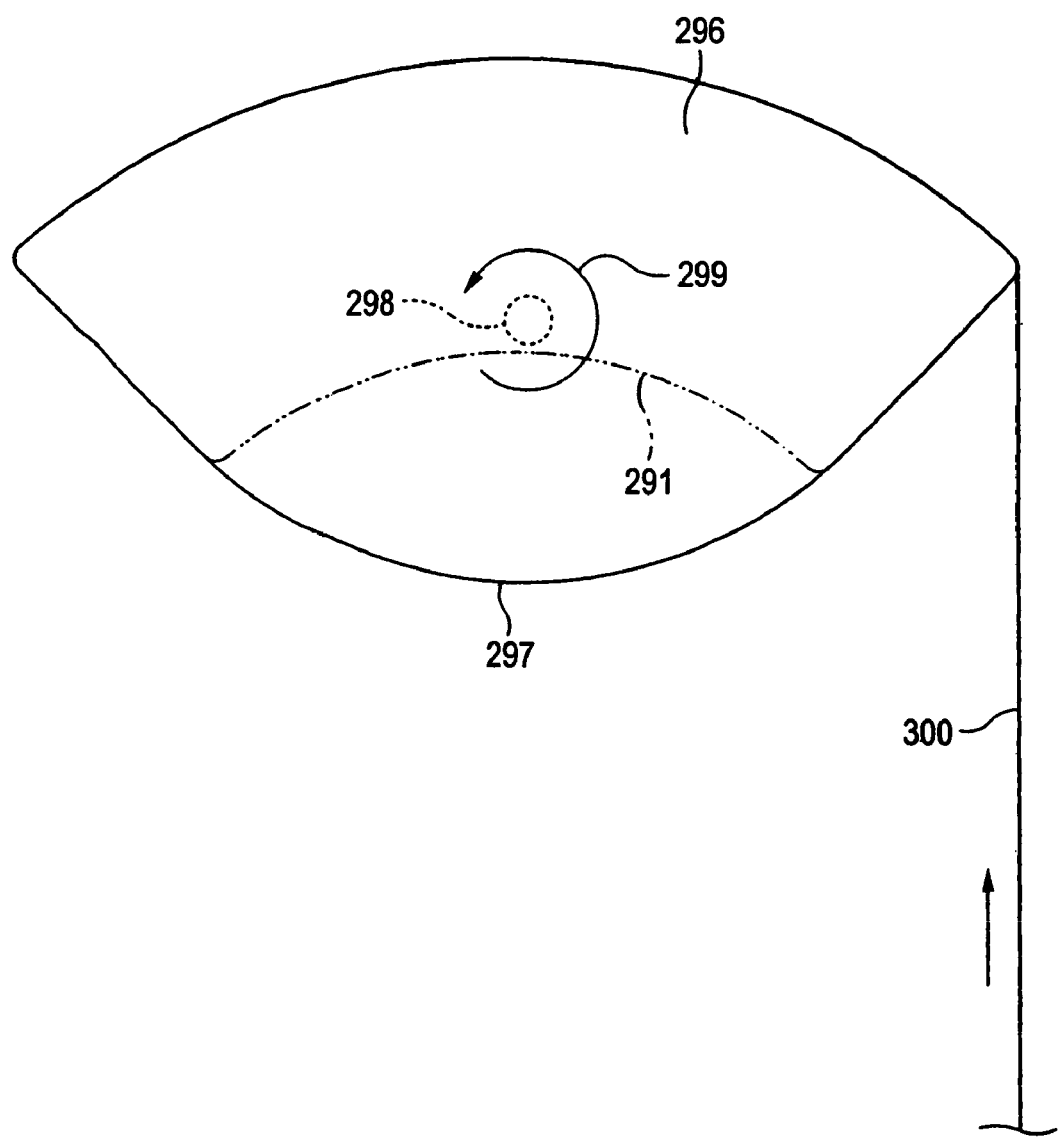
FIG. 16 is a plan view showing an example of a manner of winding a prepreg sheet with using a mandrel.

Each of the stacked insulators 261, 262, 263 of the stacked coil 290 is formed by, for example, winding in multiple turns a prepreg sheet. A prepreg sheet 300 in FIG. 16 is the prepreg sheet. A prepreg sheet is a sheet in which a support member having insulative and heat resistant properties is impregnated with an insulative resin to be processed into a semi-hardened state.

The support member is configured by, for example, glass fibers or carbon fibers. The resin is configured by, for example, an epoxy resin or a polyimide resin. The stacked insulators 261 to 263 which are formed with using such a prepreg sheet may be called fiber-reinforced plastic (FRP). The thickness of the stacked insulators 261 to 263 may be adequately selected in accordance with the strength required as a structural member.

Each of the insulation sheets 266, 267 is a sheet configured by, for example, Nomex (registered trademark), Lumilar (registered trademark), or Kapton (registered trademark), or another insulation sheet. The thickness of the insulation sheets 266, 267 may be adequately selected in accordance with the required insulation strength and the like. For example, the thickness is about 75 μm, or may be smaller than this value.

Each of the conductor sheets 268, 269 is configured by, for example, a copper sheet or an aluminum sheet. The thickness may be adequately selected in accordance with the current to be passed. For example, in the case of a copper sheet, the thickness is about 0.4 mm, and, in the case of an aluminum sheet, the thickness is about 0.5 mm. Their width in a direction corresponding to the Y direction may be adequately selected in accordance with the required Y-direction dimension of the coil, and is, for example, 230 mm (for example, the width before a process which will be described later is about 234 mm). Also the widths of the stacked insulators 261 to 263 and the insulation sheets 266, 267 may be set in accordance with this value.

The insulation sheet 266 and the conductor sheet 268 may be overlapped in the manner opposite to that of FIG. 10 as described below. The conductor sheet 268 may be disposed inside (the left side of FIG. 10, i.e., on the side of the stacked insulator 261) of the first inner coil 206, and the insulation sheet 266 may be disposed overlappingly with the outside. As required, insulation sheets 266 may be disposed overlappingly with the both sides of the conductor sheet 268, respectively. The insulation sheet 267 and conductor sheet 269 of the first outer coils 218 are configured in a similar manner.

Figure 11:
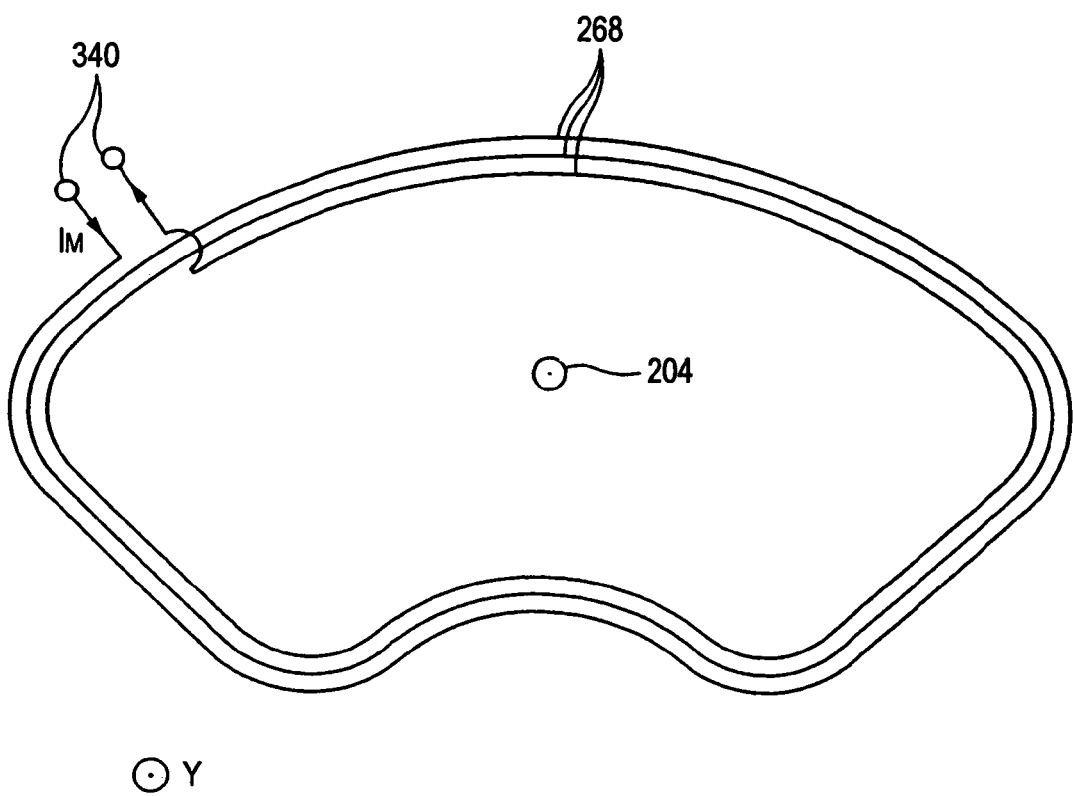
FIG. 11 is a schematic plan view showing a manner of winding a conductor sheet shown in FIG. 10.

As seen in a plan view, the conductor sheet 268 of the first inner coil 206 has a structure where it is wound in multiple turns in a fanlike shape as shown in FIG. 11, and terminals 340 are connected to the ends of the sheet. However, the number of turns is not restricted to the illustrated one. When a current $I_M$ flows through the conductor sheet 268, the magnetic force lines 204 which form the main magnetic field can be generated. The same current $I_M$ and magnetic force lines 204 are shown also in FIG. 12.

As seen in a plan view, also the conductor sheet 269 of the first outer coil 218 has a similar structure as that of FIG. 11.

The second inner and outer coils 212, 224 are structured in a similar manner as the first inner and outer coils 206, 218. As described above, however, the coils have a plane-symmetrical shape about the symmetry plane 234 with respect to the first inner and outer coils 206, 218.

Figure 23:
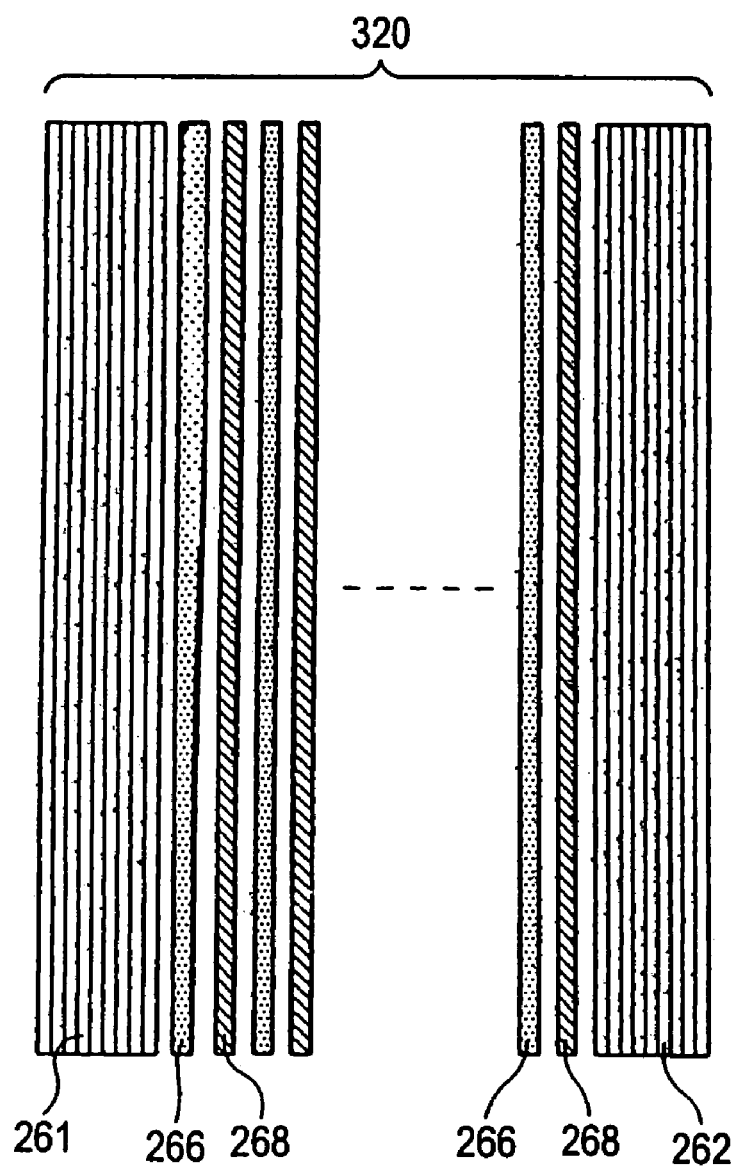
FIG. 23 is a view explodedly showing a section of the coil, along the line J-J of FIG. 22.

As required, a member for performing reinforcement of the coils, and the like may be further disposed on the outer periphery of the outer stacked insulator 263 (in the case of coils shown in FIG. 23, the stacked insulator 262).

A structure example of the connecting portions of the coils will be described in more detail with reference to FIG. 12 with taking the first inner coil 206 as an example.

Each of the connecting portions 210 of the first inner coil 206 has: two vertical portions 282 which are substantially perpendicularly connected to end portions of the body portions 208 in the Z direction, and which extend in substantially parallel to the Y direction; and a lateral portion 284 which is substantially perpendicularly connected to the vertical portions 282, and which extends in substantially parallel to the XZ plane. Namely, the vertical portions 282 are connected to each other by the lateral portion 284. Therefore, the first inner coil 206 has: lateral conduction paths 286 which are substantially perpendicular to the Y direction; and vertical conduction paths 288 which are substantially parallel to the Y direction. Namely, most of the conduction path of the first inner coil 206 is configured by a combination of the conduction paths 286 and 288 excluding edge portions. The current densities in all places of the conduction paths 286 and 288 are set to be identical to one another.

The connecting portions 216, 222, 228 of the other coils 212, 218, 224 are configured in a similar manner as the connecting portions 210. Therefore, each of the other coils 212, 218, 224 has lateral conduction paths which are substantially perpendicular to the Y direction, and vertical conduction paths which are substantially parallel to the Y direction. Namely, most of the conduction path of the coil is configured by a combination of the lateral conduction paths and the vertical conduction paths excluding edge portions. The current densities in all places of the lateral and vertical conduction paths are set to be identical to one another. The coil 320 which will be described later is configured in a similar manner.

The connecting portions of the coils are preferably structured as described above. According to the structure, the projection distances of the connecting portions from the analyzing electromagnet 200 in the directions of beam incidence and emission can be surely shortened. The projection distances will be described later in detail.

A configuration example of power sources for the coils is shown in FIG. 13. In the example, DC main power sources 250 are connected to the first and second inner coils 206, 212, respectively. The main power sources 250 can supply the currents $I_M$ which are substantially identical in level to each other, to the first and second inner coils 206, 212, respectively. The two main power sources 250 are not required to be separately disposed, and may be configured as a single combined main power source.

In this example, furthermore, DC sub-power sources 252 are connected to the first outer coils 218 (218a to 218c) and the second outer coils 224 (224a to 224c), respectively. The sub-power sources 252 can supply currents $I_S$ to the first and second outer coils 218, 224, respectively, and the currents $I_S$ flowing through the first and second outer coils 218, 224 can be independently controlled. The plural sub-power sources 252 are not required to be separately disposed, and may be configured as a single combined sub-power source which can independently control the currents $I_S$ respectively flowing through the first and second outer coils 218, 224.

(2-3) Methods of Producing Coils, Etc.

Next, examples of methods of producing the coils will be described with taking the first inner and outer coils 206, 218 as examples.

First, the fan-shaped cylindrical stacked coil 290 shown in FIG. 14 is produced. This production is performed in the following manner.

As shown in FIG. 16, first, a mandrel 296 having an arcuate portion 297 which is outward projected in a manner opposite to an arcuate portion 291 of the stacked coil 290 shown in FIG. 14 is rotated about an axis 298 in a constant direction as indicated by the arrow 299, whereby the prepreg sheet 300 such as described above is wound in multiple turns. As a result, the stacked insulator 261 shown in FIGS. 15 and 17 is formed.

Figure 17:
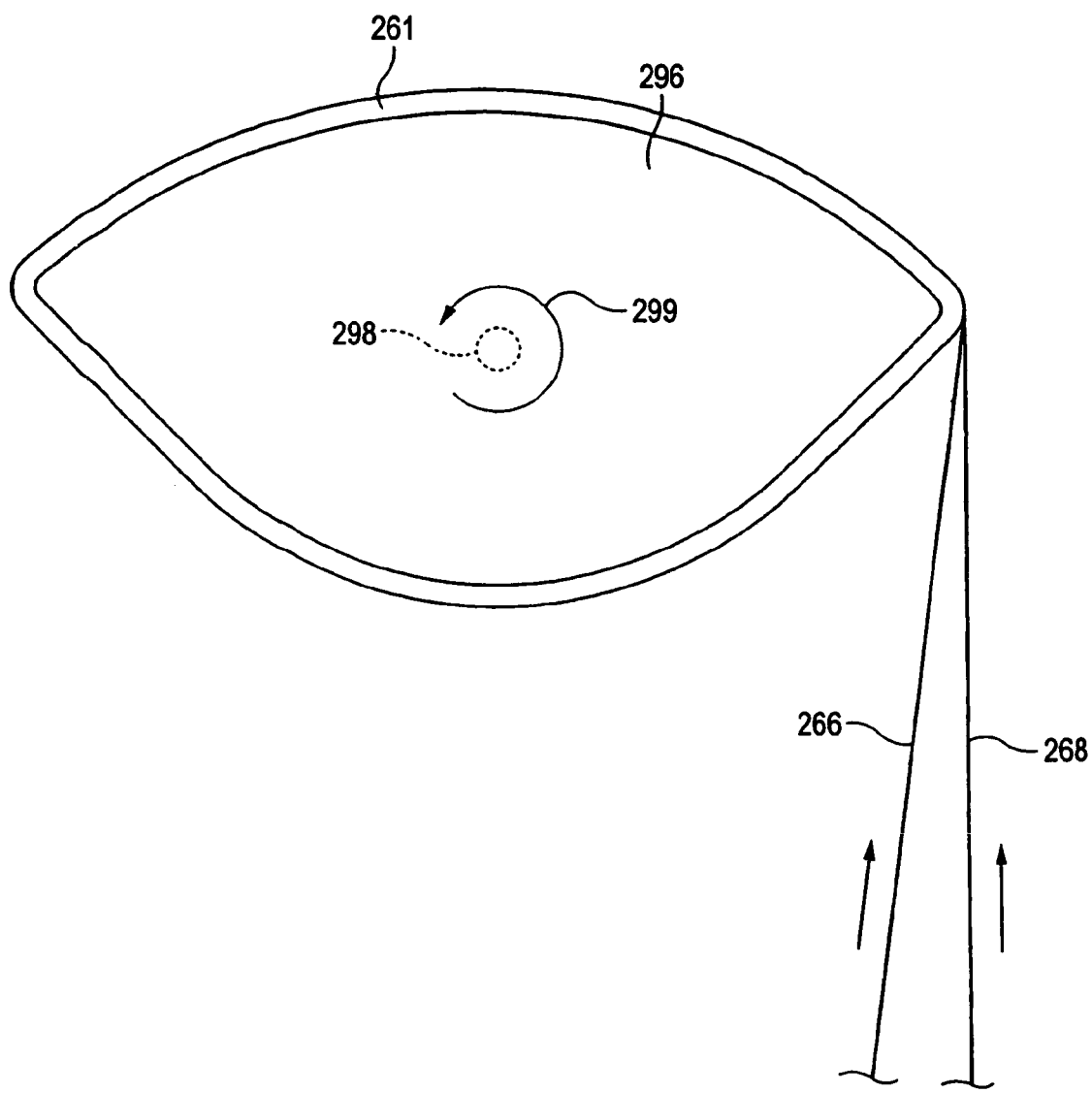
FIG. 17 is a plan view showing an example of a manner of winding an insulation sheet and a conductor sheet with using a mandrel.

Next, as shown in FIG. 17, the mandrel 296 is rotated in the same manner as described above to wind and laminate the insulation sheet 266 and the conductor sheet 268 while they overlap with each other, in multiple turns on the outer peripheral face of the stacked insulator 261. As a result of the above, a lamination of the insulation sheet 266 and the conductor sheet 268 shown in FIG. 15 is formed.

Next, in a similar manner as the case of FIG. 16, the prepreg sheet 300 is wound in multiple turns on the outer peripheral face of the lamination of the insulation sheet 266 and the conductor sheet 268, whereby the stacked insulator 262 shown in FIG. 15 is formed.

Next, in a similar manner as the case of FIG. 17, the insulation sheet 267 and the conductor sheet 269 are wound while they overlap with each other, in multiple turns on the outer peripheral face of the stacked insulator 262, whereby a lamination of the insulation sheet 267 and the conductor sheet 269 shown in FIG. 15 is formed.

Next, in a similar manner as the case of FIG. 16, the prepreg sheet 300 is wound in multiple turns on the outer peripheral face of the lamination of the insulation sheet 267 and the conductor sheet 269, whereby the stacked insulator 263 shown in FIG. 15 is formed.

After the above steps, the mandrel 296 is removed, and then a stacked coil 290a which is configured by the inner coil 292 and the outer coil 294, but in which an arcuate portion 291a is projected in a manner opposite to the arcuate portion 291, or to the outside is obtained.

When lead plates are disposed in winding start and end portions of the conductor sheet 268, the conductor sheet 268 can be connected to the terminals 340 (see FIG. 11) with using the lead plates. The conductor sheet 269 is configured in a similar manner.

Before the winding process, preferably, abrasive grains (shots) such as metal grains are blown (i.e., a shot-blast process is applied) to the principal faces 268a, 269a of the front and rear sides of the conductor sheets 268, 269 to roughen the surfaces. According to the configuration, the surface areas can be increased and the close contact with respect to the insulation sheets 266, 267 and the like can be enhanced. Even when the shot-blast process is applied at least on one principal face of each of the conductor sheets 268, 269, the effects can be attained. However, it is preferable to apply the process on the both principal faces. This is also applicable to the insulation sheets 266, 267.

Similarly, it is preferable to apply a shot-blast process to the principal faces 266a, 267a of the front and rear sides of the insulation sheets 266, 267, to roughen the surfaces. According to the configuration, the surface areas can be increased, and the close contact with respect to the conductor sheets 268, 269 and the like can be further enhanced.

Figure 18:
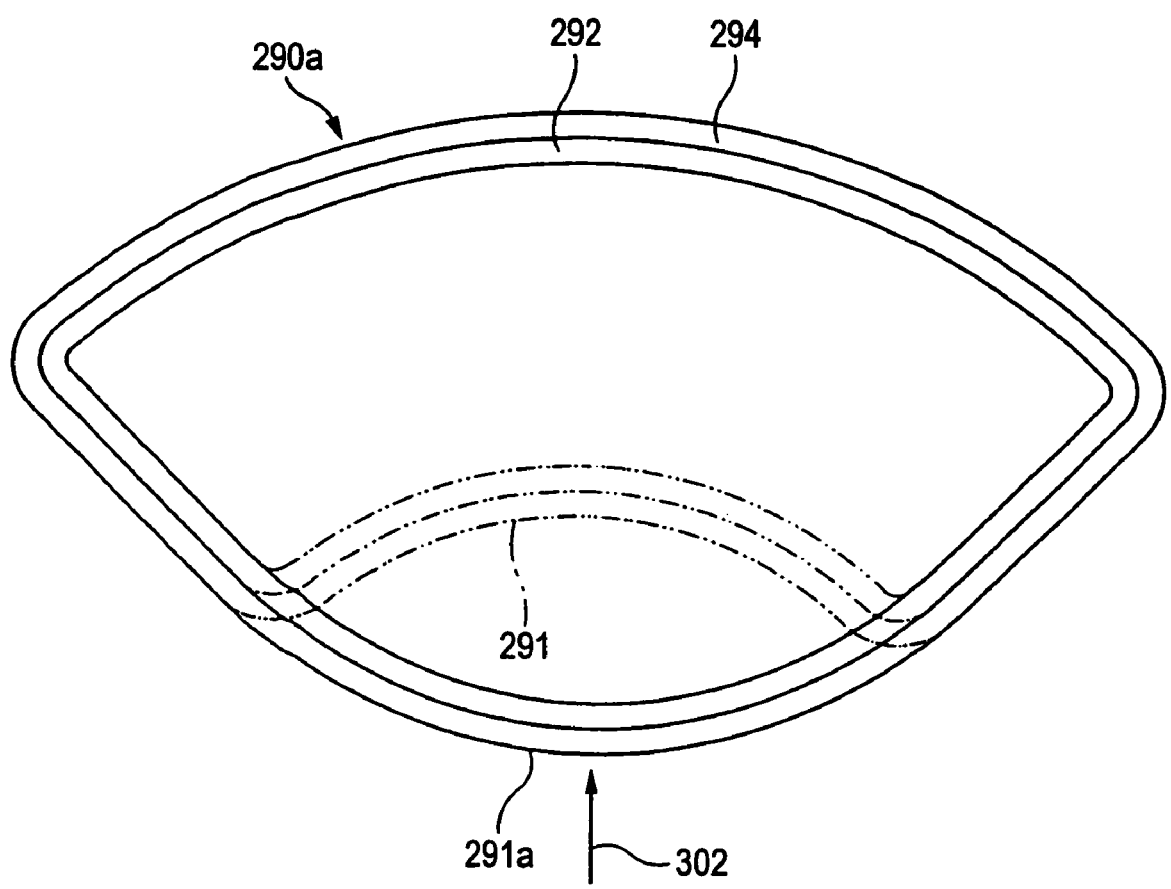
FIG. 18 is a plan view showing an example of a stacked coil which has been wound with using a mandrel.

Next, a heat-shrinkable tape (not shown) is wound around the outer periphery of the stacked coil 290a, and then the arcuate portion 291a is pressed as indicated by the arrow 302 in FIG. 18 to perform a molding process of forming the arcuate portion 291. The resulting article is heat cured. As a result, a stacked coil 290h from which the stacked coil 290 shown in FIG. 11 will be formed is obtained. The winding of the heat-shrinkable tape improves the strength of the structure. In place of the heat-shrinkable tape, a prepreg tape which is configured in a similar manner as the above-mentioned prepreg sheet may be wound.

Next, the stacked coil 290b is vacuum-impregnated with a resin, and then heat cured under a pressurized condition. Briefly speaking, this means that a resin molding process is performed. As a result, the stacked coil 290 shown in FIG. 14 is obtained. The resin molding process can increase the adhesion strengths between the layers of the stacked coil 290 to enhance the strength of the coil and also the electrical insulation property.

Next, the both end faces in the axial direction (in other words, the height direction) of the stacked coil 290 are subjected to a cutting process to be formed as flat faces. Thereafter, the portions 272a to 275a corresponding to the notched portions are subjected to a cutting process to form the notched portions 272 to 275.

In the case where the outer coil 294 is configured as the plural first outer coils 218, a grooving process is applied to portions of the outer coil 294 which correspond to the gaps 244, thereby forming the gaps 244.

Next, a stacked coil 290c on which the cutting and grooving processes have been applied is immersed in an etching solution which etches the materials (as described above, copper or aluminum) of the conductor sheets 268, 269, thereby performing an etching process. As a result, burrs and the like of the conductor sheets 268, 269 which are produced on the processed faces during the cutting and grooving processes are removed away to prevent a short circuit (layer short) between layers in the conductor sheets 268, 269 from occurring, and end faces of the conductor sheets 268, 269 are further roundly recessed than those of the insulation sheets 266, 267 to increase the creepage distance of the layer insulation in the conductor sheets 268, 269, whereby the insulation performance can be improved.

A heat-shrinkable tape is wound around the whole of a stacked coil 290d on which the above-described etching process has been applied, and then heat cured. As a result, it is possible to obtain a fan-shaped cylindrical stacked coil in which the first inner and outer coils 206, 218 shown in FIGS. 4 to 10 and the like are integrated with each other. The winding of the heat-shrinkable tape improves the strength of the structure. In the case where the coils have a forced cooling structure which will be described below, the cooling plates 312 may be attached in the following manner before the heat-shrinkable tape is wound. In place of the heat-shrinkable tape, a prepreg tape which is configured in a similar manner as the above-mentioned prepreg sheet may be wound.

Figure 19:
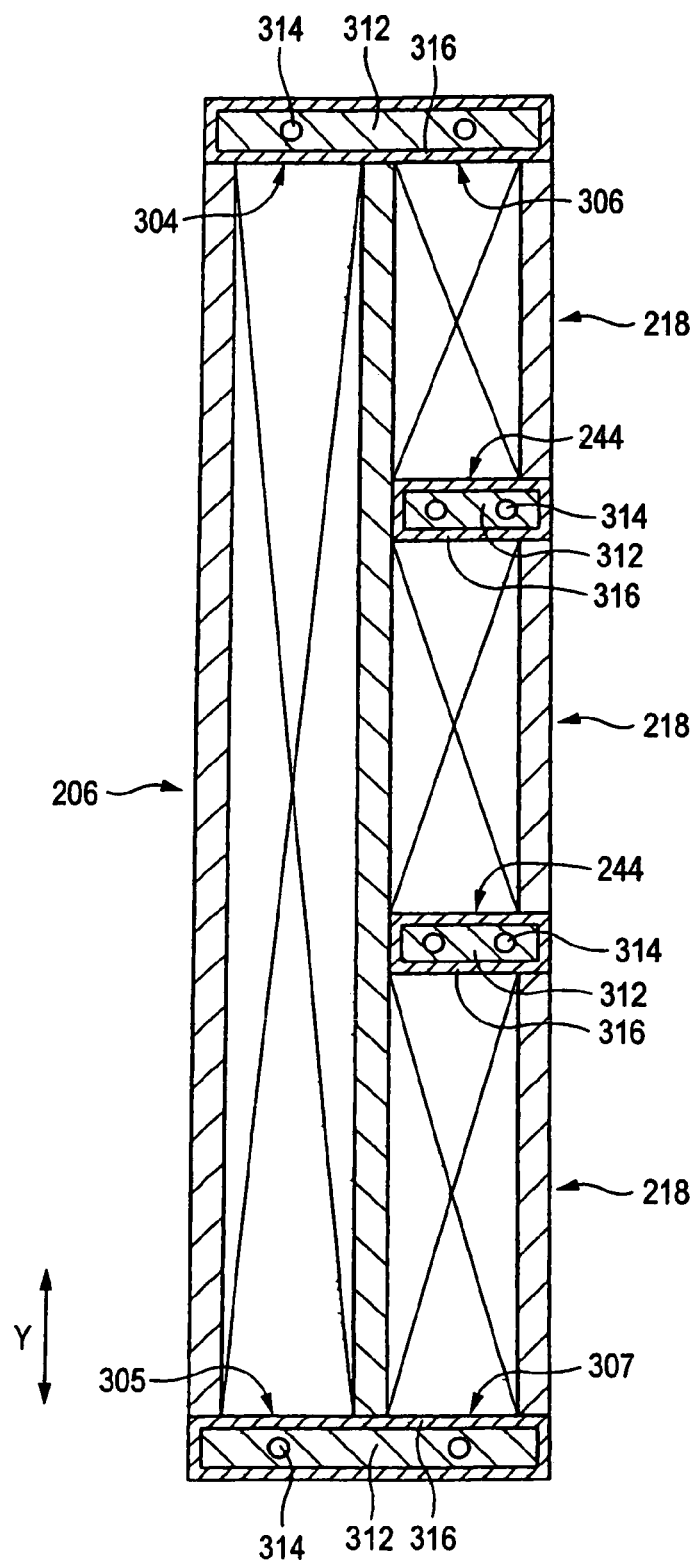
FIG. 19 is a section view showing an example of attachment of cooling plates to the first and second inner coils.

As shown in FIG. 19, the cooling plates 312 having a coolant passage 314 are pressingly contacted and attached via insulators 316 to upper and lower end faces 306, 307 and gaps 244 of the first inner and outer coils 206, 218, respectively. Preferably, the cooling plates 312 are disposed not only in the upper and lower end faces in the Y direction of the body portions 208, 220 of the coils 206, 218, but also in the upper and lower end faces in the Y direction of the connecting portions 210, 222. Namely, preferably, the plates are disposed in a region as wide as possible. For example, cooling water flows through the coolant passages 314. In the example, the insulators 316 are wound around the cooling plates 312. However, it is not required to wind the insulators.

The coils 206, 218 can be forcedly cooled through their end faces by the cooling plates 312. Such a cooling structure is also called an end cooling system.

In the above-described case, preferably, a heat diffusion compound (for example, silicone grease) having a high thermal conductivity is interposed (for example, applied) between the cooling plates 312 and the insulators 316, and between the insulators 316 and the end faces of the coils 206, 218. According to the configuration, an air space can be eliminated as far as possible, and the thermal conductivity performance and hence the cooling performance can be improved.

Each of the gaps 244 may be configured as a wedge-like shape in which the width is narrower as more advancing toward the inner side (the left side of FIG. 19) of the coil 218. Also the cooling plate 312 to be attached to the gap may be configured as a similar wedge-like shape, so that the cooling plate 312 is pressingly inserted into the gap. According to the configuration, the gap which is formed between the end face of the coil 218 and the cooling plate 312 can be made small so that the close contact can be improved. Therefore, the cooling performance can be further improved.

In the case where the cooling plates 312 are disposed as described above, the heat-shrinkable tape or prepreg tape may be wound around the whole coil in the state shown in FIG. 19, and then heat cured. This can perform also fixation and close contact of the cooling plates 312.

Finally, as required, also in both cases where the cooling plates 312 are disposed, and where the cooling plates are not disposed, the whole coil including the first inner and outer coils 206, 218 may molded by a resin. According to the configuration, the moisture resistance, insulation property, mechanical strength, and the like of the coils can be further improved. In this case, preferably, 5 to 30 wt. % of a filler (filling agent) may be mixed with the resin. According to the configuration, the crack resistance of the resin, and the like can be improved.

In a similar manner as described above, also the second inner and outer coils 212, 224 can be produced as a coil in which the coils 212, 224 are integrated. Coils which will be described later, i.e., the coil 320 shown in FIGS. 22 to 24, the first and second coils 326, 328 shown in FIG. 25, and the inner coil 330 and first and second outer coils 218, 224 shown in FIG. 26 are produced in a similar manner as described above. The inner and outer coils can be produced integrally with each other.

With using the coils 206, 218, 212, 224, the analyzing electromagnet 200 shown in FIGS. 4 and 5, and the like may be assembled in, for example, the following procedure. Namely, while the upper yoke 231 of the yoke 230 is kept to be removed away, a member in which the second inner coil 212 is integrated with the second outer coil 224 is inserted from the upper side into the yoke 230, the vacuum vessel 236 1s then inserted from the upper side, and a member in which the first inner coil 206 is integrated with the first outer coil 218 is then inserted from the upper side. Finally, the upper yoke 231 is attached.

(2-4) Features of Analyzing Electromagnet 200, and the Like

In the analyzing electromagnet 200, the first inner and outer coils 206, 218 have the configuration where the notched portions 272 to 275 are disposed in the fan-shaped cylindrical stacked coil 290 while leaving the body portions 208, 220 and the connecting portions 210, 222, and hence the connecting portions 210, 222 are in a state where the portions are extended in the Y direction from the end portions of the body portions 208, 220 in substantially parallel. Even in the case where the dimension in the Y direction of the body portions 208, 220 is increased, therefore, the case is coped with by correspondingly increasing the dimension in the Y direction of the connecting portions 210, 222. As a result, the projection distances of the connecting portions 210, 222 in the directions of beam incidence and emission are not increased.

The above will be described with taking the first inner coil 206 as an example with reference to FIG. 8. In the case where the dimension a in the Y direction of the body portions 208 is increased, the case is coped with by correspondingly increasing the dimension c in the Y direction of the connecting portions 210. Specifically, the dimensions a and c are substantially equal to each other. Even when the dimension a is increased, therefore, the projection distance $L_3$ (see FIG. 4) of the connecting portions 210 in the directions of incidence and emission of the ion beam 50 is not increased. The projection distance $L_3$ is determined by the distance $L_5$ between the end face of the yoke 230 and that of the connecting portion 210, and the thickness b of the connecting portion 210. Namely, the projection distance $L_3$ can be indicated by the following expression. As seen also from the description of the structure of the first inner coil 206, also the body portions 208 have the thickness of b.

$$L_3 = b + L_5 \quad \text{[Exp. 2]}$$

Unlike above-described Exp. 1 indicating the projection distance $L_1$ of the conventional analyzing electromagnet 40, above-described Exp. 2 does not include the dimension a in the Y direction. This is a feature which is largely different from the conventional analyzing electromagnet 40.

Moreover, also the distance $L_5$ can be made smaller than the distance $L_2$ of the conventional analyzing electromagnet 40. This is caused because of the following reasons. Unlike the conventional coil 12, the connecting portions 210 are formed not by obliquely raising the connecting portions 16 by a bending process, but by, as described above, disposing the notched portions 272 to 275 in the fan-shaped cylindrical stacked coil 290, and the connecting portions 210 extend in substantially parallel in the Y direction. Moreover, edge portions 254 between the body portions 208 and the connecting portions 210 can be made in a state where they are less rounded or substantially perpendicular, by a cutting process, or the like.

Because of the above-described reasons, the projection distance $L_3$ of the connecting portions 210 from the yoke 230 in the directions of beam incidence and emission can be reduced.

The second inner and outer coils 212, 224 are configured in a similar manner.

When the dimension a in the Y direction is set to an identical value or 250 mm, the projection distance $L_1$ of the conventional analyzing electromagnet 40 is about 300 mm, and in contrast the projection distance $L_3$ of the analyzing electromagnet 200 is about 110 mm.

Because of the same reasons as described above, even in the case where the inner coils 206, 212 and the outer coils 218, 224 are doubly disposed as in the analyzing electromagnet 200, projection distances $L_4$ of the outer coils 218 from the yoke 230 in the directions of beam incidence and emission can be reduced. In the conventional analyzing electromagnet 40, if coils are doubly disposed in inner and outer sides, the projection distances of the connecting portions are very increased.

Because of the above reasons, the analyzing electromagnet 200 can be miniaturized, and therefore the area required for installing the analyzing electromagnet 200 can be reduced. Also the weight of the analyzing electromagnet 200 can be reduced. Moreover, the possibility that the magnetic fields generated by the connecting portions of the coils 206, 218, 212, 224 disturb the form of the ion beam 50 is reduced.

In accordance with that the projection distances of the connecting portions of the coils 206, 218, 212, 224 can be reduced, also the lengths of the connecting portions can be shortened, and hence wasteful power consumption in the connecting portions can be reduced.

Moreover, the coils 206, 218, 212, 224 have the structure in which, as described above, the conductor sheets 268, 269 are stacked with interposing the insulation sheets 266, 267 therebetween. As compared with a multi-turn coil in which a coated conductor is wound many times, therefore, the space factor of the conductor is high, and the power loss is correspondingly low. Consequently, the power consumption can be reduced.

For example, the case where the dimension a in the Y direction of each coil is set to 250 mm will be considered. The conductor space factor of a multi-turn coil of a coated conductor in the conventional art is about 60 to 70% even in the case where the conductor is not hollow (is not a hollow conductor), and further reduced in the case of a hollow conductor. By contrast, the space factors of the conductors of the coils 206, 218, 212, 224 can be set to about 84 to 85%.

As a result, in the analyzing electromagnet 200, a magnetic field of a required strength can be generated at a power consumption which is smaller than that in the conventional analyzing electromagnet 40. At the same power consumption, a magnetic field which is stronger than that generated by the conventional analyzing electromagnet 40 can be generated. In the latter case, the radius of curvature R of the ion beam deflection can be reduced, so that the analyzing electromagnet 200 can be further miniaturized.

In the case where the dimension a in the Y direction of each coil is set to 250 mm and a magnetic field of 0.2 tesla is generated by the two coils 206, 212 (the coils 218, 224 are not used) in the same manner as the conventional analyzing electromagnet 40, the power consumption of the conventional analyzing electromagnet 40 is about 67 kW, and in contrast that of the analyzing electromagnet 200 is only about 24 kW.

The ion implanter shown FIG. 1 comprises the analyzing electromagnet 200 having the above-described features. In accordance with the miniaturization of the analyzing electromagnet 200, therefore, the whole ion implanter can be miniaturized, and hence the area required for installing the ion implanter can be reduced. Also the weight of the ion implanter can be reduced. Moreover, in accordance with the reduction of the power consumption of the analyzing electromagnet 200, the power consumption of the whole ion implanter can be reduced.

Furthermore, since the analyzing electromagnet 200 comprises the above-described first and second inner coils 206, 212, it is possible to easily cope with the ion beam 50 having a large Y-direction dimension $W_Y$ as compared with the case where one coil is used in each of upper and lower sides.

Moreover, the first and second outer coils 218, 224 can generate the sub-magnetic field which assists or corrects the main magnetic field. Because of the sub-magnetic field, the main magnetic field can be corrected, and the homogenization of the magnetic flux density distribution in the Y direction can be enhanced. The sub-magnetic field generated by the outer coils 218, 224 may be weaker than the main magnetic field, and therefore can be easily controlled.

The above-described main and sub-magnetic fields enable a magnetic field in which the homogenization of the magnetic flux density distribution in the Y direction is high, to be generated in the beam path 202. As a result, the disturbance (bend, inclination, and the like, the same shall apply hereinafter) of the form of the ion beam 50 at the emission from the analyzing electromagnet 200 can be suppressed to a low level. This effect is more remarkable in the case where the Y-direction dimension $W_Y$ of the ion beam 50 is large.

Even when one first outer coil 218 and one second outer coil 224 are used, it is possible to attain the effect of correcting the main magnetic field. However, it is preferred that, as in the example, plural first outer coils 218 and plural second outer coils 224 are disposed. In this case, the magnetic flux density distribution in the Y direction of the magnetic field generated in the beam path 202 can be corrected more finely by theses outer coils 218, 224. Therefore, it is possible to generate a magnetic field in which the homogenization in the Y direction is higher. As a result, the disturbance of the form of the ion beam 50 at the emission can be suppressed to a lower level.

(2-5) Method of Controlling Analyzing Electromagnet 200

An example of the method of controlling the analyzing electromagnet 200 will be described. The currents flowing through the first and second outer coils 218, 224 can be controlled so that the form of the ion beam 50 emitted from the analyzing electromagnet 200 approaches to that of the ion beam 50 at incidence.

Specifically, the form of the ion beam 50 emitted from the analyzing electromagnet 200 is caused to approach to a form which is parallel to a predetermined center axis (a center axis 318 shown in FIGS. 20 and 21) which is substantially parallel to the Y direction, by performing at least one of: a decrease of currents flowing through the first and second outer coils 218, 224 corresponding to portions which are excessively bent with respect to the center axis toward the inner side of the radius of curvature R in the ion beam 50 emitted from the analyzing electromagnet 200; and an increase of currents flowing through the first and second outer coils 218, 224 corresponding to portions which are deficient in bending toward the inside. This makes the ion beam 50 emitted from the analyzing electromagnet 200 to have a form which is not inclined but straight, and which approaches to the form at incidence.

Figure 20:
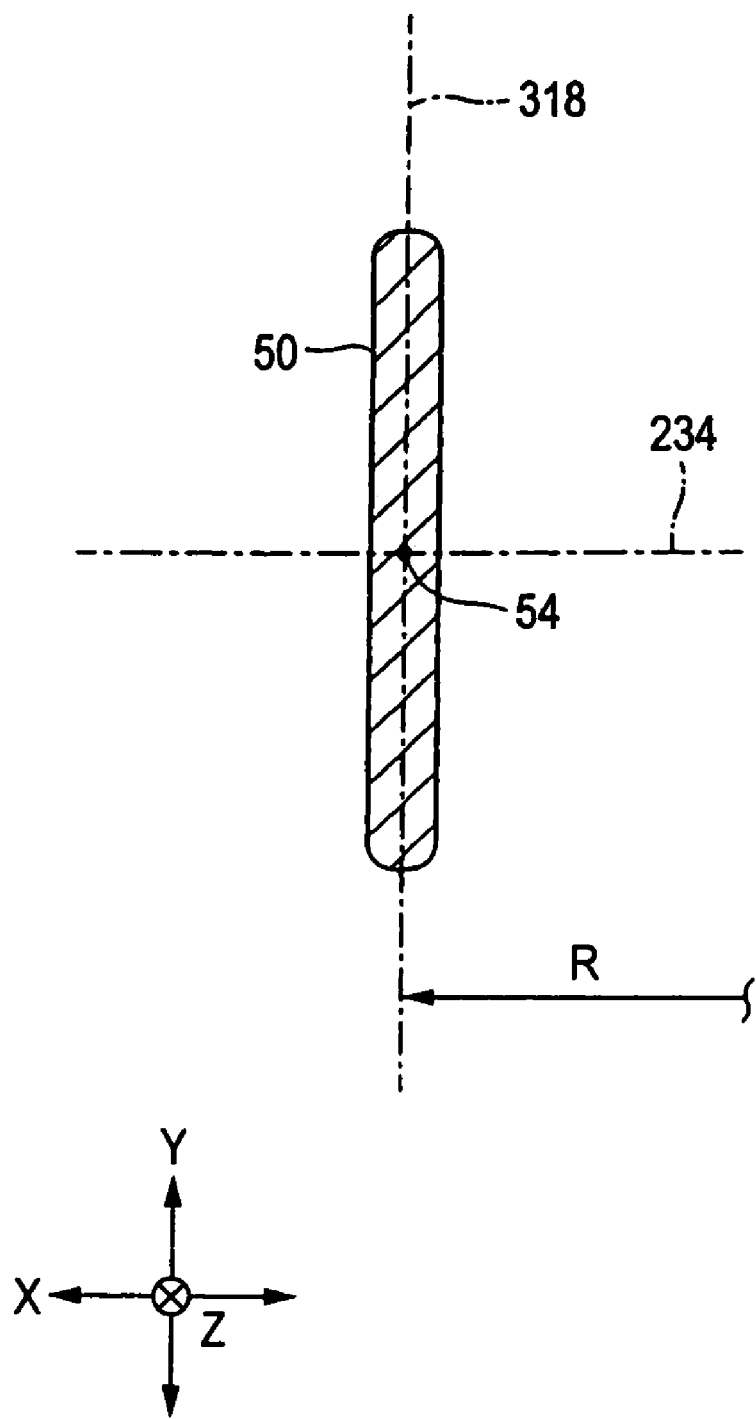
FIG. 20 is a view showing an example of an ion beam having a normal form immediately after it is emitted from the analyzing electromagnet.

FIGS. 20 and 21 show examples of the form of the ion beam 50 emitted from the analyzing electromagnet 200, respectively. In the figures, a predetermined center axis which is substantially parallel to the Y direction is indicated by 318, the symmetry plane is indicated by 234, the center orbit of the ion beam 50 is indicated by 54, and the radius of curvature is indicated by R.

In the case of the form shown in FIG. 20, the form of the ion beam 50 is not disturbed as viewed in the traveling direction Z of the ion beam 50, and hence the values of currents flowing through the first outer coils 218a to 218c and the second outer coils 224a to 224c can be maintained.

In the case of the form shown in FIG. 21, the ion beam 50 is distorted (bent) into an arcuate shape which is similar to an L-like shape as viewed in the traveling direction Z, or namely more excessively bent toward the inner side of the radius of curvature R as further advancing toward the upper side in the Y direction, and more excessively bent toward the inner side as further advancing toward the lower side. Therefore, the current flowing through the first outer coil 218a is largely reduced, that flowing through the first outer coil 218b is slightly reduced, the currents flowing through the first outer coil 218c and the second outer coil 224c are maintained to the present values, the current flowing through the second outer coil 224b is slightly reduced, and that flowing through the second outer coil 224a is largely reduced. As a result, while maintaining the position of the center orbit 54 of the ion beam 50 emitted from the analyzing electromagnet 200, the form of the ion beam can be made close to that which is parallel to the center axis 318. Namely, the form can approach to that shown in FIG. 20.

Also in the case where the form of the ion beam 50 emitted from the analyzing electromagnet 200 is disturbed to that other than that shown in FIG. 21, the correction is performed with the same idea as described above, and the form can approach to that shown in FIG. 20.

In the case where the form of the ion beam 50 emitted from the analyzing electromagnet 200 is disturbed, the following problems mainly arise. According to the control method, it is possible to prevent the problems from arising.

Figure 27:
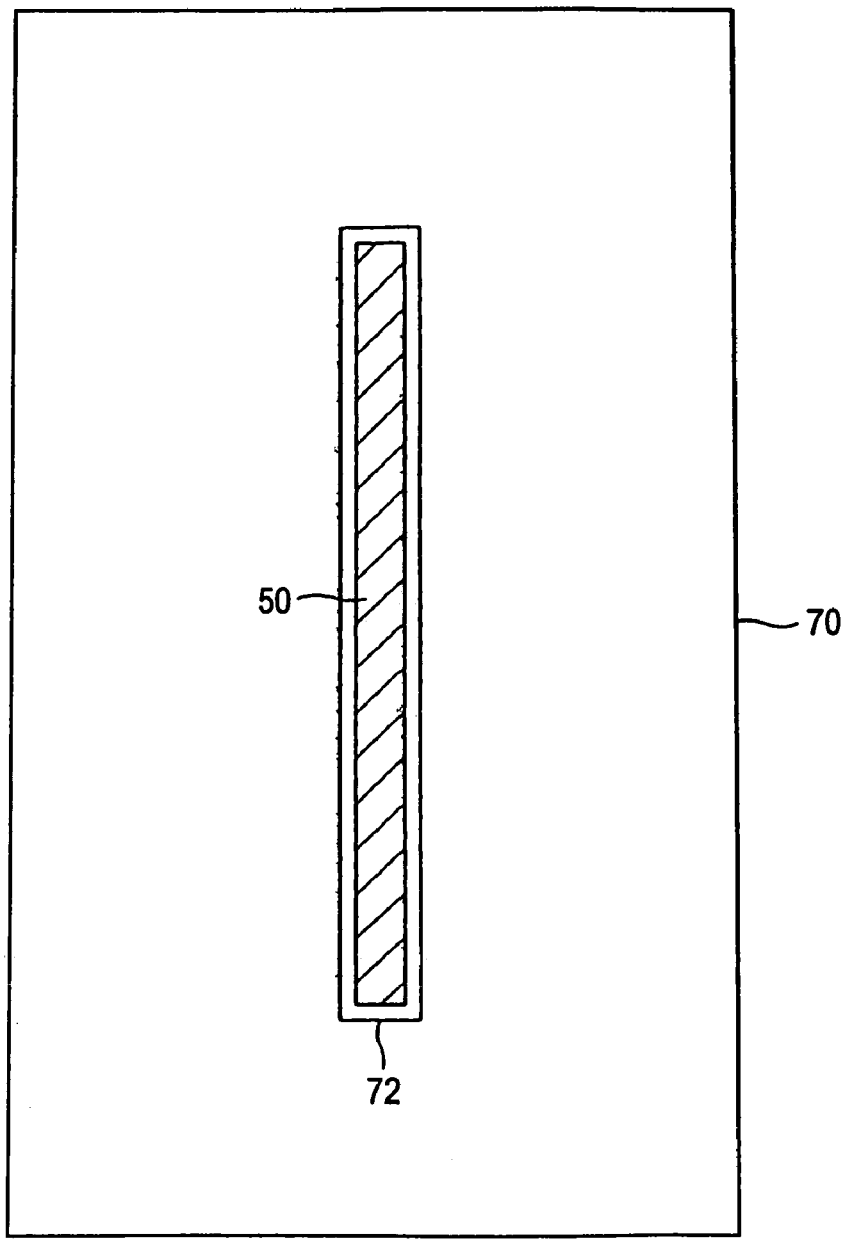
FIG. 27 is a front view showing an example of an analysis slit shown in FIG. 1.

Usually, the analysis slit 70 shown in FIGS. 1 and 27 is disposed in the downstream side of the analyzing electromagnet 200. The slit 72 of the analysis slit 70 is linear. When the form of the ion beam 50 is disturbed, therefore, a portion which is cut by the analysis slit 70 is produced, and the amount of the ion beam 50 of a desired ion species which passes through the analysis slit 70 is reduced. Because the cut portion is produced, the homogenization of the ion beam 50 is impaired. When the X-direction width of the slit 72 is increased in order to prevent such cutting from occurring, the resolution is lowered.

In addition to the above-discussed problems of the analysis slit 70, there arises a problem in that, when the ion implantation is performed on the substrate 60 with using the ion beam 50 in which the form is disturbed, the homogenization of the implantation is impaired.

(2-6) Other Examples of Analyzing Electromagnet 200

Next, other examples of the analyzing electromagnet 200 will be described. The portions which are identical or corresponding to those of the previous example shown in FIGS. 4 to 7 and the like are denoted by the same reference numerals, and duplicated description will be omitted. In the following description, emphasis is placed on differences from the previous example.

Figure 22:
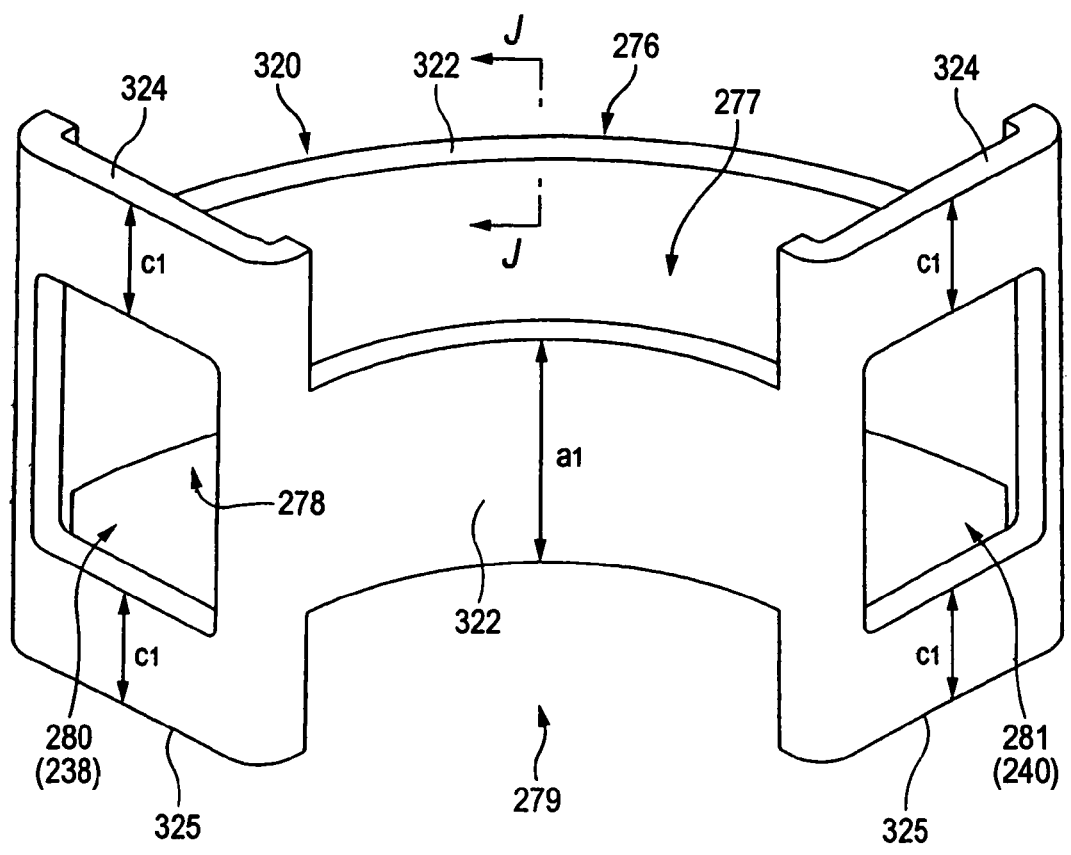
FIG. 22 is a perspective view showing another example of a coil of the analyzing electromagnet.
Figure 24:
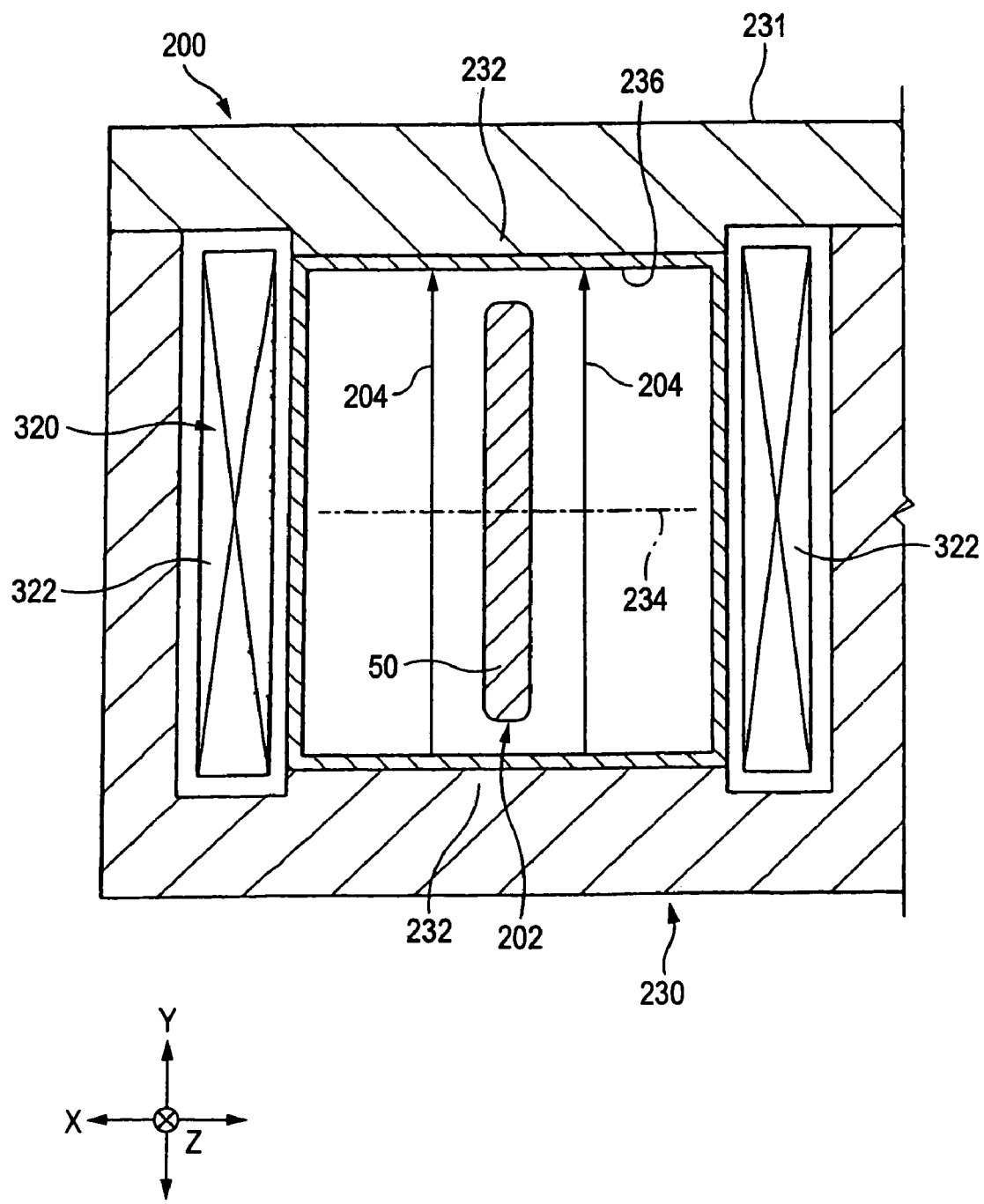
FIG. 24 is a section view showing another example of the analyzing electromagnet and corresponding to FIG. 5.

Also referring to FIG. 22, the analyzing electromagnet 200 shown in FIG. 24 comprises a coil 320 which has: one set of body portions 322 that are opposed to each other in the X direction across the beam path 202; and two sets of connecting portions 324, 325 that connect end portions of the body portions 322 in the Z direction with each other, while avoiding the beam path 202, and which generates a magnetic field that bends the ion beam 50 in the X direction. The two connecting portions 324 which are in the upper side in FIG. 22 are one set of connecting portions, and the two connecting portions 325 which are in the lower side are the other one set of connecting portions.

As seen from FIG. 23 showing the section structure of the coil 320, the coil has the same section structure as the first inner coil 206 (see FIG. 10) and the inner coil 292 (see FIG. 15) of the stacked coil 290. Namely, the coil 320 has a configuration where notched portions 276 to 281 are disposed in a fan-shaped cylindrical stacked coil having the same structure as the inner coil 292 while leaving the body portions 322 and the connecting portions 324, 325. Also the coil 320 can be produced by the same production method as described above.

The coil 320 is configured as one coil in which the above-described first and second inner coils 206, 212 (see FIG. 8) are vertically integrated with each other.

The notched portions 276, 277 are similar in shape to the above-described notched portions 272, 273. The notched portions 278, 279 have a plane-symmetrical shape about a symmetry plane (see FIG. 24) with respect to the notched portions 276, 277. Specifically, the notched portions 280, 281 are through holes, and form the inlet 238 and the outlet 240, respectively, and the ion beam 50 can pass through the notched portions. More specifically, the ion beam 50 can pass therethrough via the vacuum vessel 236.

The vacuum vessel 236 is caused to pass through the coil 320 by inserting the vacuum vessel 236 via the notched portions 280, 281 in the Z direction. In this case, when a flange or the like is disposed on the vacuum vessel 236 and causes a hindrance, the flange or the like is once detached. The analyzing electromagnet 200 may be assembled by a similar method.

The connecting portions 324 are structured in a similar manner as the connecting portions 210 of the first inner coil 206. The connecting portions 325 have a plane-symmetrical shape about the symmetry plane 234 with respect to the respective connecting portions 324.

The Y-direction dimension $a_1$ of the body portions 322 is substantially equal to a total (i.e., $2c_1$) of the Y-direction dimension $c_1$ of the connecting portions 324 and the Y-direction dimension $c_1$ of the connecting portions 325.

Also in the analyzing electromagnet 200 of the example, the coil 320 is configured as one coil in which the above-described first and second Inner coils 206, 212 are integrated with each other. Because of the same reason as described above, therefore, the projection distance of the connecting portions 324, 325 of the coil 320 from the yoke 230 is reduced, thereby attaining effects such as that the analyzing electromagnet 200 can be miniaturized, and that the power consumption can be reduced.

Figure 25:
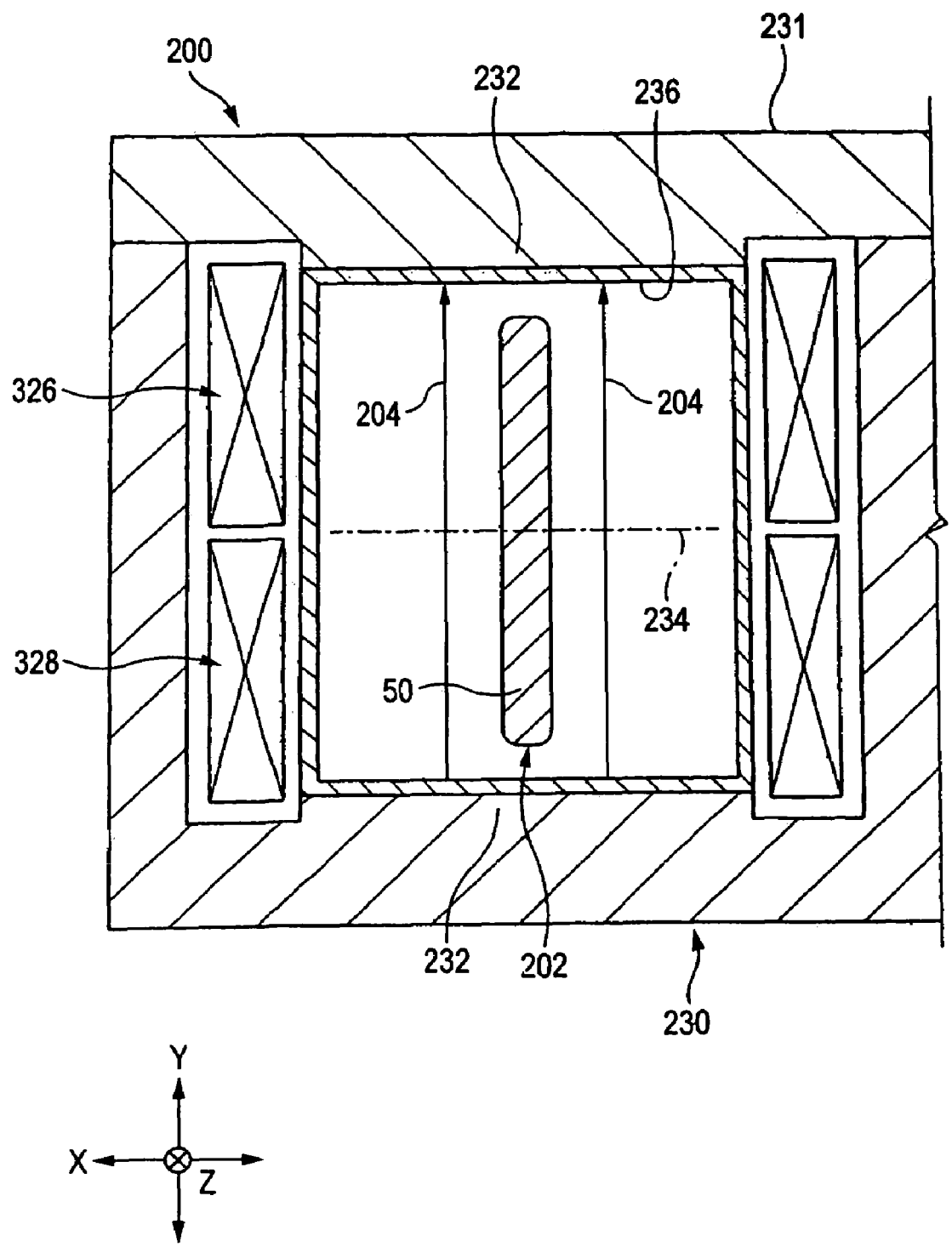
FIG. 25 is a section view showing a further example of the analyzing electromagnet and corresponding to FIG. 5.
Figure 26:
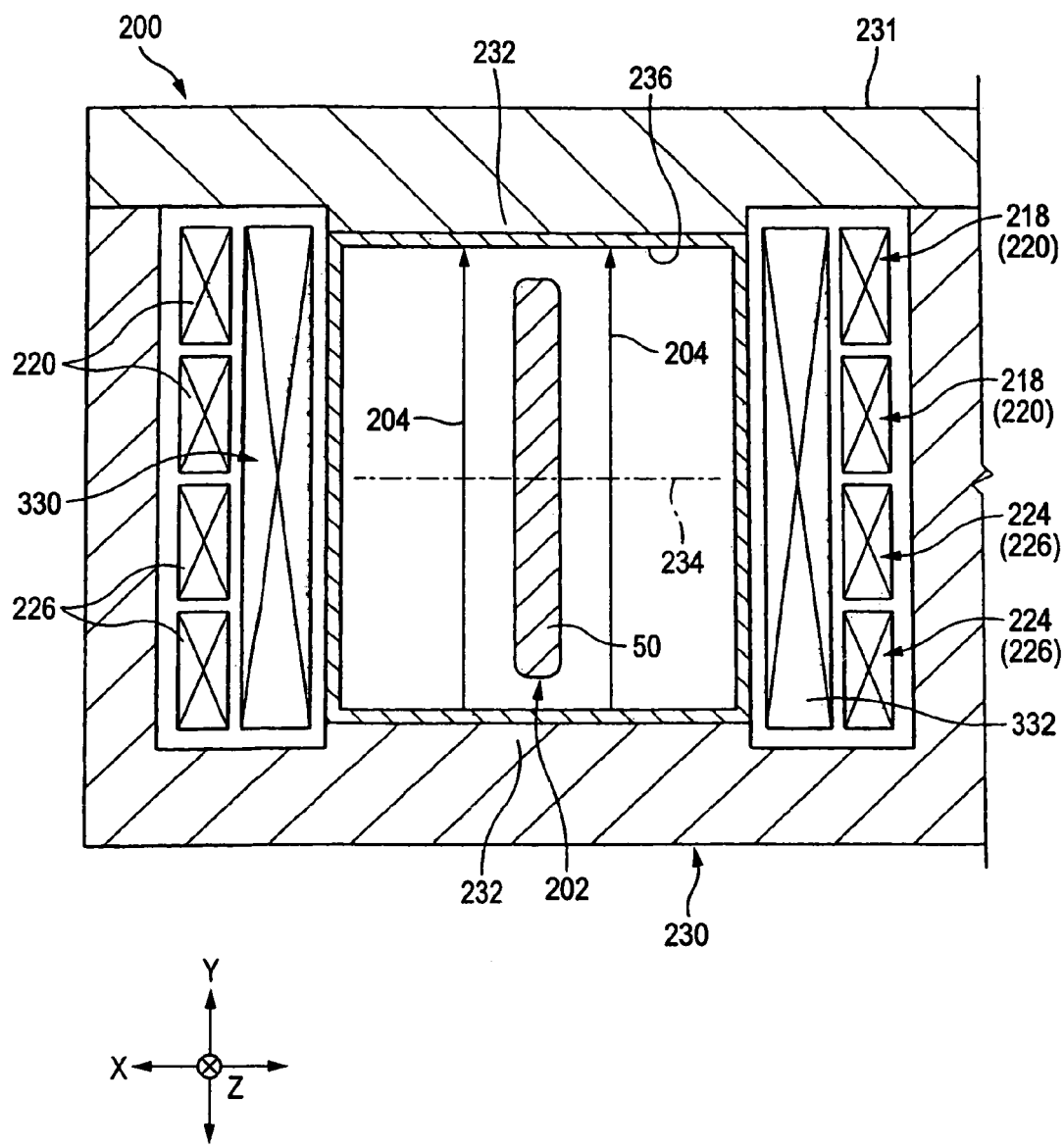
FIG. 26 is a section view showing a still further example of the analyzing electromagnet and corresponding to FIG. 5.

The analyzing electromagnet 200 shown in FIG. 25 comprises the first and second coils 326, 328 that cooperate with each other to generate a magnetic field which bends the ion beam 50 in the X direction. The coils 326, 328 are structured in a similar manner as the first and second inner coils 206, 212 (see FIG. 8), respectively. Therefore, also the first and second coils 326, 328 can be produced by the same production method as described above.

Also in the analyzing electromagnet 200 of the example, the first and second coils 326, 328 are structured in a similar manner as the first and second inner coils 206, 212. Because of the same reason as described above, therefore, the projection distance of the connecting portions of the coils from the yoke 230 is reduced, thereby attaining effects such as that the analyzing electromagnet 200 can be miniaturized, and that the power consumption can be reduced.

Since the analyzing electromagnet comprises the first and second coils 326, 328, it is possible to easily cope with the ion beam 50 having the large Y-direction dimension $W_Y$.

The analyzing electromagnet 200 shown in FIG. 26 comprises: the inner coil 330 that is structured in a similar manner as the coil 320, and that generates a main magnetic field which bends the ion beam 50 in the X direction; and the first and second outer coils 218, 224 that are configured as described above, that are outside the inner coil 330, and that generate a sub-magnetic field which assists or corrects the main magnetic field. Namely, in the place of the first and second inner coils 206, 212 shown in FIG. 5 and the like, the analyzing electromagnet comprises the inner coil 330. Therefore, also the inner coil 330 and the first and second outer coils 218, 224 can be produced by the same production method as described above.

Feature items in the case where these coils are produced will be described. With using the stacked coil 290 (see FIG. 14) in which the axial dimension (height) is set to a desired one, notched portions which are similar to the notched portions 276 to 281 of FIG. 22 are disposed in the inner and outer coils 292, 294 by a cutting process or the like. In the outer coil 294, a gap which is similar to the gap 248 shown in FIG. 7 is disposed by a cutting process or the like, thereby forming the first and second outer coils 218, 224. In a similar manner as the case of FIG. 7, each of the first and second outer coils 218, 224 is configured by plural coils.

In the example shown in FIG. 26, the number of the first outer coils 218 is two. However, the number is not restricted to this. The number is an arbitrary number of one or more. The second outer coils 224 are configured in a similar manner.

Also the analyzing electromagnet 200 of the example comprises the inner coil 330 and first and second outer coils 218, 224 which are configured as described above. Because of the same reason as described above, therefore, the projection distance of the connecting portions of the coils from the yoke 230 is reduced, thereby attaining effects such as that the analyzing electromagnet 200 can be miniaturized, and that the power consumption can be reduced.

The analyzing electromagnet comprises the first and second outer coils 218, 224 which are configured as described above, in addition to the inner coil 330. Therefore, a magnetic field in which the homogenization of the magnetic flux density distribution in the Y direction is high can be generated in the beam path 202 of the ion beam 50. As a result, the disturbance of the form of the ion beam 50 at the emission can be suppressed to a low level. This effect is more remarkable in the case where the Y-direction dimension $W_Y$ of the object ion beam 50 is large.

Because the plural first outer coils 218 and the plural second outer coils 224 are disposed, the magnetic flux density distribution in the Y direction of the magnetic field generated in the beam path 202 can be corrected more finely by theses outer coils 218, 224. Therefore, it is possible to generate a magnetic field in which the homogenization in the Y direction is higher. As a result, the disturbance of the form of the ion beam 50 at the emission can be suppressed to a lower level.

Also in the case where the ion implanter shown in FIG. 1 comprises the analyzing electromagnet 200 of each of the examples, in accordance with the miniaturization of the analyzing electromagnet 200, the whole ion implanter can be miniaturized, and therefore the area required for installing the ion implanter can be reduced. Also the weight of the analyzing electromagnet can be reduced. Moreover, in accordance with the reduction of the power consumption of the analyzing electromagnet 200, the power consumption of the whole ion implanter can be reduced.

(3) About Focus Correction Lenses 600, 610

Referring to FIG. 1, the ion beam 50 has a property that the beam is caused to spread by space charges possessed by the beam itself. Therefore, the position of the focus 56 of the small-current ion beam 50 in which the influence of the space charges can be ignored is largely different from that of the focus 56 of the large-current ion beam 50 in which the influence of the space charges cannot be ignored, by the difference of the manner of spreading the ion beam. Specifically, in the case of the large-current ion beam 50, the focus 56 is moved toward the downstream side as compared with the case of the small-current ion beam 50. This is caused because the spread of the ion beam 50 due to space charges is large.

Even when, for example, the analysis slit 70 is disposed in the focus position at the small-current ion beam, therefore, the focus 56 at the large-current ion beam is deviated from the position of the analysis slit 70 toward the downstream side, and hence the transport efficiency of the ion beam 50 and the resolution are lowered.

In order to solve the problem, preferably, focus correction lenses 600, 610 which perform a correction of making the position of the focus 56 of the ion beam 50 coincident with that of the analysis slit 70, by means of an electrostatic field are disposed in at least one of between the ion source 100 and the analyzing electromagnet 200, and between the analyzing electromagnet 200 and the analysis slit 70. The focus correction lenses 600, 610 belong to the category of an electric field lens (in other words, an electrostatic lens, the same shall apply hereinafter).

In the case where the focus correction lenses are disposed and the level of the beam current of the ion beam 50 generated from the ion source 100 is variable, for example, the analysis slit 70 is preferably disposed in the vicinity of the focus 56 in the case where the beam current is relatively small (for example, at the minimum level of a variable range).

Figure 28:
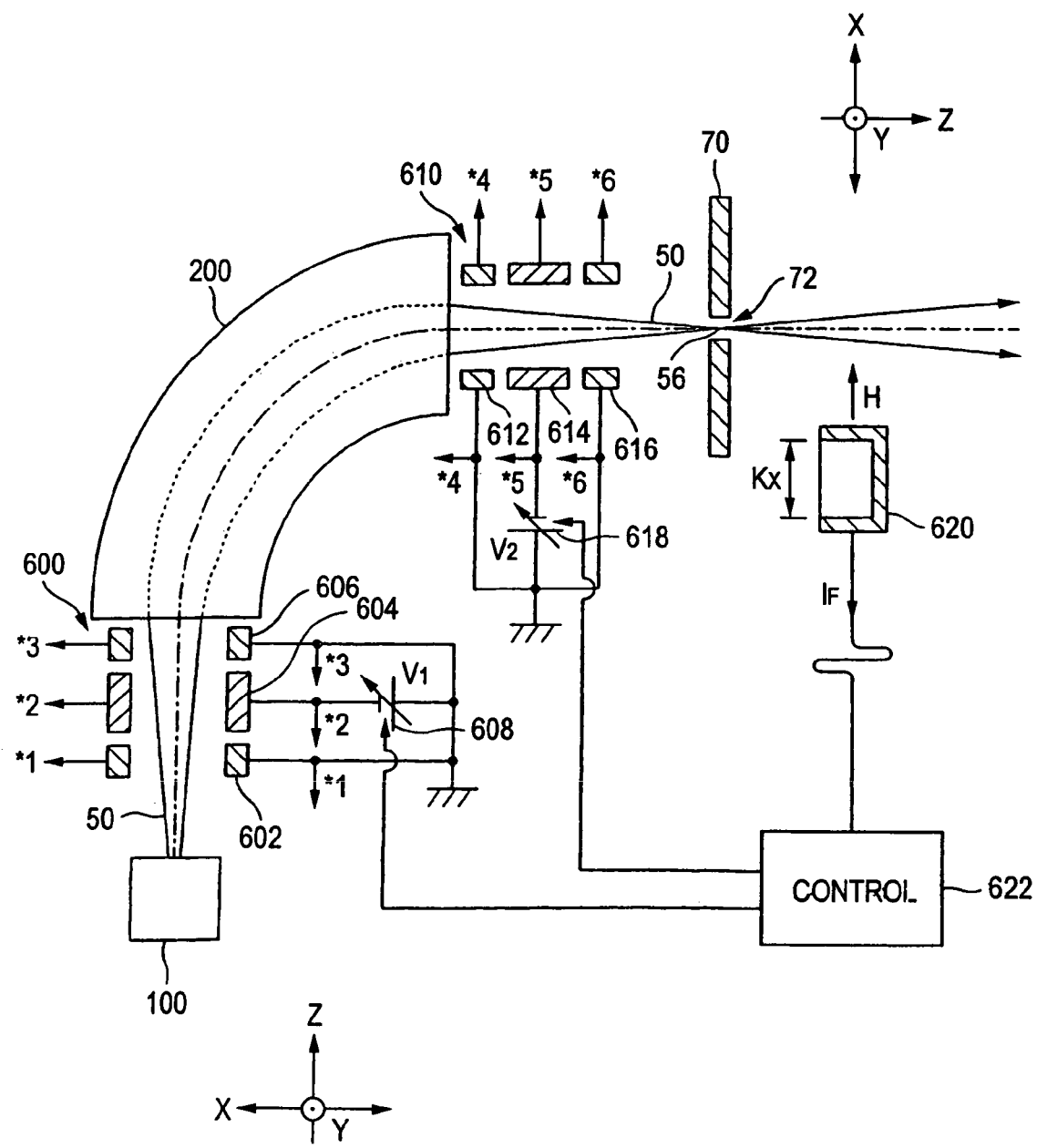
FIG. 28 is a view showing an example of the vicinity of focus correction lenses shown in FIG. 1.

The focus correction lenses 600, 610 will be described in detail with reference to FIGS. 28 to 39. FIGS. 28 and 1 shows an example where the ion implanter comprises the first focus correction lens 600 disposed between the ion source 100 and the analyzing electromagnet 200, and the second focus correction lens 610 disposed between the analyzing electromagnet 200 and the analysis slit 70. Alternatively, only one of the focus correction lenses 600, 610 may be disposed, or both lenses may be disposed and only one of them may be used.

In the case where only one of the focus correction lenses 600, 610 is disposed, or only one of the lenses is used, the correction of making the position of the focus 56 of the ion beam 50 coincident with that of the analysis slit 70 is performed by the focus correction lenses 600, 610. In the case where both the focus correction lenses 600, 610 are disposed and both the focus correction lenses 600, 610 are used, the lenses cooperate with each other to perform the correction of making the position of the focus 56 of the ion beam 50 coincident with that of the analysis slit 70.

Figure 30:
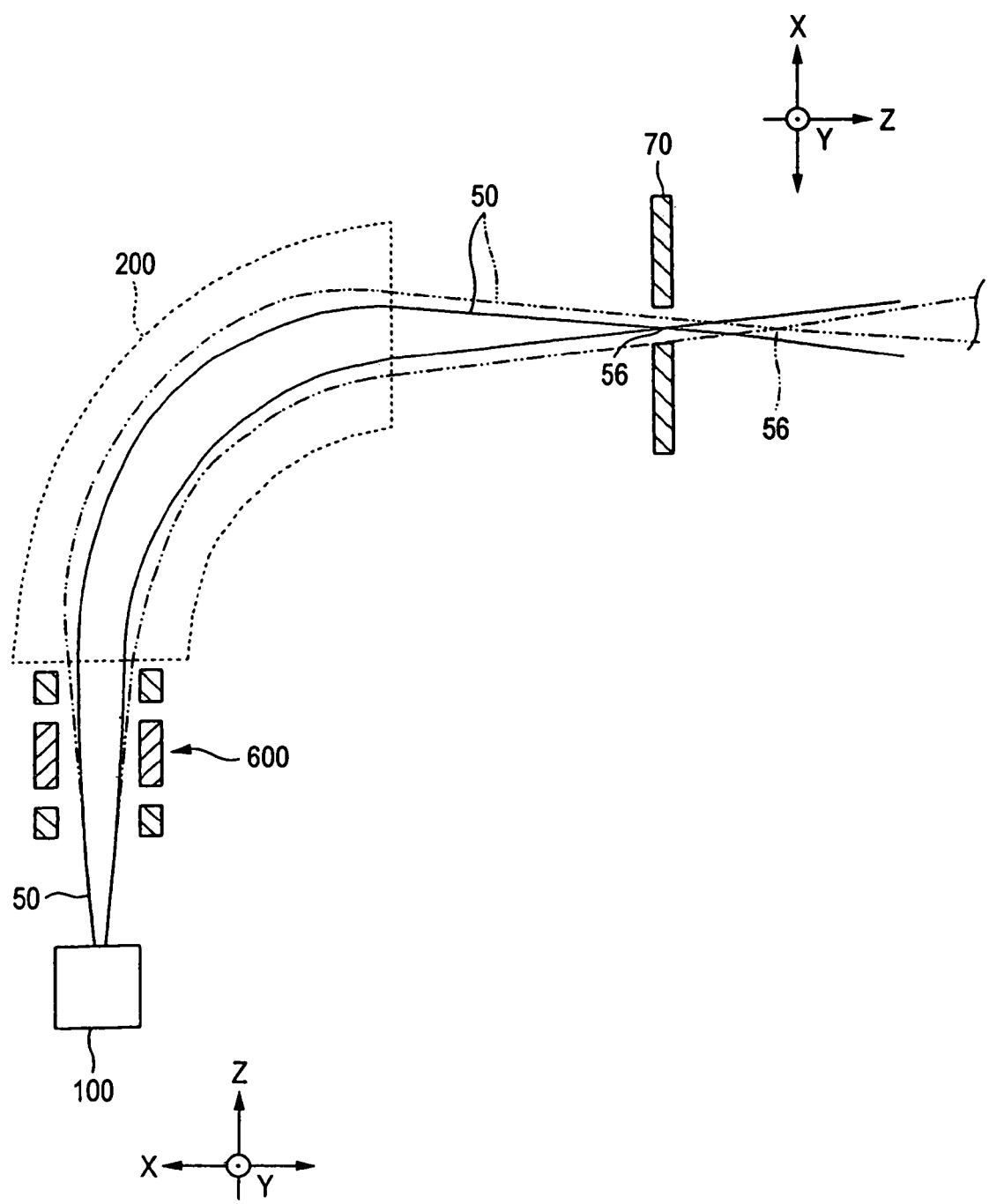
FIG. 30 is a view showing an example of correction of a focus position of the ion beam by a focus correction lens which is disposed on the upstream side of the analyzing electromagnet.
Figure 31:
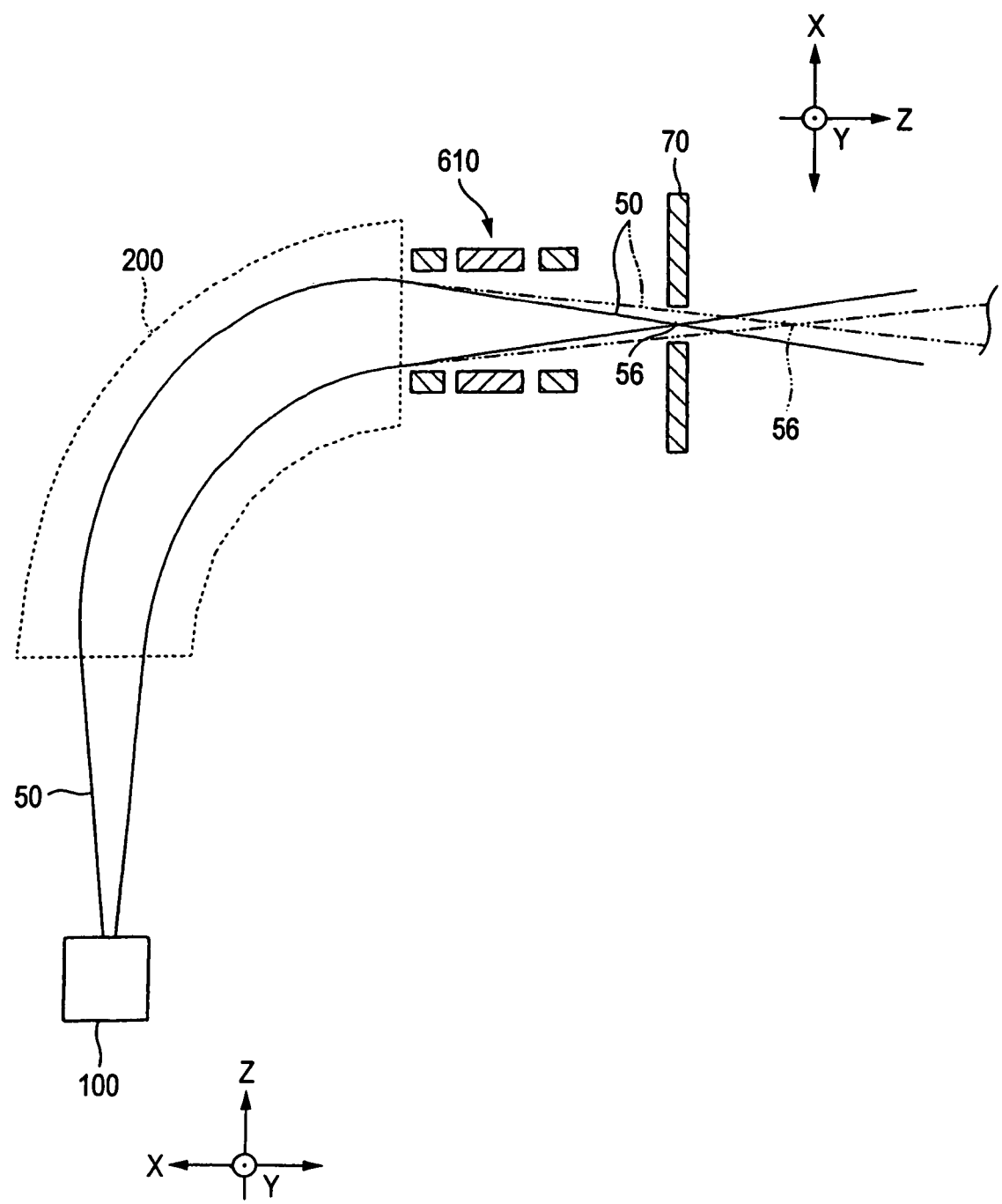
FIG. 31 is a view showing an example of correction of the focus position of the ion beam by a focus correction lens which is disposed on the downstream side of the analyzing electromagnet.
Figure 32:
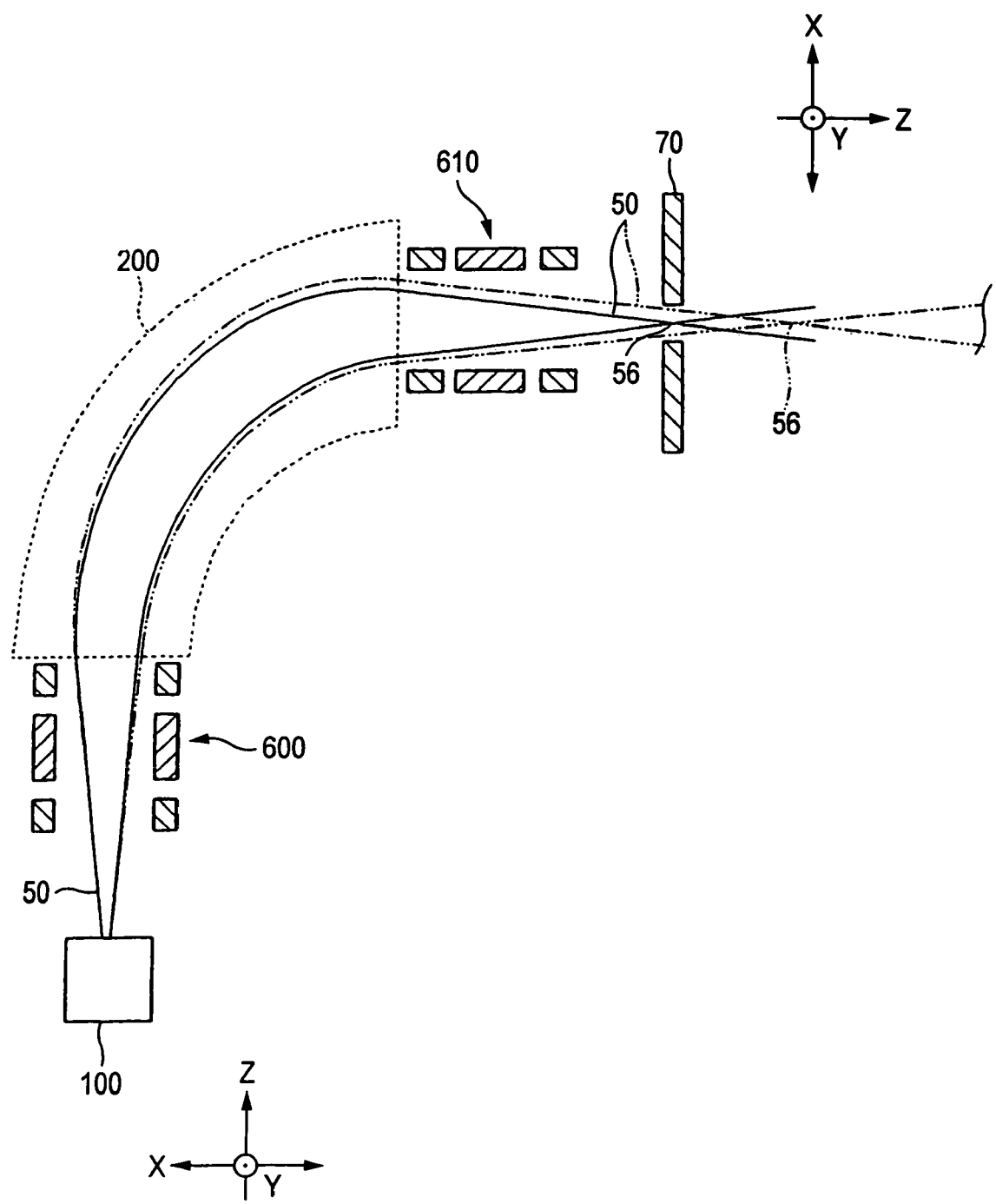
FIG. 32 is a view showing an example of correction of a focus position of the ion beam by focus correction lenses which are disposed on the upstream and downstream sides of the analyzing electromagnet.

FIGS. 30 to 32 show examples of the correction. In the figures, the orbit of the ion beam 50 before the correction is indicated by two-dot chain lines, and that after the correction is indicated by solid lines.

FIG. 30 shows an example where, in the case where, when the correction is not performed, the ion beam 50 is caused to spread in the X direction as indicated by the two-dot chain lines by the influence of space charges and the focus 56 is deviated toward the downstream side with respect to the analysis slit 70, the ion beam 50 is confined in the X direction by the focus correction lens 600 which is on the upstream side of the analyzing electromagnet 200, and the position of the focus 56 is returned toward the upstream side, thereby performing the correction of making the position coincident with the position of the analysis slit 70.

FIG. 31 shows an example where, in the case where, when the correction is not performed, the ion beam 50 spreads in the X direction as indicated by the two-dot chain lines by the influence of space charges, and the focus 56 is deviated toward the downstream side with respect to the analysis slit 70, the ion beam 50 is confined in the X direction by the focus correction lens 610 which is on the downstream side of the analyzing electromagnet 200, and the position of the focus 56 is returned toward the upstream side, thereby performing the correction of making the position coincident with the position of the analysis slit 70.

FIG. 32 shows an example where, in the case where, when the correction is not performed, the ion beam 50 is caused to spread in the X direction as indicated by the two-dot chain lines by the influence of space charges and the focus 56 is deviated toward the downstream side with respect to the analysis slit 70, the ion beam 50 is confined in the X direction in steps of certain degrees by the focus correction lenses 600, 610 which are on the upstream and downstream sides of the analyzing electromagnet 200, and the focus correction lenses 600, 610 cooperate with each other to return the position of the focus 56 toward the upstream side, thereby performing the correction of making the position coincident with the position of the analysis slit 70.

In this way, the correction of making the position of the focus 56 of the ion beam 50 coincident with that of the analysis slit 70 can be performed by the focus correction lenses 600, 610. Therefore, it is possible to prevent the focus 56 of the ion beam 50 from being deviated from the position of the analysis slit 70 by the influence of space charges. As a result, while compensating the influence of space charges, both the transport efficiency of the ion beam 50 and the resolution can be enhanced.

The example of FIG. 30 will be compared with that of FIG. 31. In the case of the example of FIG. 30, before the ion beam 50 spreads and impinges on a wall and the like in the analyzing electromagnet 200 to be lost, the ion beam 50 can be confined by the focus correction lens 600, and hence there is an advantage that the transport efficiency of the ion beam 50 can be easily enhanced. In the case where one of the focus correction lenses 600, 610 is used (disposed), therefore, the focus correction lens 600 is preferable. When the ion beam 50 is excessively confined by the focus correction lens 600, however, the current density of the ion beam 50 is large, and the space charge effect is increased, and consequently there is a case where the ion beam 50 easily spreads. Therefore, special attention is required.

To comply with the above, as in the example of FIG. 32, the ion beam 50 may be confined while being shared by both the focus correction lenses 600, 610. Namely, the ion beam 50 may be confined to a certain degree by the focus correction lens 600 in the upstream side (specifically, to a degree at which the ion beam 50 can efficiently pass through the analyzing electromagnet 200), and the ion beam 50 may be finally confined by the focus correction lens 610 in the downstream side. When both the focus correction lenses 600, 610 are disposed and used, the focus position of the ion beam 50 can be corrected easily and surely, and the transport efficiency of the ion beam 50 can be enhanced. Therefore, the effect that, while compensating the influence of space charges, both the transport efficiency of the ion beam 50 and the resolution can be enhanced is more remarkable.

A specific example of the configuration of the focus correction lenses 600, 610 will be described.

As shown in FIG. 28, the focus correction lens 600 has an inlet electrode 602, intermediate electrode 604, and outlet electrode 606 which are arranged in the traveling direction Z of the ion beam 50 while forming gaps therebetween. As in an example of FIG. 29, the electrodes 602, 604, 606 have pairs of electrodes 602a and 602b, 604a and 604b, 606a and 606b that are opposed to each other in the X direction across the gap through which the ion beam 50 passes, and that are substantially parallel to the principal face 52 of the ion beam 50, respectively. The electrodes 602a, 602b, 604a, 604b, 606a, 606b are placed substantially perpendicular to the traveling direction Z of the ion beam 50. The electrodes 602a and 602b, 604a and 604b, 606a and 606b are electrically connected to each other through a conductor, or electrically conductive to each other, respectively.

Referring to FIG. 28, the inlet and outlet electrodes 602, 606 (specifically, the electrodes 602a and 602b, 606a and 606b constituting the electrodes) are maintained to the same potential. In the example, the electrodes are maintained to the ground level. According to the configuration, it is possible to prevent the electric field from protruding from the focus correction lens 600 to the upstream and downstream sides in the Z direction of the ion beam 50. Therefore, it is possible to prevent the protrusion of the electric field from adversely affecting the ion beam 50 and the like.

The intermediate electrode 604 (specifically, the electrodes 604a and 604b constituting the electrode) is connected to a DC power source 608 which applies a negative or positive (in the example shown in FIG. 28, negative) DC voltage $V_1$ to the electrode. The potential (in the example, the potential with respect to the ground potential) of the intermediate electrode 604 is maintained by the DC voltage $V_1$ to a potential which is different from the potentials of the inlet and outlet electrodes 602, 606, and which causes the focus 56 of the ion beam 50 to coincide with the position of the analysis slit 70. This is applicable also to a DC voltage $V_2$ which will be described later.

In the focus correction lens 600, the inlet and outlet electrodes 602, 606 are maintained to the same potential, and the intermediate electrode 604 is maintained to a potential which is different from the potentials of the inlet and outlet electrodes 602, 606. Therefore, the focus correction lens functions as a unipotential lens to confine the ion beam 50. Therefore, the ion beam 50 can be confined in the X direction without changing the energy of the ion beam 50.

Alternatively, the polarity of the DC power source 608 may be inverted, and a positive DC voltage $V_1$ may be applied to the intermediate electrode 604 of the focus correction lens 600. Also in the alternative, the focus correction lens 600 functions as a unipotential lens, and can confine the ion beam 50 in the X direction without changing the energy of the ion beam. When the positive DC voltage $V_1$ is applied, electrons in a drift space which is free from an electric field are attracted to the intermediate electrode 604, and the quantity of electrons in the drift space is reduced so that divergence of the ion beam 50 due to the space charge effect is enhanced. By contrast, in the case of the negative DC voltage $V_1$, such a phenomenon can be prevented from occurring. Therefore, it is preferable to apply the negative DC voltage $V_1$ as in the example shown in FIG. 28. This is applicable also to the DC voltage $V_2$ which will be described later.

As the absolute value (level) of the DC voltage $V_1$ which is applied from the DC power source 608 to the intermediate electrode 604 is larger, the ion beam 50 can be confined more strongly. The degree of confining the ion beam 50 depends on the energy of the ion beam 50 when the beam passes through the focus correction lens 600. As the energy of the ion beam 50 is higher, the deflecting function which is applied to the ion beam 50 by the DC voltage $V_1$ is smaller. In order to strongly confine the ion beam 50, therefore, the absolute value of the DC voltage $V_1$ is increased.

Figure 29:
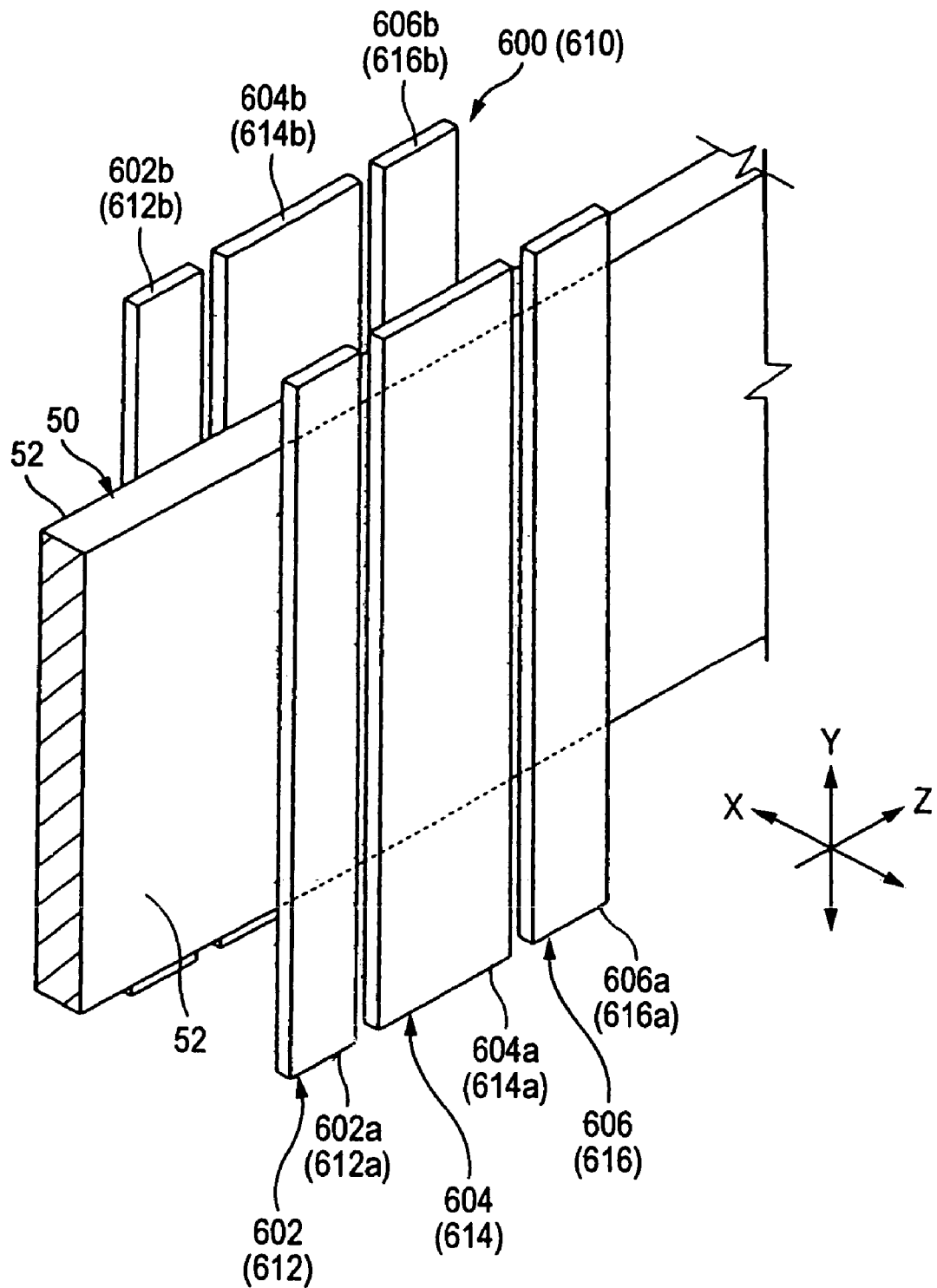
FIG. 29 is a perspective view showing an example of the focus correction lenses.

Also referring to FIG. 29, the focus correction lens 610 has an inlet electrode 612 (a pair of electrodes 612a, 612b), intermediate electrode 614 (a pair of electrodes 614a, 614b), and outlet electrode 616 (a pair of electrodes 616a, 616b) which are configured in a similar manner as the inlet electrode 602 (the pair of electrodes 602a, 602b), intermediate electrode 604 (the pair of electrodes 604a, 604b), and outlet electrode 606 (the pair of electrodes 606a, 606b) of the focus correction lens 600, respectively. The intermediate electrode 614 is connected to a DC power source 618 which is similar to the DC power source 608. The DC power source 618 applies the negative or positive (in the example shown in FIG. 28, negative) DC voltage $V_2$ to the intermediate electrode 614. The configuration and function of the focus correction lens 610 and the DC power source 618 are similar to those of the focus correction lens 600 and the DC power source 608. Therefore, the above description is referred, and duplicated description will be omitted.

In the case where the focus correction lenses 600, 610 have the configuration of a unipotential lens as described above, the focus correction lenses 600, 610 perform only the function of confining the ion beam 50. When the analysis slit 70 is disposed in the vicinity of the focus 56 in the case where the beam current is relatively small as described above, the movement of the focus 56 to the downstream side of the analysis slit 70 in the case where the beam current is relatively large is adequately prevented from occurring, by the confining function of the focus correction lenses 600, 610. As a result, it is possible to adequately cope with also the case where the beam current of the ion beam 50 is changed in level, and the focus 56 of the ion beam 50 can be prevented from being deviated from the position of the analysis slit 70.

Results of a simulation in which the focus position of the ion beam 50 is corrected with using the focus correction lens 600 on the upstream side of the analyzing electromagnet 200 will be described. Mass separation was conducted under the following conditions while the ion beam 50 which contains $As^+$, and in which the energy is 13.5 keV and the beam current is 30 mA impinged from the ion source 100 on the analyzing electromagnet 200.

(A) Case where Space Charge Neutralization Rate of Ion Beam 50 is 100%

Figure 33:
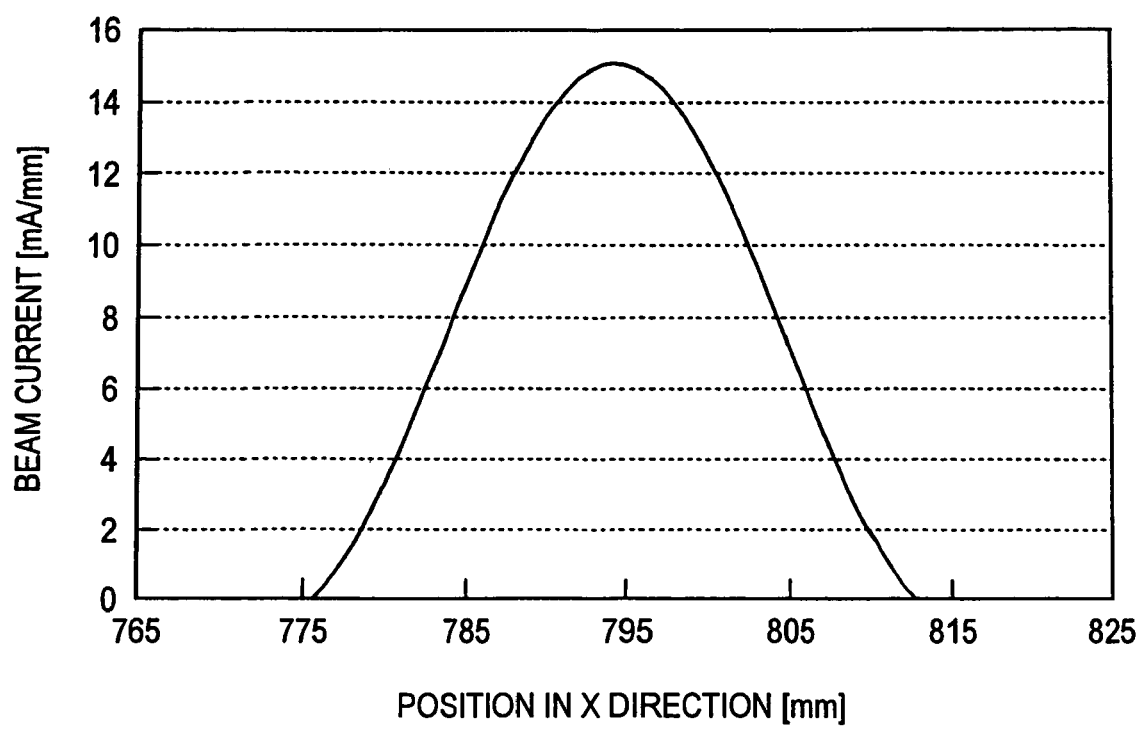
FIG. 33 is a schematic view showing an example of a beam current distribution of an ion beam in a position separated by 640 mm from an outlet of the analyzing electromagnet, in the case where space charges of the ion beam is not completely neutralized.

In this case, space charges exert no influence on the ion beam 50. Therefore, this is identical with the case of the small-current ion beam. At this time, the focus 56 of the ion beam 50 was formed in a position which is separated by about 640 mm on the downstream side from the outlet portion of the analyzing electromagnet 200. Although the analysis slit 70 is not disposed in this simulation, the analysis slit 70 will be disposed in the position of 640 mm in an actual ion implanter. An example of the beam current distribution of the ion beam 50 in the X direction is shown in FIG. 33. In the figure, the ordinate indicates an accumulated value of the Y-direction current per 1 mm in the X direction. Namely, since the ion beam 50 has a ribbon-like shape which is elongated in the Y direction, the ordinate indicates a current value which is obtained by accumulating the Y-direction current per 1 mm in the X direction of the beam. Briefly speaking, the figure corresponds to the current density distribution in the X direction. This is applicable also to the ordinates of FIGS. 34 and 35.

In this case, the half-value width of the beam current is about 22 mm, and the resolution $m/\Delta m$ of the mass spectrometry by the analyzing electromagnet 200 is about 27.3.

Figure 34:
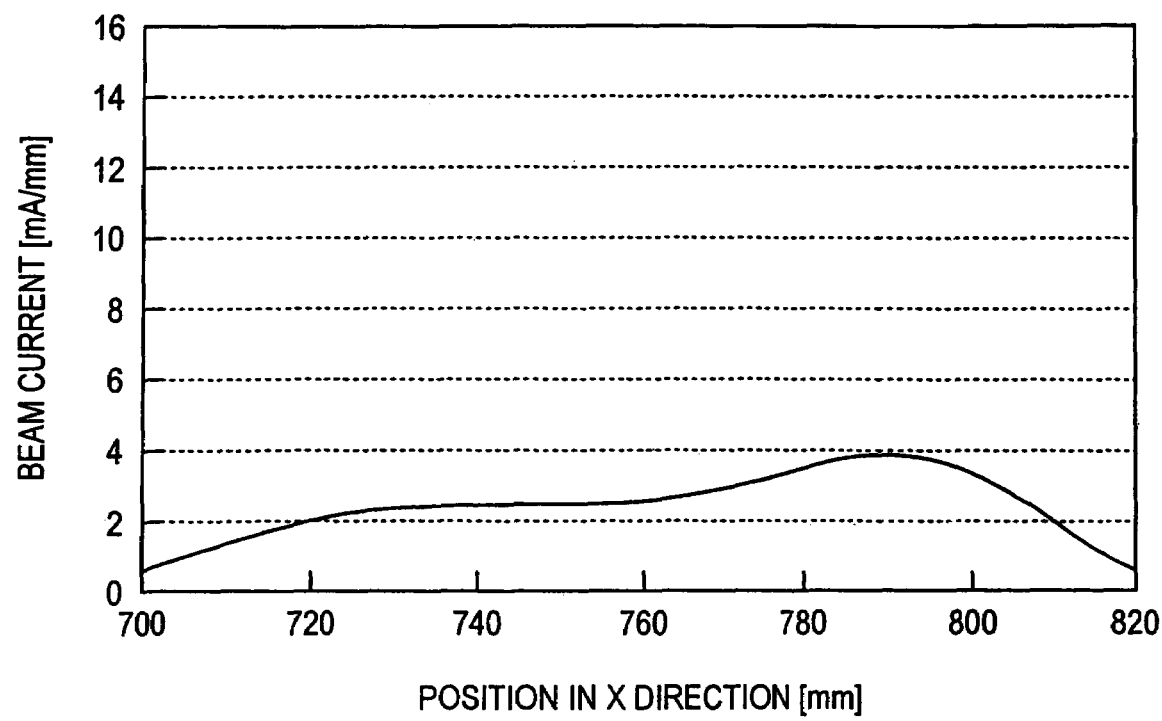
FIG. 34 is a schematic view showing an example of the beam current distribution of the ion beam in the position separated by 640 mm from the outlet of the analyzing electromagnet, in the case where space charges of the ion beam is not completely neutralized.

(B) Case where Space Charge Neutralization Rate of Ion Beam 50 is 95% and Focus Correction Lens 600 is not Operated In this Case, the Ion Beam 50 is Caused to Spread by an influence of space charges. Therefore, this is identical with the case of the large-current ion beam. At this time, the focus 56 of the ion beam 50 was formed in a position which is separated by about 1,300 mm on the downstream side from the outlet portion of the analyzing electromagnet 200. An example of the beam current distribution of the ion beam 50 in the X direction is shown in FIG. 34.

In this case, the half-value width of the beam current is about 95 mm, and the resolution $m/\Delta m$ of the mass spectrometry by the analyzing electromagnet 200 is about 7-1.

(C) Case where Space Charge Neutralization Rate of Ion Beam 50 is 95% and Focus Position Correction is Performed by Focus Correction Lens 600

Figure 35:
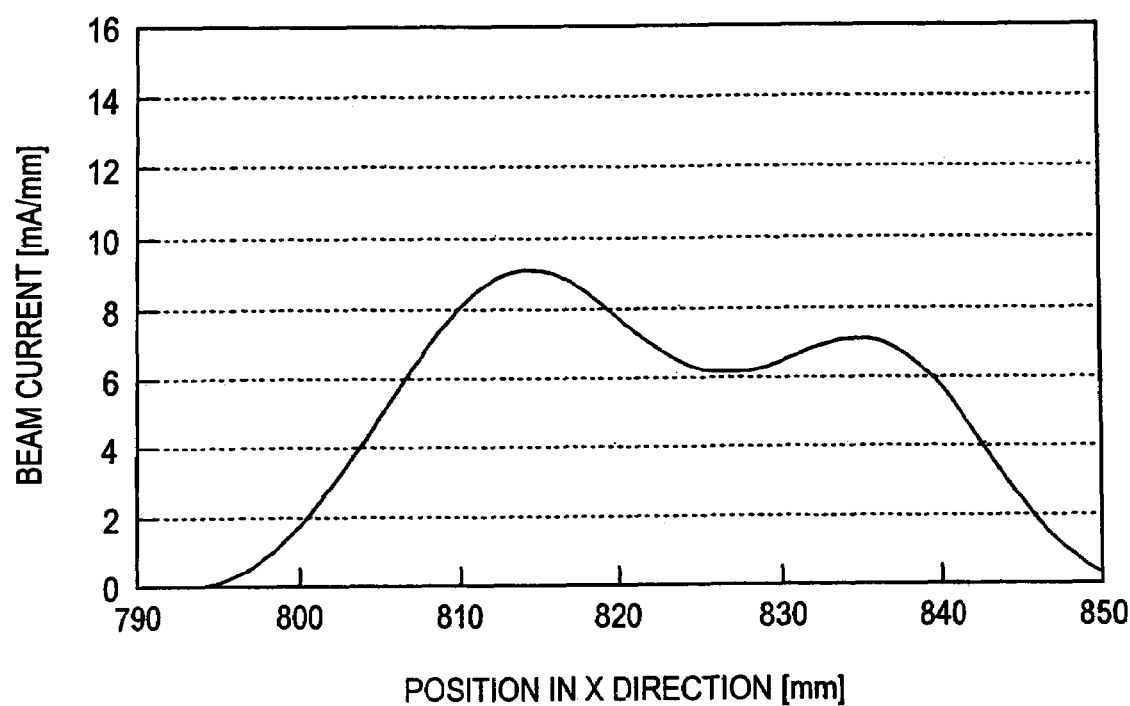
FIG. 35 is a schematic view showing an example of the beam current distribution of the ion beam in the position separated by 640 mm from the outlet of the analyzing electromagnet, in the case where the focus position of the ion beam is corrected by the focus correction lens when space charges of the ion beam is not completely neutralized.

In this case, the DC voltage $V_1$ which is applied to the intermediate electrode 604 of the focus correction lens 600 was adjusted so that the focus 56 of the ion beam 50 is formed in a position which is separated by about 640 mm on the downstream side from the outlet portion of the analyzing electromagnet 200. At this time, the DC voltage $V_1$ was −10 kV. An example of the beam current distribution of the ion beam 50 in the X direction in a position of 640 mm is shown in FIG. 35.

In this case, the half-value width of the beam current is about 42 mm, and the resolution $m/\Delta m$ of the mass spectrometry by the analyzing electromagnet 200 is about 16. As compared with the case of (B) above, the resolution is improved by twice or more times.

Next, the control of the DC voltages $V_1$ and $V_2$ which are applied to the focus correction lenses 600, 610 will be described.

As shown in the example of FIG. 28, for example, a first beam current measuring device 620 which is mobile, and which receives the ion beam 50 passed through the analysis slit 70 to measure the beam current $I_F$ is moved as indicated by the arrow H, and inserted into the path of the ion beam 50 which is on the downstream side of the analysis slit 70. For example, the beam current measuring device 620 is a Faraday cup. Preferably, the beam current measuring device 620 has a width $K_X$ on which the whole ion beam 50 passed through the analysis slit 70 impinges in the X direction. With respect to the Y direction, in the case where the ion beam 50 has a ribbon-like shape, one beam current measuring device 620 may be used when the measurement is to be performed on one point in the Y direction. When the measurement is to be performed on many points in the Y direction, the beam current measuring device 620 may be a multipoint beam current measuring device in which plural measuring devices (for example, Faraday cups) are juxtaposed in the Y direction, or have a structure for moving one beam current measuring device 620 in the Y direction.

Then, the DC voltages $V_1$, $V_2$ which are output from the DC power sources 608, 618 are adjusted so that the beam current $I_F$ measured by the beam current measuring device 620 is maximum. Namely, the DC voltage $V_1$ is adjusted in the case where the focus correction lens 600 is used, the DC voltage $V_2$ is adjusted in the case where the focus correction lens 610 is used, and the DC voltages $V_1$, $V_2$ are adjusted in the case where the focus correction lenses 600, 610 are used. Specifically, as described above, the DC voltages $V_1$, $V_2$ may be negative or positive, and hence their absolute values $|V_1|$ and $|V_2|$ are adjusted. Then, the DC voltages $V_1$, $V_2$ at which the beam current $I_F$ is maximum are maintained.

Figure 36:
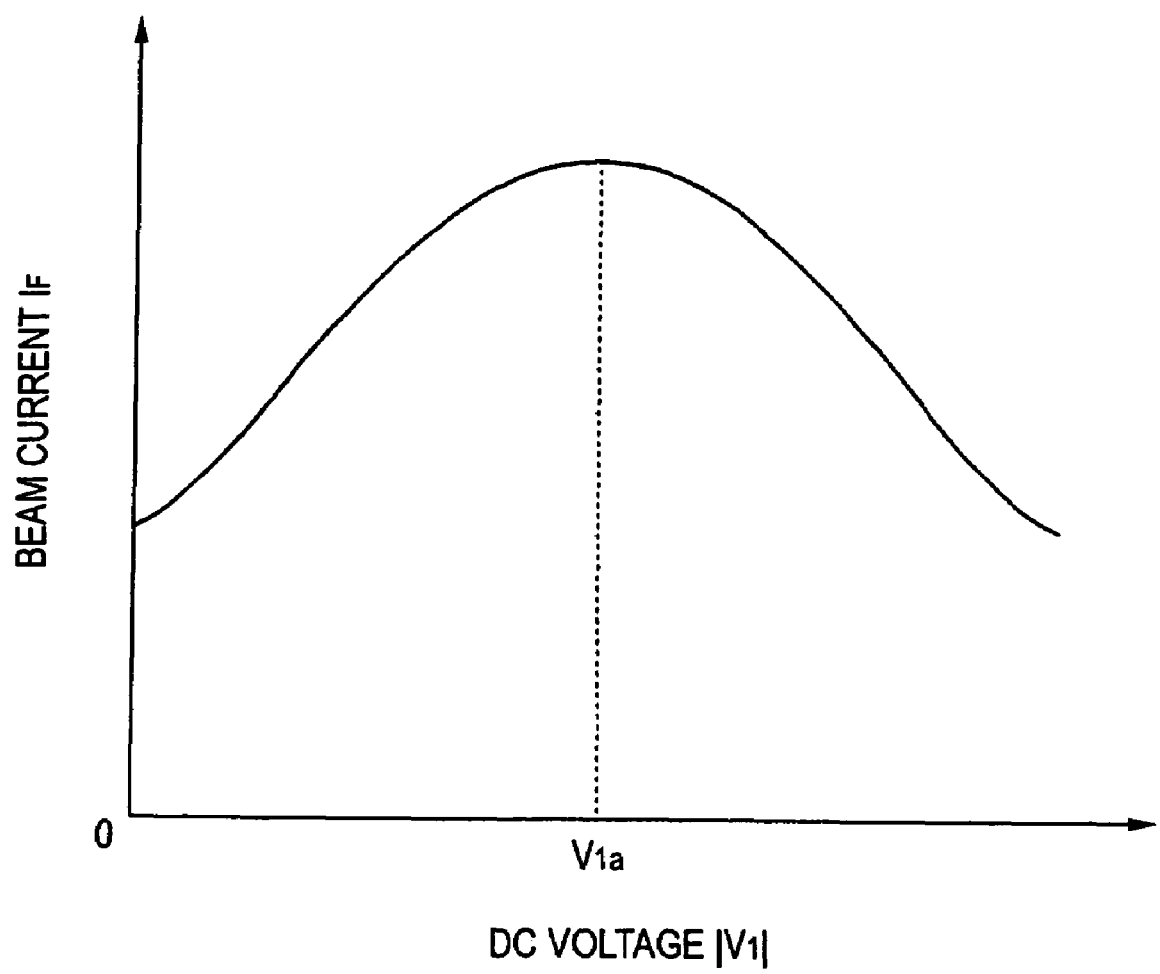
FIG. 36 is a schematic view showing an example of relationships between a DC voltage applied to an intermediate electrode of the focus correction lens, and a beam current measured by a first beam current measuring device.

FIG. 36 shows an example of the change of the beam current $I_F$ in the case where the absolute value $|V_1|$ of the DC voltage $V_1$ is adjusted. This curve is obtained because, when the position of the focus 56 of the ion beam 50 coincides with the analysis slit 70, the quantity of the ion beam 50 passed through the analysis slit 70 is maximum. In this example, a voltage Via at which the maximum beam current $I_F$ is obtained is maintained. Also in the case where the absolute value $|V_2|$ of the DC voltage $V_2$ is adjusted, a curve similar to the above curve is obtained.

Figure 37:
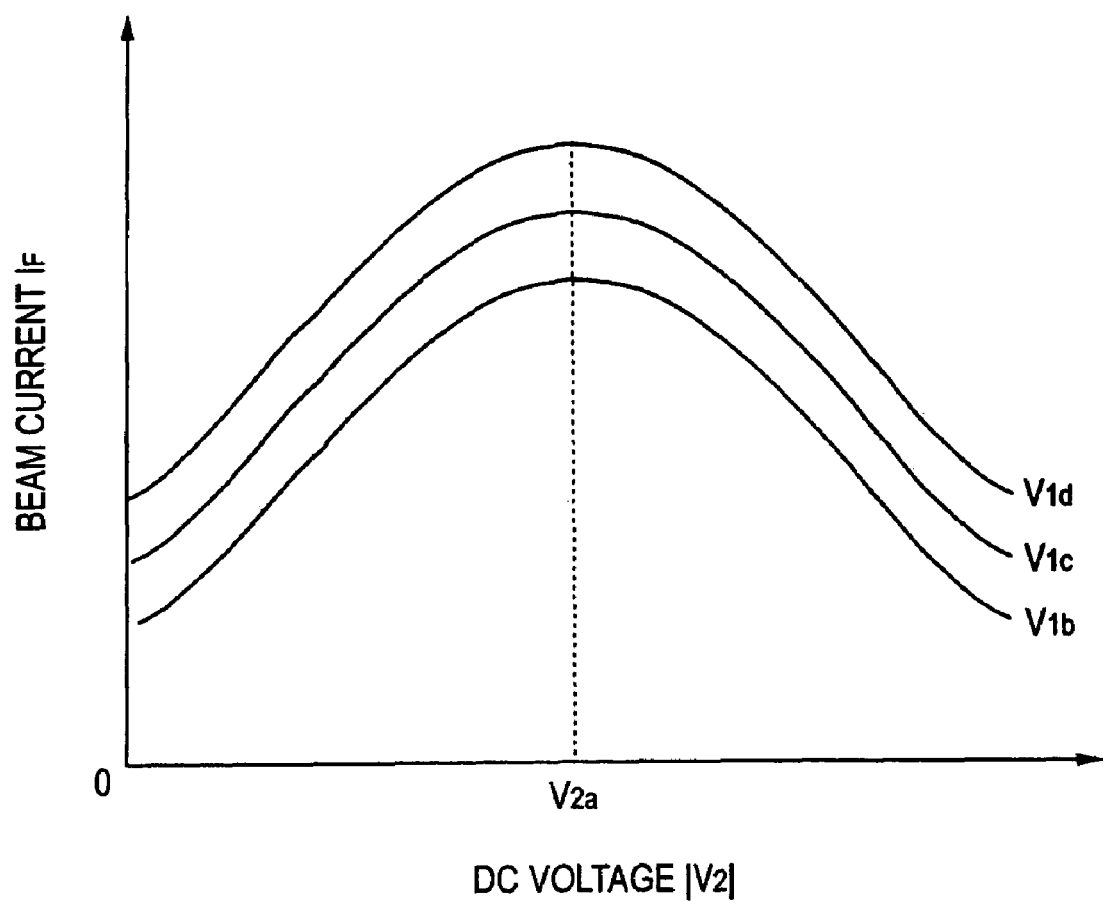
FIG. 37 is a schematic view showing another example of relationships between the DC voltage applied to the intermediate electrode of the focus correction lens, and the beam current measured by the first beam current measuring device.

FIG. 37 shows an example of the change of the beam current $I_F$ in the case where the absolute values of the DC voltages $V_1$, $V_2$ are adjusted. In this example, while plural absolute values $V_{1b}$, $V_{1c}$, $V_{1d}$ (however, the absolute values are not restricted to these three values) of the DC voltage $V_1$ are used as parameters, the absolute value $|V_2|$ of the DC voltage $V_2$ is changed. Therefore, the DC voltages $V_1$, $V_2$ at which the beam current $I_F$ is maximum can be obtained. In this example, voltages $V_{1d}$ and $V_{2a}$ at which the maximum beam current $I_F$ is obtained is maintained. By contrast to the case of FIG. 37, while plural absolute values of the DC voltage $V_2$ are used as parameters, the absolute value of the DC voltage $V_1$ may be changed.

According to the adjusting method, when the position of the focus 56 of the ion beam 50 coincides with the analysis slit 70, the beam current $I_F$ is maximum. Therefore, the correction in which the focus position of the ion beam 50 is made coincident with the analysis slit 70 by the focus correction lenses 600, 610 can be easily performed.

The ion implanter may further comprises a first focus controlling device 622 (see FIG. 28) which controls the DC voltages $V_1$, $V_2$ (specifically, their absolute values $|V_1|$ and $|V_2|$) output from the DC power sources 608, 618 by control contents similar to the above-described adjusting method so that the beam current $I_F$ measured by the beam current measuring device 620 is maximum. According to the configuration, the correction of making the focus position of the ion beam 50 coincident with the analysis slit 70 can be performed in a power saving manner.

Figure 38:
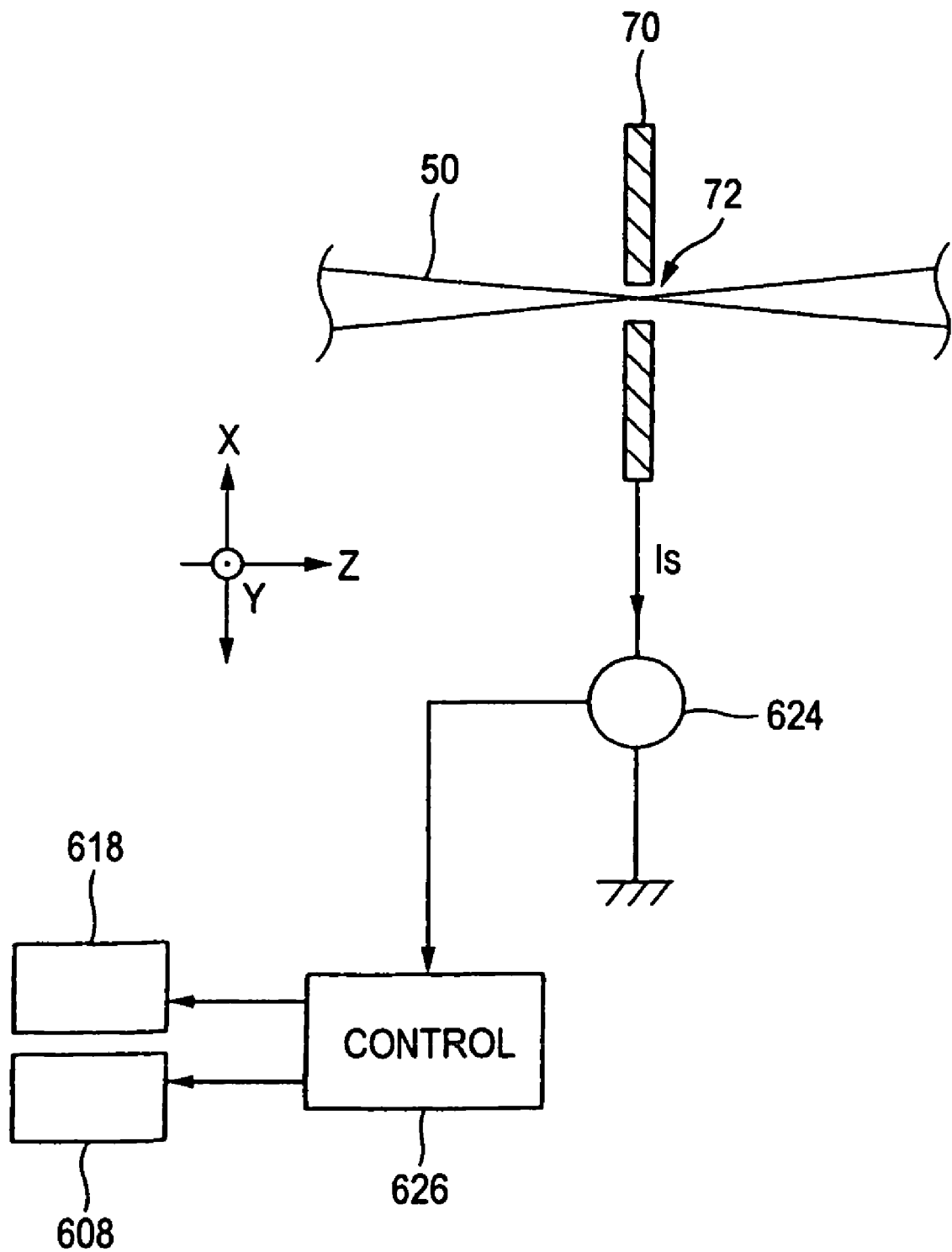
FIG. 38 is a view partly showing an example of the vicinity of a second beam current measuring device which measures a beam current flowing through the analysis slit.

As shown in an example of FIG. 38, a second beam current measuring device 624 which measures a beam current $I_S$ flowing through the analysis slit 70 is used, and the DC voltages $V_1$, $V_2$ (specifically, their absolute values $|V_1|$ and $|V_2|$) output from the DC power sources 608, 618 are adjusted so that the beam current $I_S$ measured by the beam current measuring device 624 is minimum. In this case, the analysis slit 70 is electrically insulated from structures such as the vacuum vessel, and grounded via the beam current measuring device 624. Examples in which the DC voltages $V_1$, $V_2$ are separately or combinedly used are identical with the above-described examples.

Figure 39:
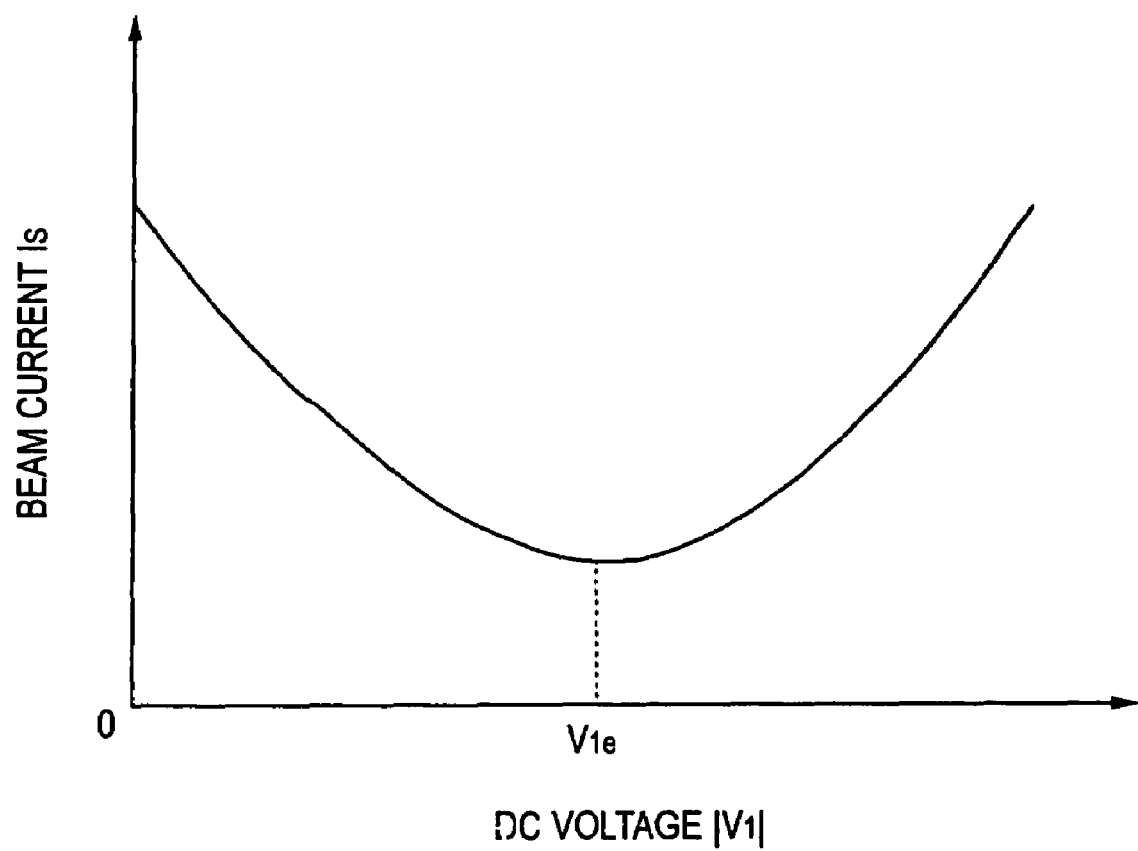
FIG. 39 is a schematic view showing an example of relationships between the DC voltage applied to the intermediate electrode of the focus correction lens, and a beam current measured by a second beam current measuring device.

FIG. 39 shows an example of the change of the beam current $I_S$ in the case where the absolute value $|V_1|$ of the DC voltage $V_1$ is adjusted. This curve is obtained because, when the position of the focus 56 of the ion beam 50 coincides with the analysis slit 70, the quantity of the ion beam 50 impinging on the analysis slit 70 is minimum In this example, a voltage $V_{1e}$ at which the minimum beam current $I_S$ is obtained is maintained. Also in the case where the absolute value $|V_2|$ of the DC voltage $V_2$ is adjusted, a curve similar to the above curve is obtained.

In the case where one of the DC voltages $V_1$, $V_2$ is used as a parameter and the other is changed, a curve similar to that in which the curve of FIG. 37 is valley-inverted is obtained.

According to the adjusting method, when the position of the focus 56 of the ion beam 50 coincides with the analysis slit 70, the measured beam current $I_S$ is minimum. Therefore, the correction in which the focus position of the ion beam 50 is made coincident with the analysis slit 70 by the focus correction lenses 600, 610 can be easily performed.

The ion implanter may further comprise a second focus controlling device 626 (see FIG. 38) which controls the DC voltages $V_1$, $V_2$ (specifically, their absolute values $|V_1|$ and $|V_2|$) output from the DC power sources 608, 618 by control contents similar to the above-described adjusting method so that the beam current $I_S$ measured by the beam current measuring device 624 is minimum. According to the configuration, the correction of making the focus position of the ion beam 50 coincident with the analysis slit 70 can be performed in a power saving manner.

(4) About Accelerating/Decelerating Device 400

The accelerating/decelerating device 400 shown in FIG. 1 deflects the ion beam 50 passed through the analysis slit 70, in the X direction by means of an electrostatic field, and accelerates or decelerates the ion beam 50 by means of the electrostatic field. Preferably, the accelerating/decelerating device 400 is disposed on the downstream side as far as possible in order that an effect of suppressing energy contamination which will be described later is effectively exerted. In the example shown in FIG. 1, the device is disposed between the analysis slit 70 and the implanting position, i.e., between the analysis slit 70 and the substrate driving device 500.

When the accelerating/decelerating device 400 is provided, the accelerating/decelerating device 400 can perform not only acceleration/deceleration of the ion beam 50, but also deflection of the ion beam 50 in the X direction. Therefore, the ion beam 50 of a desired energy can be selectively derived, and energy contamination (mixture of unwanted energy ions) can be suppressed. Moreover, these can be realized by the single accelerating/decelerating device 400. As compared with the case where an energy analyzer is separately disposed, therefore, the transportation path of the ion beam 50 can be shortened. Accordingly, the transport efficiency of the ion beam 50 can be improved. In the case where the ion beam 50 has a low energy and a large current, particularly, the ion beam 50 during transportation is easily diverged by the space charge effect. Therefore, the effect of shortening the transportation distance is remarkable.

Figure 40:
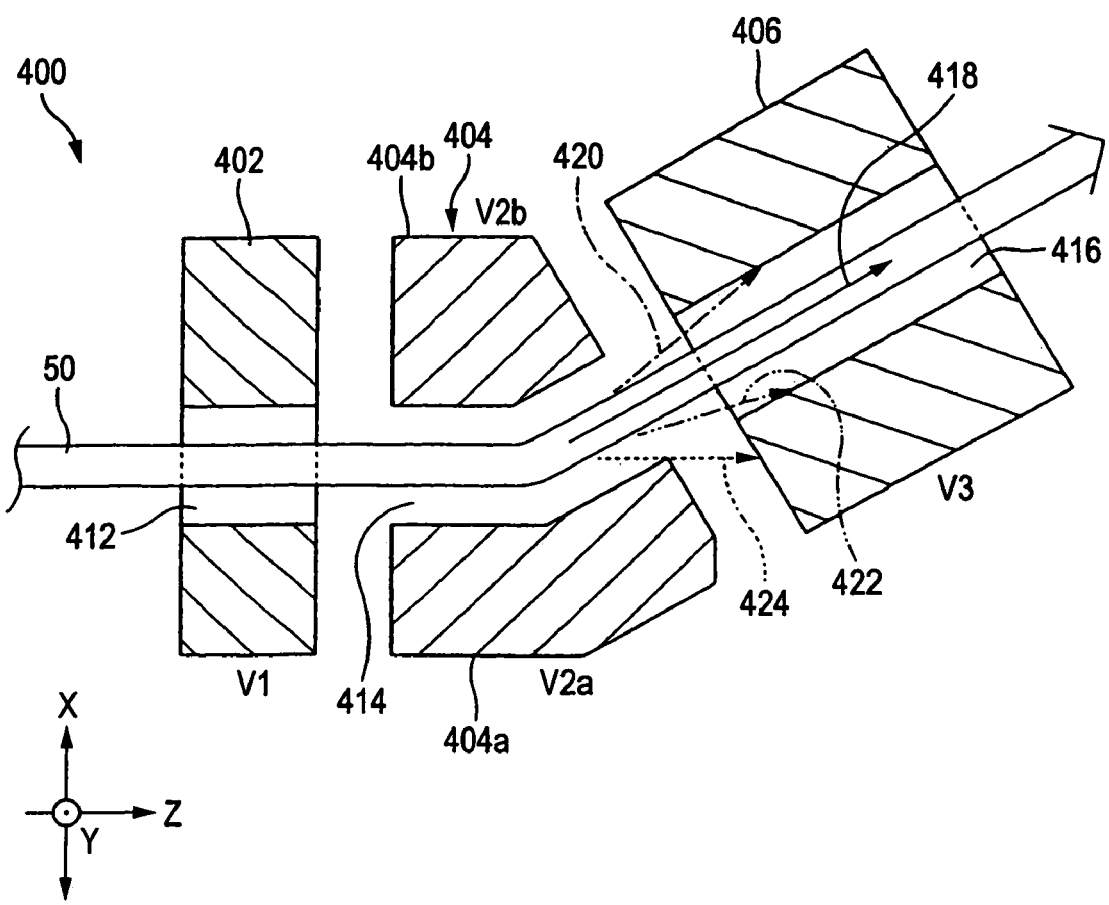
FIG. 40 is a cross section view showing an example of an accelerating/decelerating device shown in FIG. 1.

FIG. 40 shows a more specific example of the accelerating/decelerating device 400. The accelerating/decelerating device 400 has first to third electrodes 402, 404, 406 which are arranged in the sequence of the first electrode 402, the second electrode 404, and the third electrode 406 in the ion beam traveling direction with starting from the upstream side. In the example, each electrode has openings 412, 416 which extend in the Y direction, and through which the ion beam 50 flows. In the example, the electrode 402 is configured by one electrode. Alternatively, the electrode may be configured by two electrodes between which the path of the ion beam 50 is interposed in the X direction, and which are at the same potential. The same is applicable also to the electrode 406. The electrode 404 has a gap 414 which extends in the Y direction, and through which the ion beam 50 flows.

A potential V1 with respect to the ground potential is applied to the first electrode 402. Usually, the potential V1 is a positive (acceleration mode) or negative (deceleration mode) high potential.

In the case where potentials are applied to the electrodes 402, 404, 406 or electrode members 404a, 404b which will be described later, when the potentials are other than 0 V, the potentials are supplied from voltage applying means (for example, DC power sources, voltage dividing resistors for dividing a voltage from a DC power source, or the like which are not shown, the same shall apply hereinafter) corresponding to the electrodes. When the potentials are 0 V, the corresponding electrodes are grounded.

Usually, the second electrode 404 is set to a potential which is at the level between the first and third electrodes 402, 406. In the case of a well-known electrostatic accelerating tube, the second electrode 404 is configured by a single electrode. In this example, the second electrode is dividedly configured by the two electrode members 404a, 404b which are opposed to each other in the X direction across the path of the ion beam 50. Furthermore, potentials V2a, V2b (V2a≠V2b) which are different from each other are applied to the electrode members 404a, 404b, respectively, so that the ion beam 50 is deflected in the X direction. Specifically, to the electrode member 404b that is on the side in which the ion beam 50 is to be deflected, the potential V2b which is lower than the potential V2a of the counter electrode 404a is applied, or V2b<V2a is set. Means for applying such potentials are as described above.

The gap 414 through which the ion beam 50 flows is disposed between the two electrode members 404a, 404b constituting the electrode 404. Preferably, the gap 414 is bent in the deflection direction of the ion beam 50 as in this example. Specifically, the gap is preferably bent along the orbit of ions 418 having a specific energy after deflection, or specifically a desired energy. According to the configuration, the ion beam 50 consisting of the ions 418 having the desired energy can be efficiently derived.

A potential V3 which is usually 0 V is applied to the third electrode 406. Namely, the third electrode is grounded.

Preferably, the third electrode 406 which is on the downstream side of the second electrode 404 is placed along the orbit of the ions 418 having the specific energy after deflection by the electrode 404, or specifically the desired energy. According to the configuration, the ions 418 having the desired energy can be efficiently derived, and ions 420, 422 having an energy other than the energy, and neutral particles 424 can be efficiently blocked by the electrode 406. Therefore, energy contamination can be suppressed more effectively.

The difference between the potentials V2a, V2b which are applied to the electrode members 404a, 404b constituting the electrode 404 is set so that the ions 418 having the desired (objective) energy pass through the center orbit of the accelerating/decelerating device 400, specifically the center orbits of the electrodes 404, 406 (more specifically, the gap 414 and the opening 416) including and subsequent to the second electrode 404 having the deflecting function.

Table 1 collectively shows examples of the electrodes and the potentials applied to the electrodes. Examples 1 and 2 are those in the acceleration mode in which the ion beam 50 is accelerated by the accelerating/decelerating device 400, and Example 3 is that in the deceleration mode in which the ion beam 50 is decelerated. In the case of Example 1, an accelerating energy of 30 keV can be realized, and, in the case of Example 2, an accelerating energy of 130 keV can be realized. In the case of Example 3, an accelerating energy of 8 keV can be realized. In any case, the potential V2b of the electrode member 404b which is one electrode constituting the second electrode 404 is set to be lower than the potential V2a of the counter electrode 404a.

TABLE 1

|  | Potential V1 [kV] | Potential V2a [kV] | Potential V2b [kV] | Potential V3 [kV] |
|---|---|---|---|---|
| Example 1 | 30 | 0 | −48 | 0 |
| Example 2 | 130 | 100 | 52 | 0 |
| Example 3 | −8 | 0 | −1 | 0 |

According to the accelerating/decelerating device 400, the ion beam 50 can be deflected by the second electrode 404 which is configured by the two electrode members 404a, 404b, and to which the different potentials V2a, V2b are applied. At this time, the deflection amount depends on the energy of the ion beam 50 in the deflection, and hence the ions 418 having the desired energy can be separated from the ions 420, 422 having other energies. The ions 420 are ions having an energy which is lower than the desired energy, and their deflection amount is larger than that of the ions 418. The ions 422 are ions having an energy which is higher than the desired energy, and their deflection amount is smaller than that of the ions 418. The neutral particles 424 go straight without being deflected, and hence can be separated. Namely, the accelerating/decelerating device 400 exerts the energy separating function, and hence the ion beam 50 consisting of the ions 418 having the desired energy can be selectively derived, and energy contamination can be suppressed. In the example, the ions 420, 422 other than the ions 418 having the desired energy, and the neutral particles 424 impinge on the electrode 406 which is on the downstream side of the second electrode 404, whereby they are blocked and removed away.

Moreover, the accelerating/decelerating device 400 exerts also the original function of accelerating or decelerating the ion beam 50, in addition to the above-described energy separating function. These functions can be realized by the single accelerating/decelerating device 400, and hence it is not necessary to separately dispose an energy separator. As compared with the case where an energy separator is separately disposed, therefore, the transportation path of the ion beam 50 can be shortened. Accordingly, the transport efficiency of the ion beam 50 can be improved.

Furthermore, the ion beam 50 can be accelerated in two stages, i.e., between the electrodes 402 and 404, and between the electrodes 404 and 406. Example 2 in Table 1 shows an example of such a case. Before the acceleration in the subsequent stage (i.e., during a period when the energy is low), the ion beam 50 can be deflected by the electrode 404. As compared with the case where deflection is performed after full acceleration, the ion beam 50 can be easily deflected. Specifically, the difference between the potentials V2a and V2b applied on the two electrode members 404a, 404b constituting the electrode 404 can be made small. Consequently, there are advantages such as that electrical insulation in the vicinity of the electrode 404 is facilitated.

Ions and neutral particles other than the ions 418 having the desired energy can be blocked and removed away by the electrode 406 which is on the downstream side of the electrode 404. Therefore, energy contamination can be suppressed more effectively. Particularly, it is empirically known that, in the deceleration mode (see Example 3 in Table 1), the neutral particles 424 are easily generated by charge conversion in deceleration of the ion beam 50 between the electrodes 402 and 404. Even when many neutral particles 424 are generated, however, they travel straightly and impinge on the electrode 406 to be blocked. Therefore, the neutral particles 424 can be effectively eliminated in the accelerating/decelerating device 400.

In the acceleration mode, usually, electrons are emitted and accelerated to a higher potential side from a place of an electrode on which ions of an energy other than a desired energy impinge, and an X-ray having a high energy corresponding to such accelerated electrons is generated from a portion of an electrode on which the accelerated electrons impinge. A well-known electrostatic accelerating tube does not have the deflecting function. Therefore, the accelerated electrons can reach a higher potential electrode (an electrode corresponding to the electrode 404) without being bent, and are accelerated by a large energy corresponding to the potential of the higher potential electrode to impinge the higher potential electrode, so that an X-ray having a high energy is generated therefrom.

By contrast, as in the accelerating/decelerating device 400, the second electrode 404 is configured by the two electrode members 404a, 404b, and different potentials are applied to the electrode members, thereby providing the electrode with the deflecting function. According to the configuration, electrons emitted from a place on which ions of an unwanted energy impinge are bent by the electrode 404 so as to be disabled to reach the electrode 402 of the higher potential. Specifically, the electrons are bent toward the electrode member 404a which has a higher potential between the two electrode members 404a, 404b constituting the electrode 404, and then impinges on the electrode member 404a. At this time, the acceleration energy of the electrons is an energy corresponding to the potential of the electrode member 404a, and lower than that in the case where the electrons impinge on the electrode 402 of the higher potential. In the case of Example 1 in Table 1, for example, the energy of impinging electrons is approximately 0 eV, and an X-ray is not substantially generated. In the case of Example 2, the energy is about 100 keV, and is lower than about 130 keV in the case where the electron impinge on the electrode 402. In any case, therefore, the energy of a generated X-ray can be made lower than that in a well-known electrostatic accelerating tube.

As required, another electrode may be further disposed on the upstream side of the electrode 402 or the downstream side of the electrode 406. For example, a high-potential electrode for accelerating or decelerating the ion beam 50 may be disposed on the upstream side of the electrode 402. A negative-potential electrode for suppressing reversed electrons may be disposed on the downstream side of the electrode 406.

(5) About Orbit Control Lenses 700a, 700b

In the ion implanter in which the substrate 60 is illuminated with the ribbon-like ion beam 50 to perform ion implantation, the orbit state (for example, a parallel, divergent, or convergent state) in the Y direction which is the longitudinal direction of the ion beam is important. In order to perform ion implantation of high homogenization on a wide region (for example, a substantially whole face) of the substrate 60, for example, the parallelism in the Y direction of the ion beam 50 is important.

In order to comply with this, the following orbit control lens 700a or 700b may be disposed between the analyzing electromagnet 200 and the accelerating/decelerating device 400. The orbit control lenses 700a, 700b belong to the category of an electric field lens.

In the example shown in FIG. 1, between the analysis slit 70 and the accelerating/decelerating device 400, the orbit control lens 700a which bends the ion beam 50 passing there in the Y direction by means of an electrostatic field is disposed. However, the orbit control lens 700a may be disposed between the analyzing electromagnet 200 and the analysis slit 70 (in the case where the focus correction lens 610 is disposed, for example, between the focus correction lens 610 and the analysis slit 70). The same shall apply to the orbit control lens 700b which will be described later.

Figure 41:
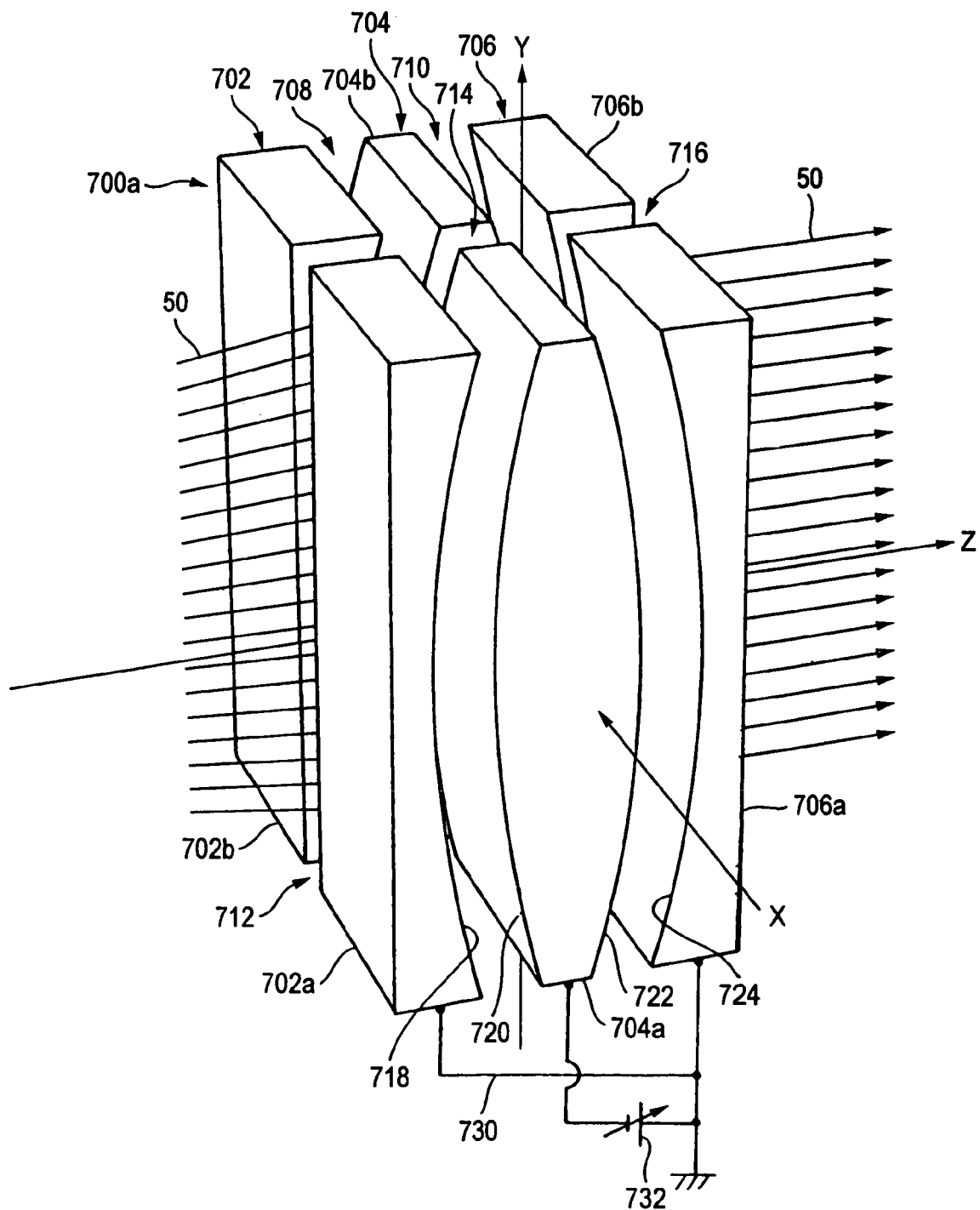
FIG. 41 is a perspective view enlargedly showing an orbit control lens shown in FIG. 1 together with a power source.

Also referring to FIG. 41, the orbit control lens 700a has an inlet electrode 702, intermediate electrode 704, and outlet electrode 706 which are arranged in series in the traveling direction Z of the ion beam 50 while forming gaps 708, 710 therebetween. The Y-direction lengths of the electrodes 702, 704, 706 are slightly larger than the dimension $W_Y$ in the Y direction of the ion beam 50 to be passed, and for example about 400 to 500 mm. For example, the distances of the gaps 708, 710 in the YZ plane are about 40 to 50 mm. However, the dimensions are not restricted to these values.

The inlet electrode 702 has a pair of electrodes 702a, 702b that are opposed to each other in the X direction across a gap 712 through which the ion beam 50 passes. The intermediate electrode 704 has a pair of electrodes 704a, 704b that are opposed to each other in the X direction across a gap 714 through which the ion beam 50 passes. The outlet electrode 706 has a pair of electrodes 706a, 706b that are opposed to each other in the X direction across a gap 716 through which the ion beam 50 passes. The X-direction dimensions of the gaps 712, 714, 716 are determined in accordance with the dimension $W_X$ in the X direction of the ion beam 50 to be passed, and for example about 50 to 100 mm. However, the dimensions are not restricted to these values.

The electrodes 702a, 702b are electrically conductive to each other and set to the same potential by conducting means such as lead wires which are not shown. The electrodes 704a, 704b are configured in a similar manner. The electrodes 706a, 706b are configured in a similar manner.

In the upstream and downstream faces in the traveling direction Z of the ion beam 50, the intermediate electrode 704 has convex surfaces 720, 722 which are arcuately curved in the Y direction. In the example, the convex surfaces 720, 722 are not curved in the X direction. The inlet and outlet electrodes 702, 706 have concave surfaces 718, 724 which extend along the convex surfaces 720, 722 of the intermediate electrode 704 specifically, extend with forming constant gaps), in faces opposed to the convex surfaces 720, 722. Therefore, also the gaps 708, 710 are arcuately curved in the Y direction, but not curved in the X direction.

The inlet and outlet electrodes 702, 706 are electrically connected to each other by conducting means such as a lead wire 730, to be maintained to the same potential. In the example, the electrodes 702, 706 are maintained to the ground potential-According to the configuration, it is possible to prevent the electric field from protruding from the orbit control lens 700a to the upstream and downstream sides in the Z direction of the ion beam 50. Therefore, it is possible to prevent the protrusion of the electric field from adversely affecting the ion beam 50 and the like.

The intermediate electrode 704 is maintained to a potential which is different from the potentials of the inlet and outlet electrodes 702, 706, and which makes the orbit state in the Y direction of the ion beam 50 derived from the orbit control lens 700a to a desired state. An example of the orbit state will be described later with reference to FIGS. 42 to 45. A voltage-variable DC power source 732 which maintains the intermediate electrode 704 to the potential is connected between the inlet and outlet electrodes 702, 706, and the intermediate electrode 704. In the example of FIG. 41, the direction of the DC power source 732 is set so that the side of the intermediate electrode 704 is negative. Alternatively, the direction may be inverted.

In the orbit control lens 700a, the inlet and outlet electrodes 702, 706 are maintained to the same potential, and the intermediate electrode 704 is maintained to a potential which is different from that of the inlet and outlet electrodes 702, 706. Therefore, the lens functions as a unipotential lens. When the ion implanter comprises the orbit control lens 700a, the orbit state in the Y direction of the ion beam 50 can be set to a desired one without changing the energy of the ion beam 50. The example will be described.

Figure 42:
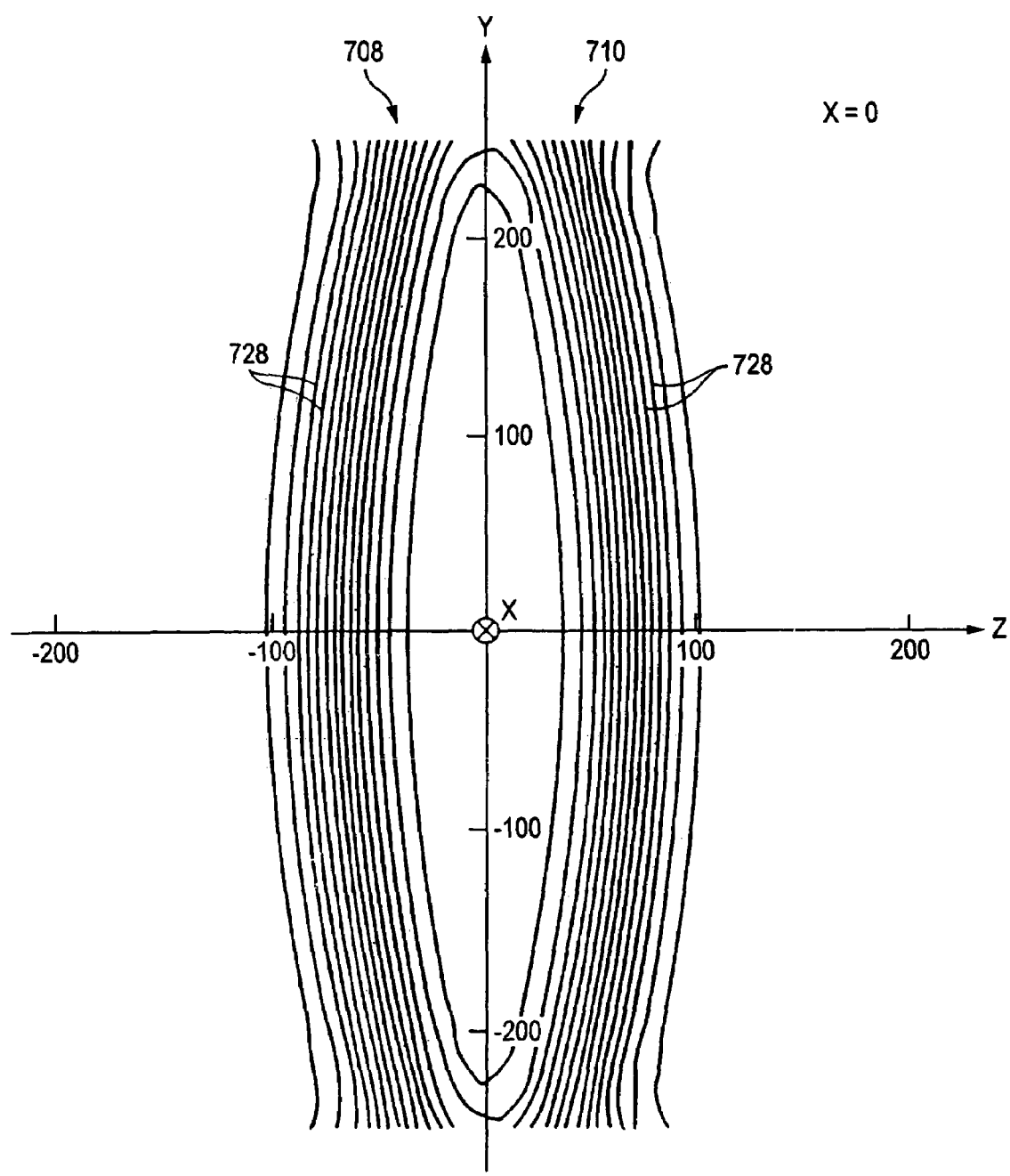
FIG. 42 is a view showing an example of distribution of equipotential lines between electrodes of the orbit control lens shown in FIG. 41.

FIG. 42 shows an example of the distribution of equipotential lines 728 in the vicinity of the gaps 708, 710 between the electrodes in the YZ plane of a center area (i.e., the coordinate of X=0) in the X direction of the orbit control lens 700a when the intermediate electrode 704 is maintained to a potential which is lower than that of the inlet and outlet electrodes 702, 706, specifically when the inlet and outlet electrodes 702, 706 are maintained to 0 V, and 15,000 V is applied to the intermediate electrode 704. The equipotential lines 728 which are curved in a convex lens-like manner are formed.

When ions constituting the ion beam 50 impinge on the orbit control lens 700a having the distribution of the equipotential lines 728, the converging effect is produced in the Y direction. For example, this causes a diverging incident ion beam 50 to be derived as a parallel beam. Alternatively, a parallel incident ion beam 50 may be derived as a converging beam. When the negative potential of the intermediate electrode 704 is further enhanced, a diverging incident ion beam 50 can be derived as a converging beam. When the potential of the intermediate electrode 704 is inverted or set to a positive potential, it is possible to diverge the ion beam 50 in the Y direction.

Figure 43:
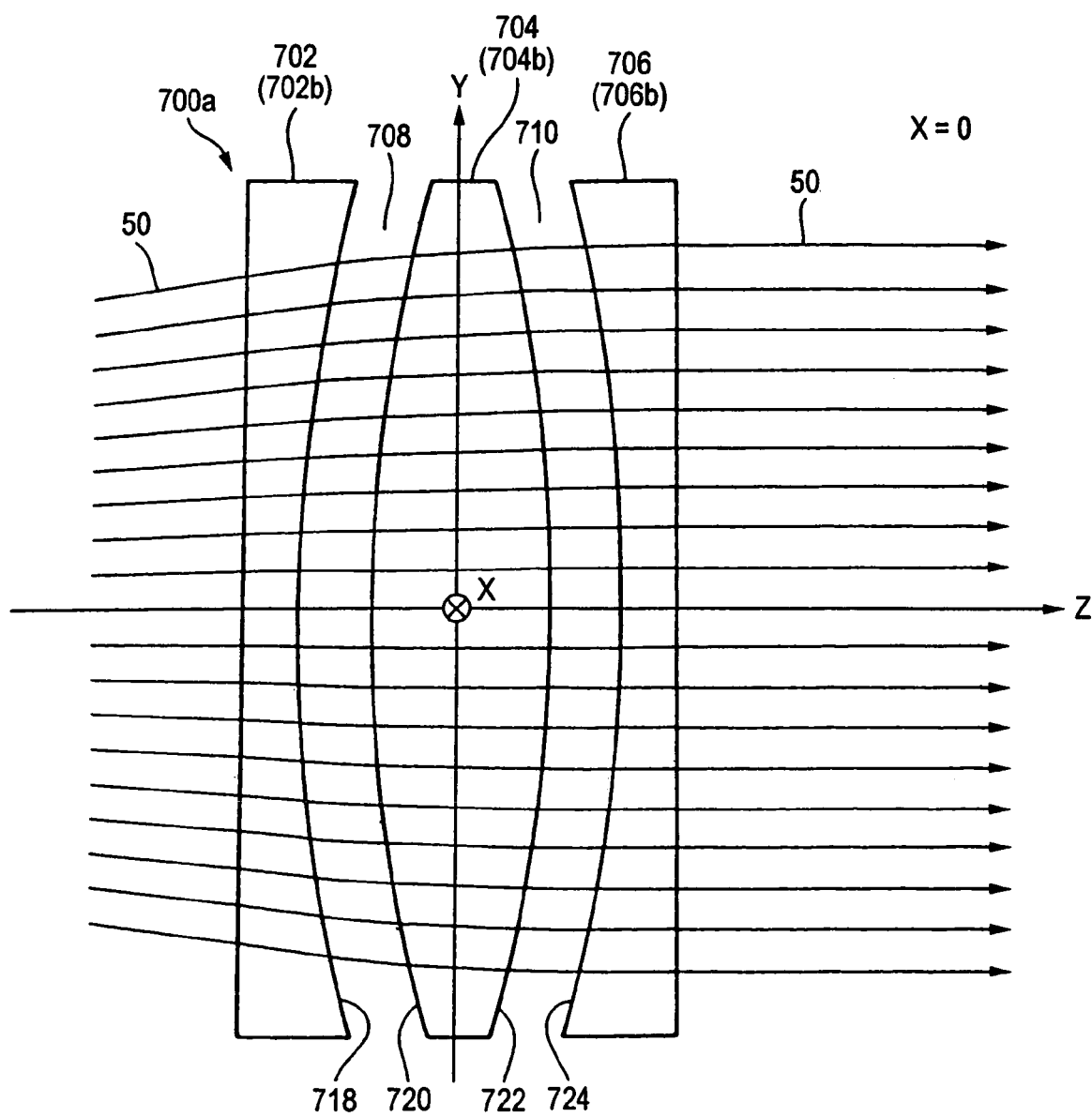
FIG. 43 is a view showing an example where, in the orbit control lens shown in FIG. 41, an incident ion beam which is divergent in the Y direction is derived as a parallel beam.
Figure 44:
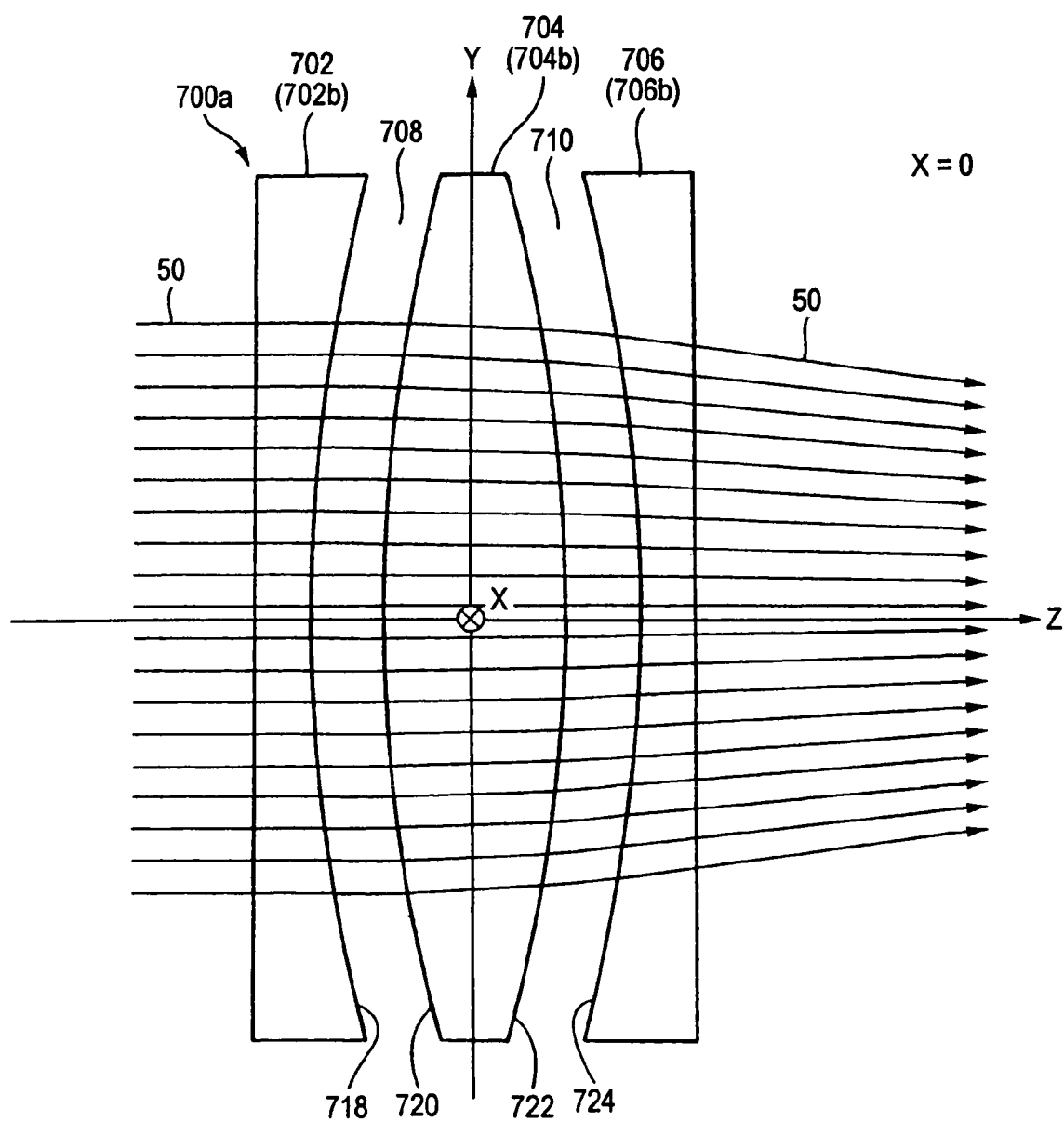
FIG. 44 is a view showing an example where, in the orbit control lens shown in FIG. 41, an incident ion beam which is parallel in the Y direction is derived as a converging beam.

FIGS. 43 and 44 show examples in the case where a voltage of 0 V is applied to the inlet and outlet electrodes 702, 706, that of −15,000 V is applied to the intermediate electrode 704 in a similar manner as described above, and the ion beam 50 consisting of monovalent arsenic (As) ions (atomic weight of 75 AMU) having an energy of 15 keV impinges on the orbit control lens 700a. Although not illustrated, equipotential lines which are similar to those shown in FIG. 42 are formed in the vicinity of the gaps 708, 710 in FIGS. 93 and 44. In the same manner as FIG. 42, FIGS. 43 to 45 and 47 show the YZ plane at the coordinate of X=0.

FIG. 43 shows an example where an incident ion beam 50 which is divergent in the Y direction is derived as a parallel beam. In the example, the divergence angle of the incident ion beam 50 is ±1 to ±9 deg. (the center area in the Y direction is ±1 deg., and the angle is incremented at the step of 1 deg. as the beam vertically deviates). In the specification, a parallel beam means an ion beam in which, as shown in FIG. 43, orbits (traveling directions) of ion beams 50 derived from different positions in the Y direction are substantially parallel to one another. In the example, the beam is parallel also in the Z direction which is the traveling direction of the whole ion beam 50.

FIG. 44 shows an example where an incident ion beam 50 which is parallel in the Y direction (i.e., the divergence angle is 0 deg., the same shall apply hereinafter) is derived as a converging beam. The ion beam 50 has a property that the beam is diverged by the space charge effect. In the ion beam 50 which has a low energy and a large beam current, particularly, the property is strongly exhibited. When the ion beam 50 which is converged as in the example is taken out from the orbit control lens 700a to be balanced (offset) with the divergence due to the space charge effect between the orbit control lens 700*a* and the substrate 60, therefore, the ion beam 50 in the incident on the substrate 60 can be formed as a substantially parallel beam.

Figure 45:
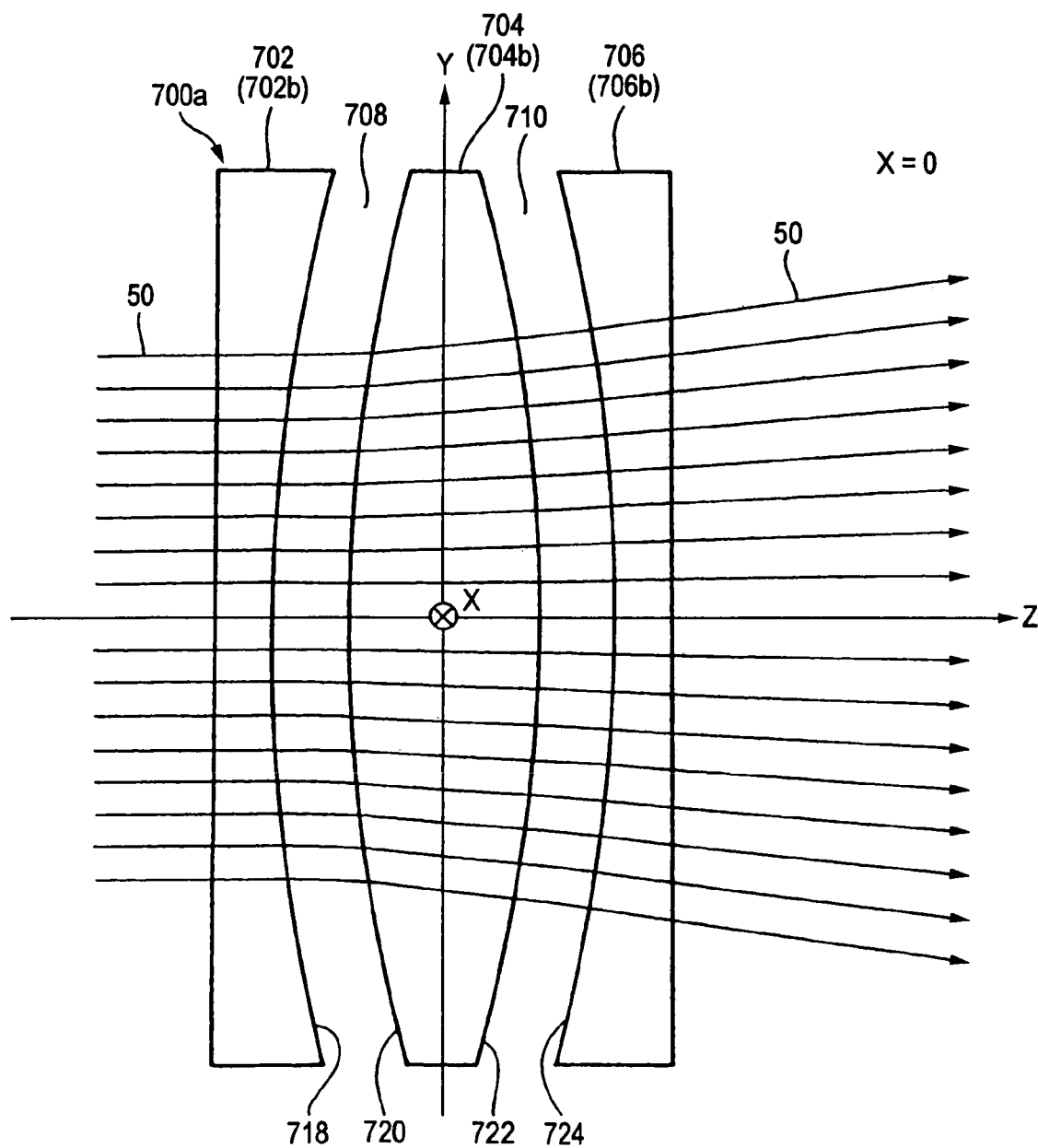
FIG. 45 is a view showing an example where, in the orbit control lens shown in FIG. 41, an incident ion beam which is divergent in the Y direction is derived as a diverged beam.

FIG. 45 shows an example in the case where a voltage of 0 V is applied to the inlet and outlet electrodes 702, 706, that of +10,000 V is applied to the intermediate electrode 704, and the ion beam 50 consisting of monovalent arsenic having an energy of 15 keV and parallel in the Y direction is derived as a divergent beam in a similar manner as described above. On the downstream side of the orbit control lens 700*a*, beam converging means is disposed. The divergence due to the former, and the convergence due to the latter are combined with each other, so that the ion beam 50 can be formed as a parallel beam. According to the configuration, the dimension $W_Y$ in the Y direction of the ion beam 50 can be further increased.

When the ion implanter comprises the orbit control lens 700*a*, the orbit state in the Y direction of the ion beam 50 can be set to a desired one without changing the energy of the ion beam 50. For example, the ion beam 50 is formed as a parallel beam, and the ion beam 50 with high parallelism can be derived. Therefore, the example is preferable in the case such as that where, when the ion beam is to be formed as a parallel beam, for example, the energy of the ion beam 50 is not to be changed.

When the ion beam 50 derived from the orbit control lens 700*a* is formed as a parallel beam, for example, ion implantation of high homogenization can be performed on a wide region (for example, a substantially whole face) of the substrate 60. Moreover, it is possible to prevent a shadow portion on which the ion beam 50 does not impinge, from being produced in a microstructure portion of the surface of the substrate 60.

Furthermore, the intermediate electrode 704 constituting the orbit control lens 700*a* has the convex surfaces 720, 722 which are curved in the Y direction as described above, and the inlet and outlet electrodes 702, 706 have the concave surfaces 718, 724 which extend along the convex surfaces. Therefore, the homogenization in the Y direction of the electric field in the gaps 708, 710 between the electrodes is extremely improved (see FIG. 42). As a result, even when the dimension in the Y direction is large, the orbit state in the Y direction of the ion beam 50 can be set to a desired one with high homogenization. Therefore, the example is particularly preferable in the case where a ribbon-like ion beam 50 is used. If the surfaces 718, 724 of the inlet and outlet electrodes 702, 706 are flat, or if the surfaces 720, 722 of the intermediate electrode 704 are flat, unevenness or narrowness or wideness in the Y direction is produced among the gaps of the equipotential lines 728 in the gaps 708, 710, and hence the homogenization in the Y direction of the electric field in the gaps 708, 710 is lowered.

Figure 46:
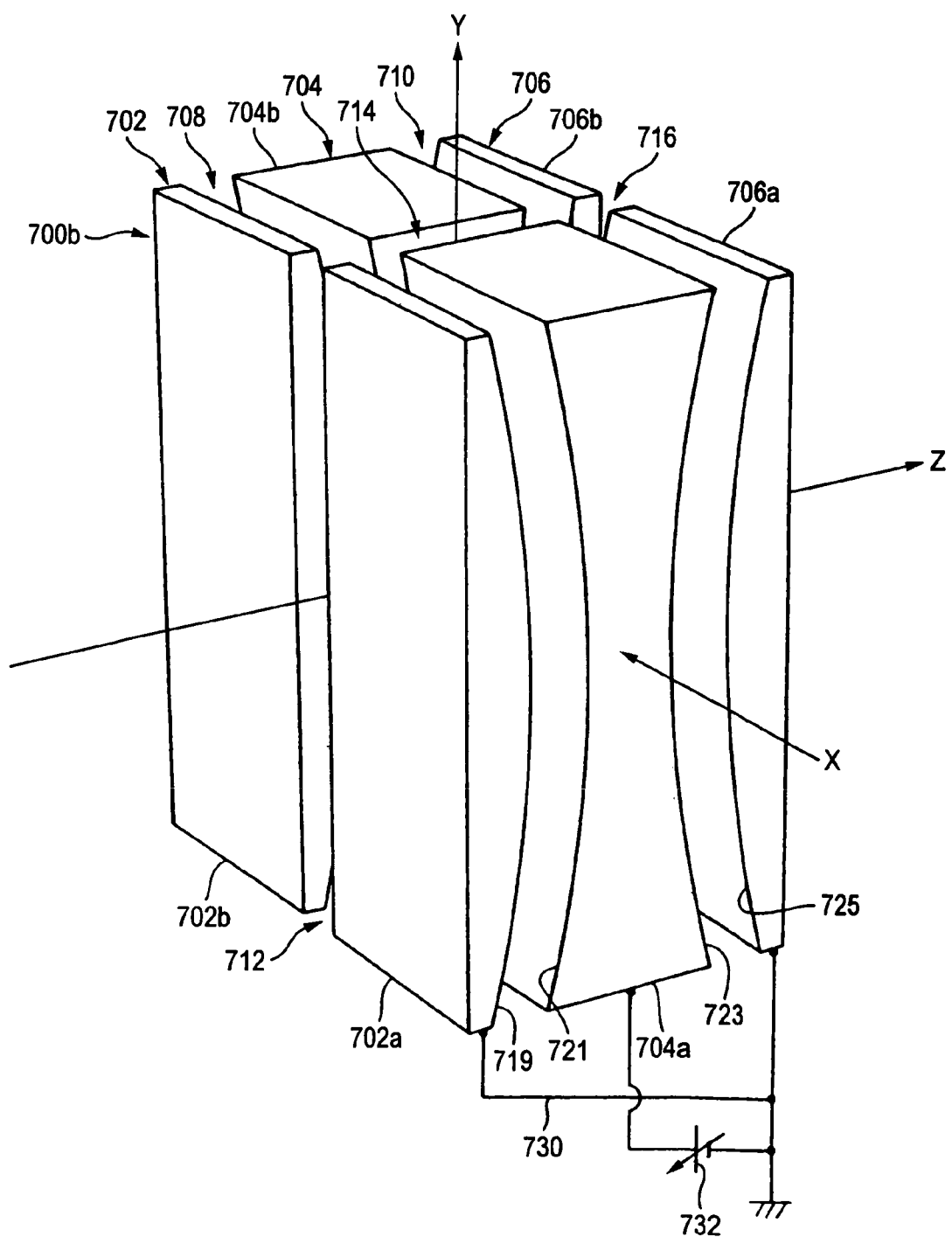
FIG. 46 is a perspective view showing another example of the orbit control lens together with a power source.

FIG. 46 is a perspective view showing another example of the orbit control lens together with a power source. The orbit control lens 700*b* may be used in place of the orbit control lens 700*a*. The portions which are identical or corresponding to those of the orbit control lens 700*a* shown FIG. 41 and the like are denoted by the same reference numerals. In the following description, emphasis is placed on differences from the orbit control lens 700*a*.

In the upstream and downstream faces in the traveling direction Z of the ion beam 50, the intermediate electrode 704 constituting the orbit control lens 700*b* has concave surfaces 721, 723 which are arcuately curved in the Y direction. In the example, the concave surfaces 721, 723 are not curved in the X direction. The inlet and outlet electrodes 702, 706 have convex surfaces 719, 725 which extend along the concave surfaces 721, 723 of the intermediate electrode 704 (specifically, extend with forming constant gaps), in faces corresponding to the concave surfaces 721, 723. Therefore, also the gaps 708, 710 are arcuately curved in the Y direction, but not curved in the X direction.

The intermediate electrode 704 is maintained to a potential which is different from the potentials of the inlet and outlet electrodes 702, 706, and which makes the orbit state in the Y direction of the ion beam 50 derived from the orbit control lens 700*b* to a desired state. An example of the orbit state will be described later with reference to FIG. 47. A voltage-variable DC power source 732 which maintains the intermediate electrode 704 to the potential is connected between the inlet and outlet electrodes 702, 706, and the intermediate electrode 704. In the example of FIG. 46, the direction of the DC power source 732 is set so that the side of the intermediate electrode 704 is positive. Alternatively, the direction may be inverted.

In the vicinity of the gaps 708, 710 of the orbit control lens 700*b*, equipotential lines which are curved in a concave lens-like manner that is opposite to that in the example shown in FIG. 42 are formed.

Also in the orbit control lens 700*b*, the inlet and outlet electrodes 702, 706 are maintained to the same potential, and the intermediate electrode 704 is maintained to a potential which is different from that of the inlet and outlet electrodes 702, 706. Therefore, the lens functions as a unipotential lens. When the ion implanter comprises the orbit control lens 700*b*, the orbit state in the Y direction of the ion beam 50 can be set to a desired one without changing the energy of the ion beam 50.

Figure 47:
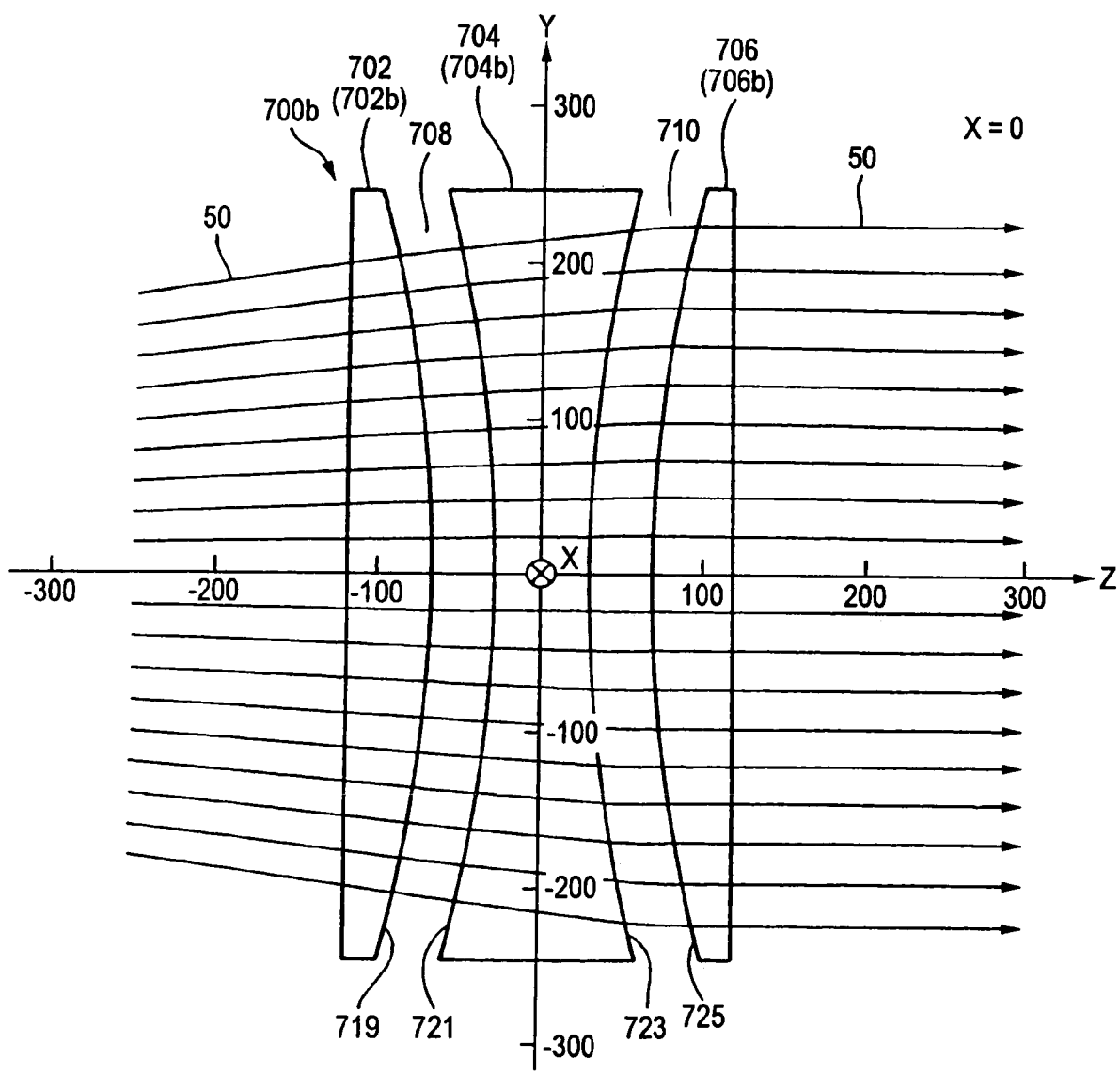
FIG. 47 is a view showing an example where, in the orbit control lens shown in FIG. 46, an incident ion beam which is divergent in the Y direction is derived as a parallel beam.

When ions impinge on the orbit control lens 700*b*, the converging effect is produced in the Y direction. For example, this causes a diverging incident ion beam 50 to be derived as a parallel beam, as shown in FIG. 47. FIG. 47 shows an example in the case where the intermediate electrode 704 is maintained to a potential which is higher than that of the inlet and outlet electrodes 702, 706, or specifically the inlet and outlet electrodes 702, 706 is maintained to 0 V, a voltage of +15,000 V is applied to the intermediate electrode 704. The ion beam 50 consists of monovalent arsenic ions having an energy of 15 keV. The divergence angle of the incident ion beam is ±1 to ±9 deg.

In addition, the orbit control lens 700*b* can deriver a parallel incident ion beam 50 as a converging beam. When the positive potential of the intermediate electrode 704 is further intensified, a divergent incident ion beam 50 can be derived as a converging beam. When the polarity of the intermediate electrode 704 is inverted to the above-described one or set to a negative potential, the ion beam 50 can be diverged in the Y direction.

The functions and effects of the orbit control lens 700*b* other than those described above are identical with those of the above-described orbit control lens 700*a*, and hence duplicated description will be omitted.

(6) About Homogenizing Lens 750

Figure 48:
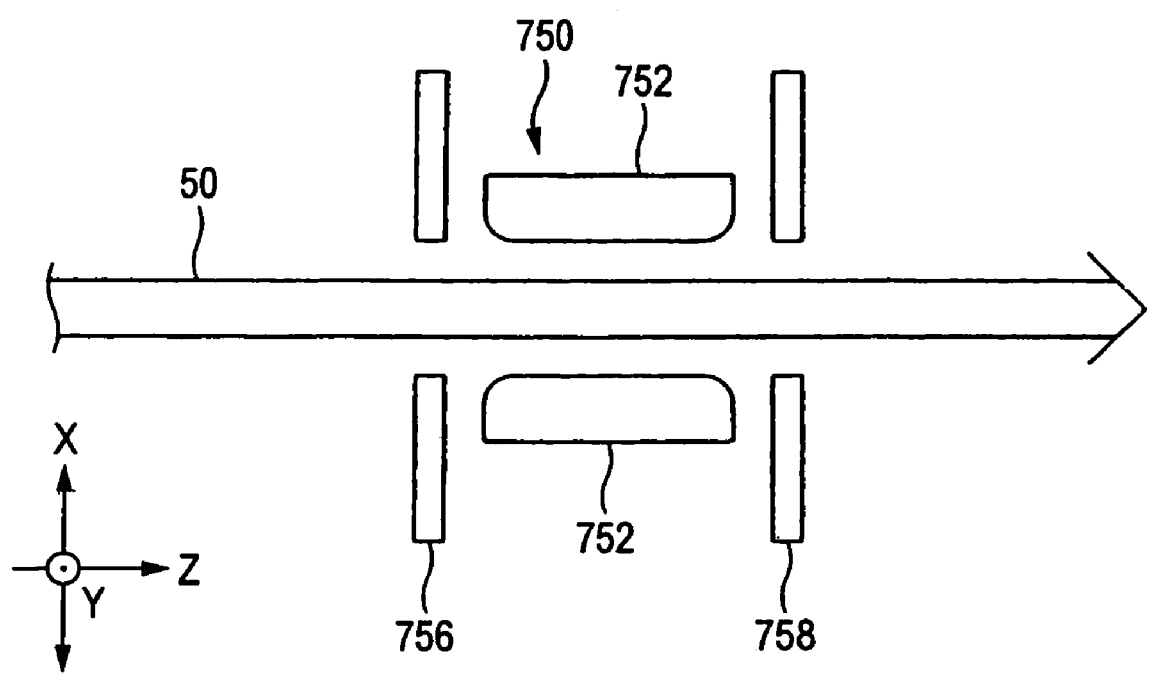
FIG. 48 is a plan view showing an example of a homogenizing lens.
Figure 49:
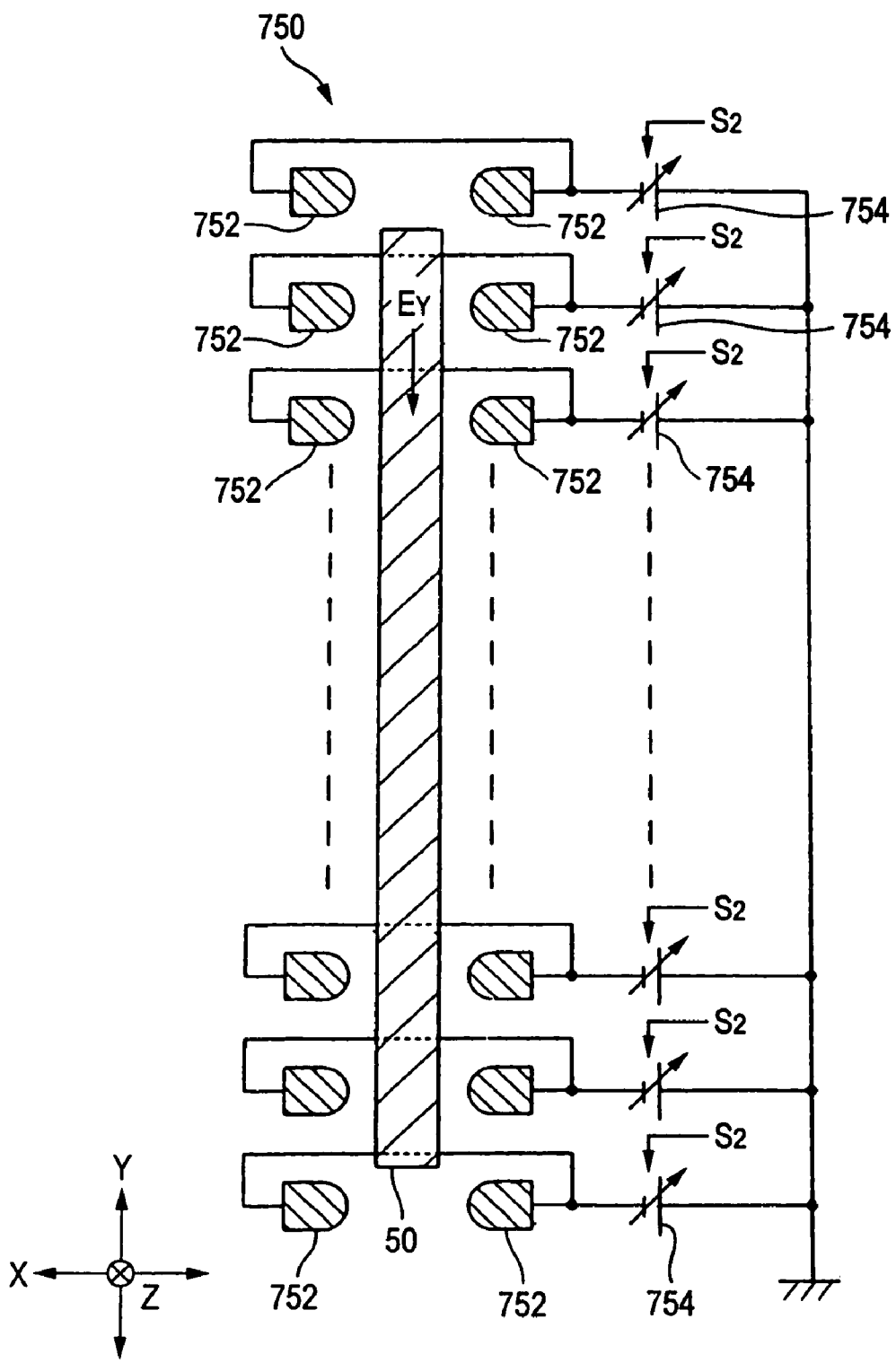
FIG. 49 is a view showing the homogenizing lens shown in FIG. 48, as viewed in an ion traveling direction, together with an example of a power source.

In place of the orbit control lenses 700*a*, 700*b*, a homogenizing lens 750 such as in examples shown in FIGS. 48 and 49 may be disposed. The homogenizing lens 750 belongs to the category of an electric field lens.

The homogenizing lens 750 is disposed between the analyzing electromagnet 200 and the accelerating/decelerating device 400. Specifically, the homogenizing lens may be disposed between the analysis slit 70 and the accelerating/decelerating device 400, or between the analyzing electromagnet 200 and the analysis slit 70 (in the case where the focus correction lens 610 is disposed, for example, between the focus correction lens 610 and the analysis slit 70).

The homogenizing lens 750 has plural (for example, ten) electrode pairs which are placed in multiple in the Y direction. In each pair, pairs of electrodes 752 (electrode pairs) are opposed to each other in the X direction across the ion beam 50. In the illustrated example, in each pair of electrodes 752, vicinities of opposed tip ends have a semi-cylindrical or semi-columnar shape, or alternatively constitute plate electrodes (parallel plate electrodes). As shown in FIG. 49, two electrodes 752 which are opposed to each other to be paired are electrically connected in parallel to be electrically conductive to each other. In FIG. 49, wires for the parallel connection may look as if they intersect with the ion beam 50. This is caused by simplification of illustration. Actually, the wires do not intersect with the ion beam 50.

As an example of homogenizing-lens power sources which respectively apply an independent DC voltage between the electrode pairs and a reference potential portion (for example, a ground potential portion) in the above-described stages, independent voltage-variable homogenizing-lens power sources 754 are disposed for the electrode pairs in the stages, respectively. Namely, the number of the homogenizing-lens power sources 754 is equal to that of the electrode pairs. In place of the above configuration, a single homogenizing-lens power source which is formed by, for example, combining the plural power sources into one unit may be used, and DC voltages to be applied to the electrode pairs may be independently controlled.

As the DC voltages to be applied to the electrode pairs, a negative voltage is more preferable than a positive voltage. When a negative voltage is used, it is possible to prevent electrons in a plasma existing in the periphery of the ion beam 50 from being pulled to the electrodes 752 together with the ion beam. When the electrons are pulled in, divergence of the ion beam 50 due to the space charge effect is enhanced. This can be prevented from occurring.

When the DC voltages to be applied to the electrode pairs are adjusted, an electric field $E_Y$ in the Y direction is generated in the path of the ion beam 50 (the electric field $E_Y$ in FIG. 49 shows an example), and ions constituting the ion beam 50 can be bent in the Y direction in accordance with the intensity of the electric field $E_Y$.

Because of the homogenizing lens 750, therefore, plural orbits in the Y direction of the ion beam 50 can be bent in the Y direction by means of an electrostatic field, and the beam current density distribution in the Y direction of the ion beam at the implanting position can be homogenized. As a result, the homogenization of the ion implantation on the substrate 60 can be further enhanced. This effect is more remarkable in the case where the substrate 60, and therefore the ion beam 50 has a large dimension in Y-direction.

A beam measuring device 80 which measures the beam current density distribution in the Y direction of the ion beam 50 at the implanting position, and a homogenization controlling device 90 may be disposed (see FIG. 1) so that the following control may be performed with using these devices.

In the example, the beam measuring device 80 is a multi-point beam measuring device in which plural measuring devices (for example, Faraday cups) for measuring the beam current of the ion beam 50 are juxtaposed in the Y direction. Alternatively, a structure where a single measuring device is moved in the Y direction by a moving mechanism may be employed. Measurement information $D_1$ indicative of the beam current density distribution is output from the beam measuring device 80, and then supplied to the homogenization controlling device 90. The measurement information $D_1$ is configured by a plurality or $n_1$ ($n_1$ is equal to the number of the Faraday cups) number of sets of measurement information.

On the basis of the measurement information $D_1$ from the beam measuring device 80, the homogenization controlling device 90 supplies a plurality or $n_2$ ($n_2$ is equal to the number of the electrode pairs) number of control signals $S_2$ to the homogenizing-lens power sources 754 to control the respective homogenizing-lens power sources 754, thereby controlling the improvement of the homogenization of the beam current density distribution. Specifically, when there is a low-current density region where the beam current density is lower than that of another region, the homogenization controlling device 90 lowers the voltage to be applied to the electrode pair corresponding to the low-current density region so that the electric field $E_Y$ is directed to a region of the homogenizing lens 750 corresponding to the low-current density region, from the neighbor, and, in the case of the contrary, the opposite operation is conducted (i.e., the voltage is raised, and the electric field $E_Y$ is reduced or reversely directed), thereby performing the control of homogenizing the beam current density distribution in the Y direction of the ion beam 50 at the implanting position.

As in the example shown in FIG. 48, shielding plates 756, 758 may be disposed on the upstream and downstream sides of the electrodes 752 constituting the homogenizing lens 750, respectively. The shielding plates 756, 758 have a length that covers the whole of the electrodes 752 which are placed in multiple in the Y direction, and are electrically grounded. When the shielding plates 756, 758 are disposed, it is possible to prevent the electric field of the electrodes 752 from leaking to the upstream and downstream sides of the homogenizing lens 750. As a result, it is possible to prevent an unwanted electric field from acting on the ion beam 50 in the vicinities of the upstream and downstream sides of the homogenizing lens 750 to bend undesirably the ion beam 50.

(7) About Deflecting Electromagnet 800

Figure 50:
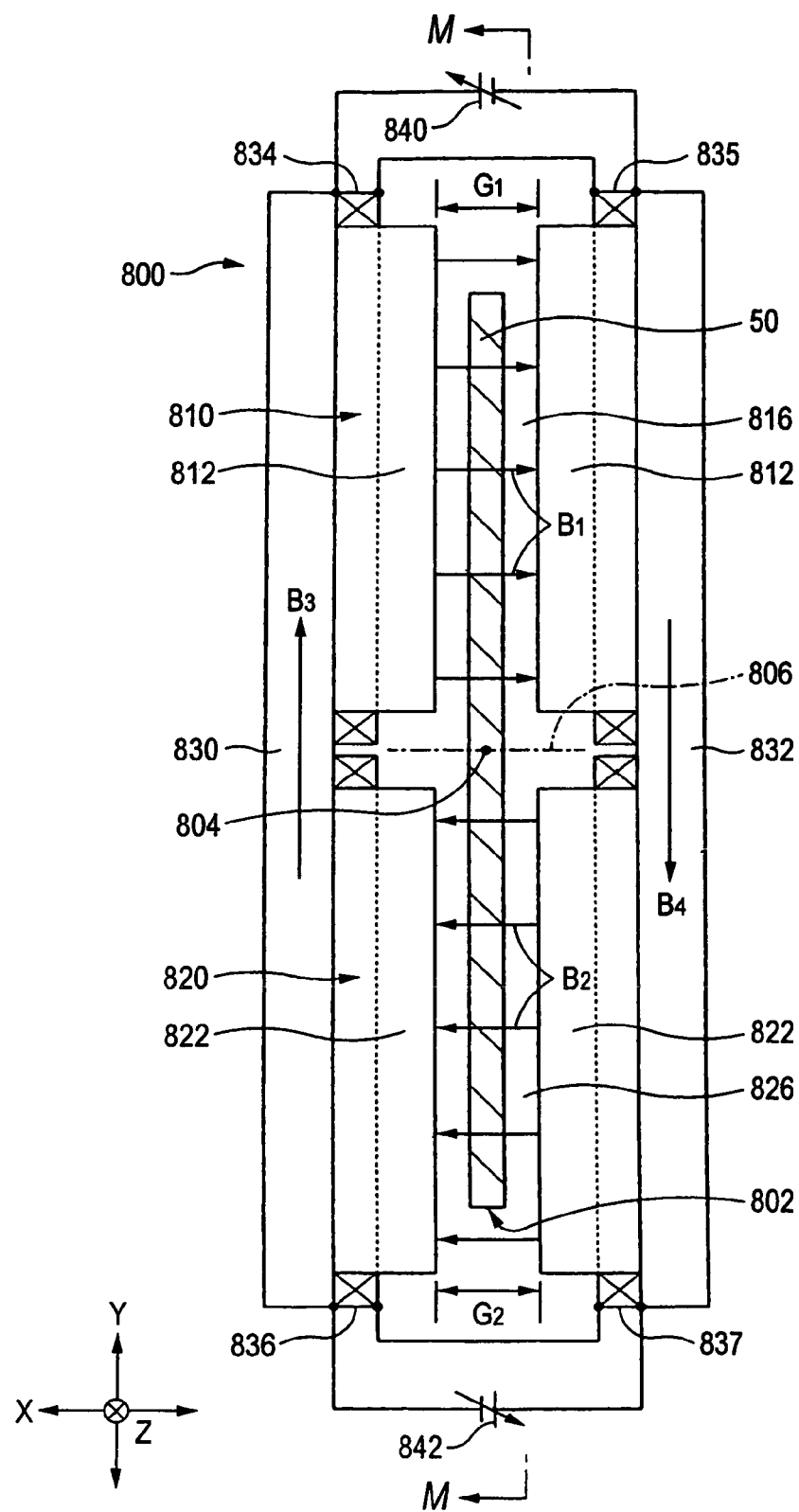
FIG. 50 is a front view showing an example of a deflecting electromagnet together with a power source.
Figure 53:
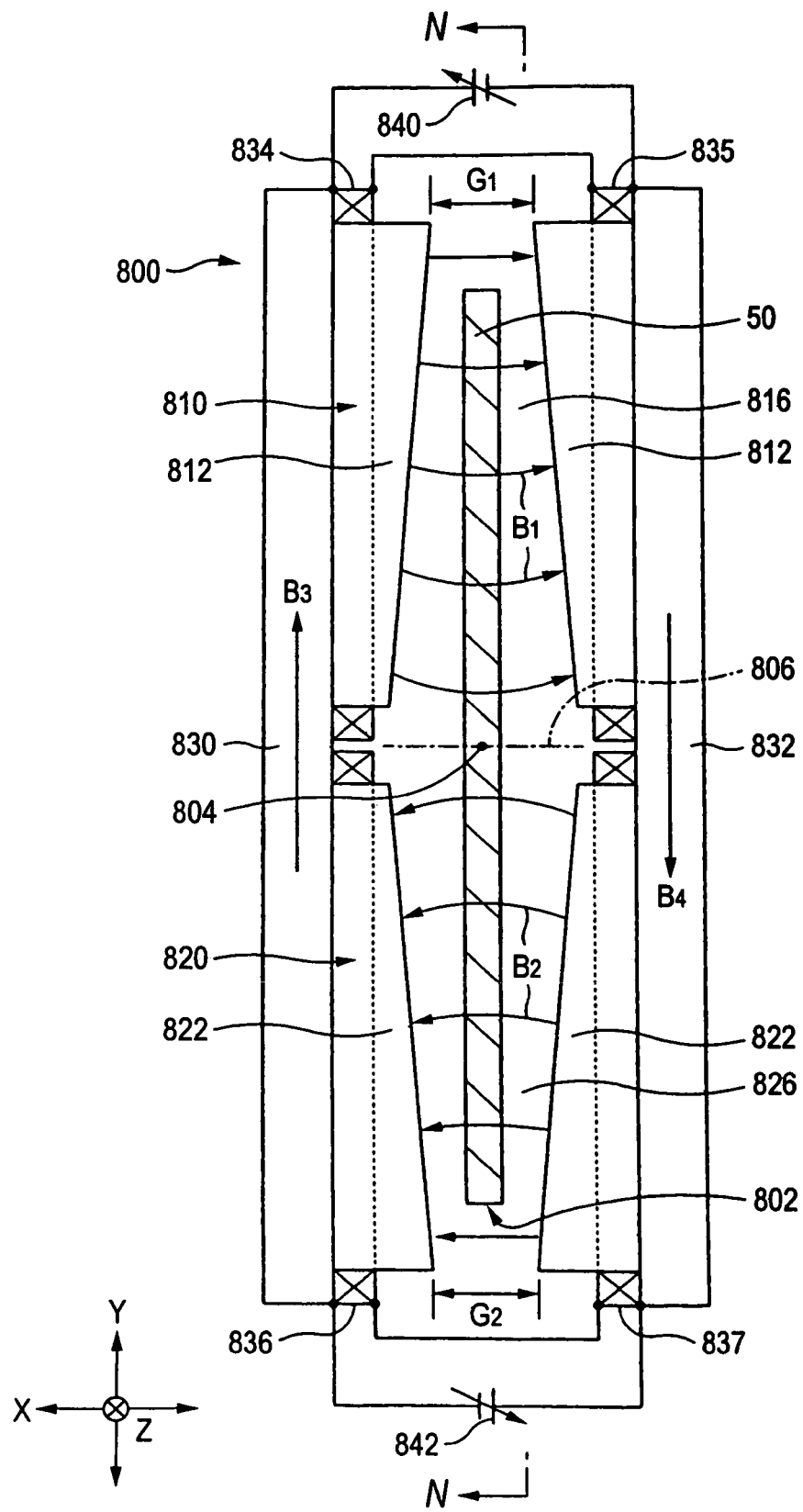
FIG. 53 is a front view showing another example of the deflecting electromagnet together with a power source.

In place of the orbit control lenses 700a, 700b and the homogenizing lens 750, a deflecting electromagnet 800 may be disposed as in an example shown in FIGS. 50 and 53. The deflecting electromagnet 800 can be said that it is one kind of magnetic lens.

The deflecting electromagnet 800 is disposed between the analyzing electromagnet 200 and the implanting position (i.e., the position where the ion beam 50 impinges on the substrate 60). For example, the deflecting electromagnet is disposed between the analyzing electromagnet 200 and the accelerating/decelerating device 400. Specifically, the deflecting electromagnet may be disposed between the analysis slit 70 and the accelerating/decelerating device 400, or between the analyzing electromagnet 200 and the analysis slit 70 (in the case where the focus correction lens 610 is disposed, between the focus correction lens 610 and the analysis slit 70).

Figure 51:
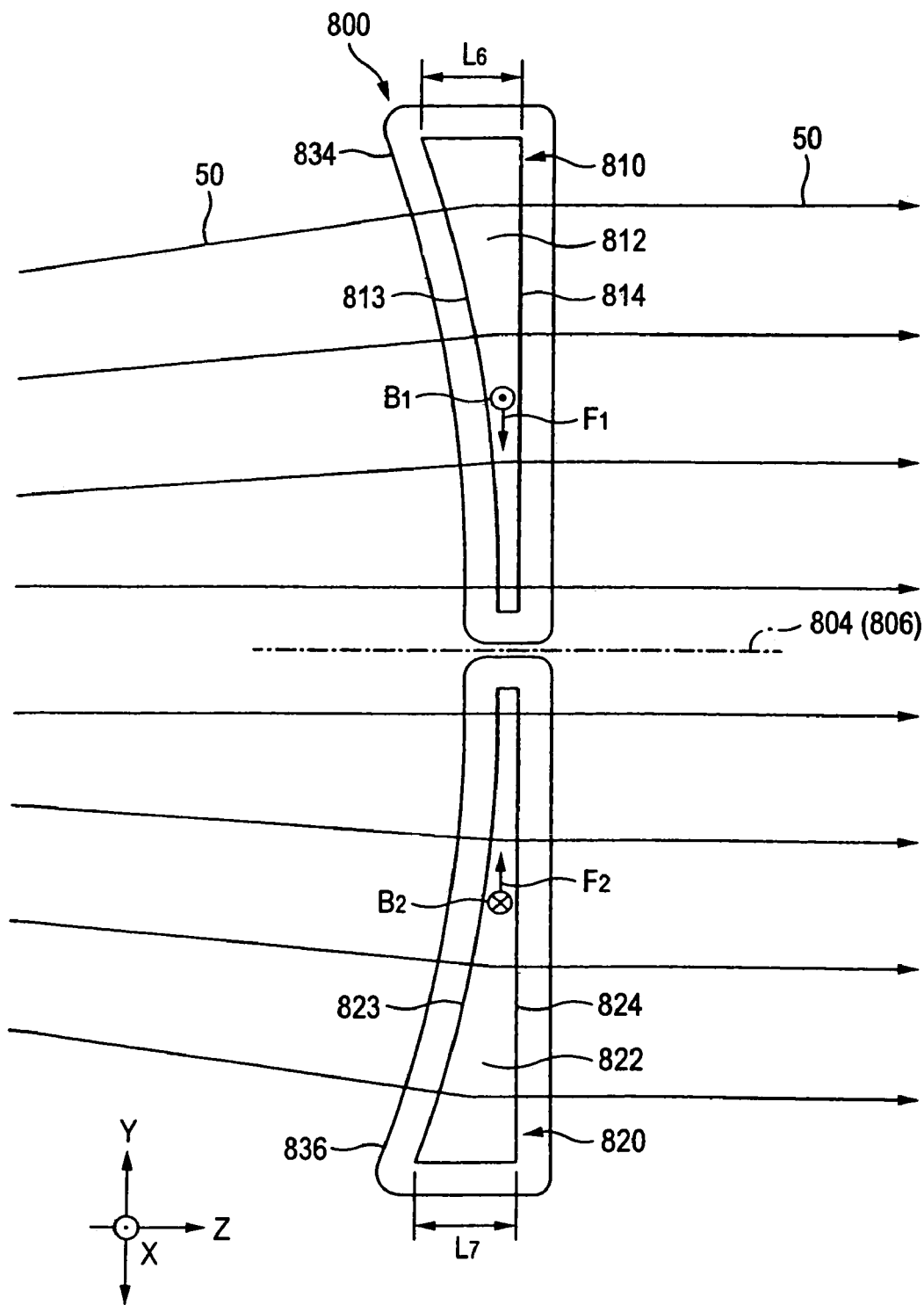
FIG. 51 is a side view taken along the line M-M of FIG. 50 and showing a case where a diverging beam is formed as a parallel beam.

FIG. 50 is a front view showing an example of the deflecting electromagnet together with a power source, and FIG. 51 is a side view taken along the line M-M of FIG. 50 and showing a case where a diverging beam is formed as a parallel beam.

The ribbon-like ion beam 50 impinges on the deflecting electromagnet 800, and the deflecting electromagnet generates magnetic fields $B_1$, $B_2$ along the X direction in a beam path 802 through which the ion beam 50 passes. The deflecting electromagnet 800 comprises: a first magnetic pole pair 810 having a pair of magnetic poles 812 that are opposed to each other in the X direction across the beam path 802, and that cover about a half or more (in other words substantially a half or more) of one side (in the embodiment, the upper side) of the ion beam 50 in the Y direction; a second magnetic pole pair 820 having a pair of magnetic poles 822 that are opposed to each other in the X direction across the beam path 802, and that cover about a half or more (in other words, substantially a half or more) of the other side (in the embodiment, the lower side) of the ion beam 50 in the Y direction; and coils 834 to 837 that generate the magnetic fields $B_1$, $B_2$ that are opposite to each other, in a gap 816 between the first magnetic pole pair 810, and a gap 826 between the second magnetic pole pair 820.

An X-direction length (gap length, the same shall apply hereinafter) $G_1$ of the gap 816 between the first magnetic pole pair 810 is substantially constant in the Y direction. Also a gap length $G_2$ between the second magnetic pole pair 820 is substantially constant in the Y direction. Preferably, the gap lengths $G_1$, $G_2$ are substantially equal to each other. This example is configured in this manner.

In this example, the coils 834, 835 are wound around the paired magnetic poles 812 constituting the first magnetic pole pair 810, respectively. The coils 834, 835 are connected in series to each other, and connected to a DC power source 840. The coils are excited by the DC power source 840 to generate the magnetic field $B_1$ which, for example, is rightward directed in the X direction as shown in FIG. 50.

The coils 836, 837 are wound around the paired magnetic poles 822 constituting the second magnetic pole pair 820, respectively. The coils 836, 837 are connected in series to each other, and connected to a DC power source 842. The coils are excited by the DC power source 842, and an exciting current which is opposite to that of the coils 834, 835 flows to generate the magnetic field $B_2$ which, for example, is leftward directed in the X direction as shown in FIG. 50.

Figure 54:
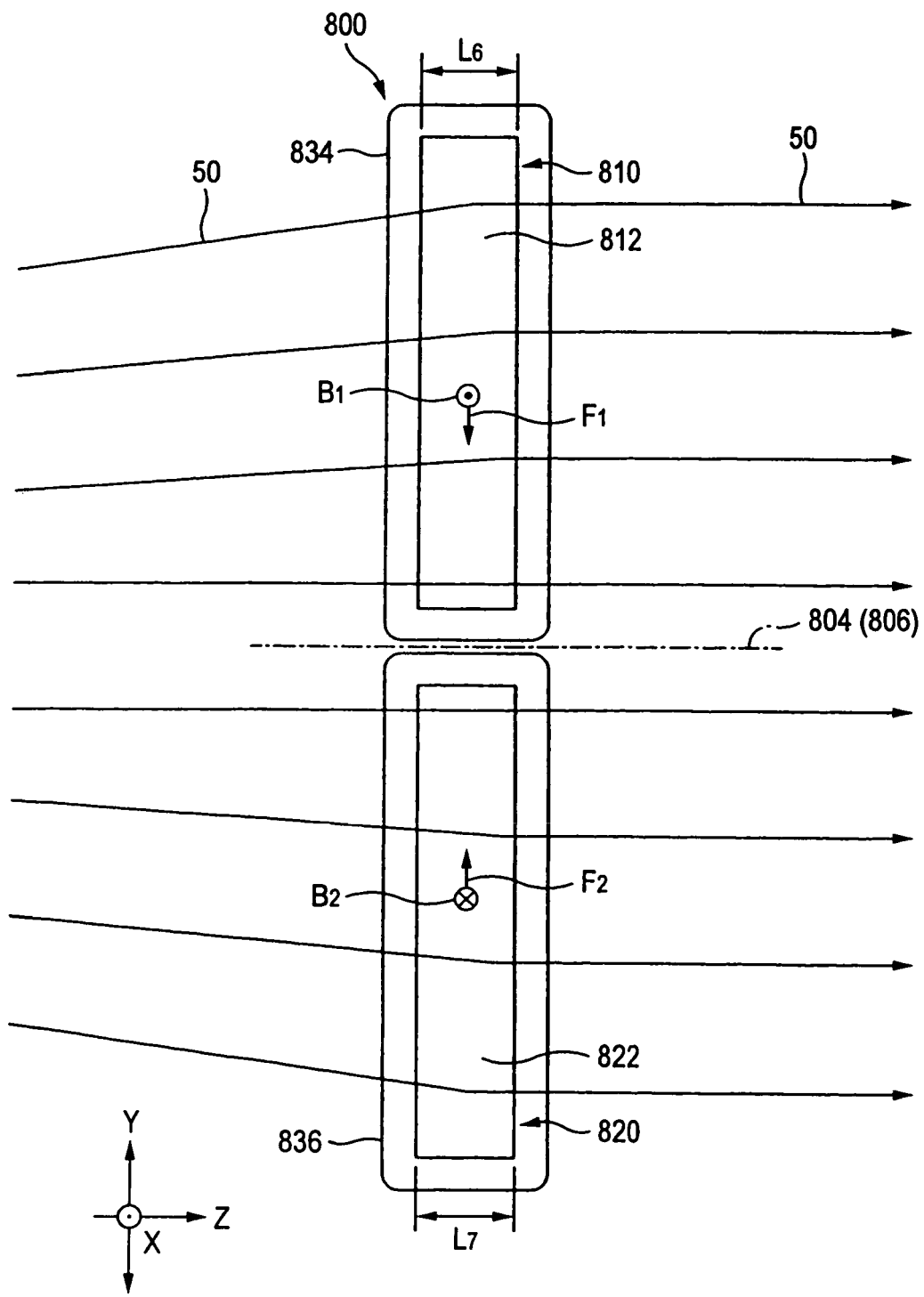
FIG. 54 is a side view taken along the line N-N of FIG. 53 and showing a case where a diverging beam is formed as a parallel beam.
Figure 55:
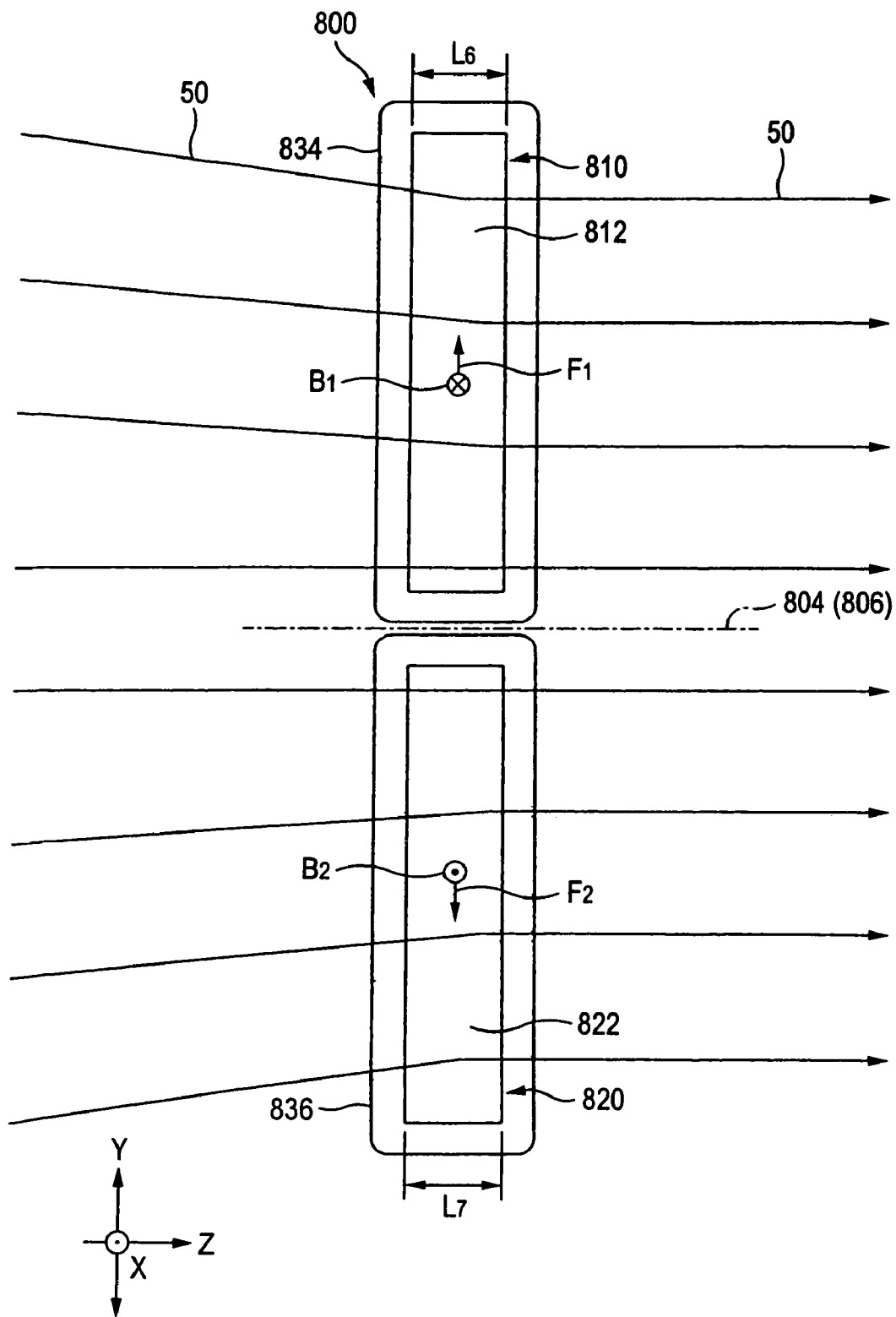
FIG. 55 is a side view taken along the line N-N of FIG. 53 and showing a case where a converging beam is formed as a parallel beam.
Figure 56:
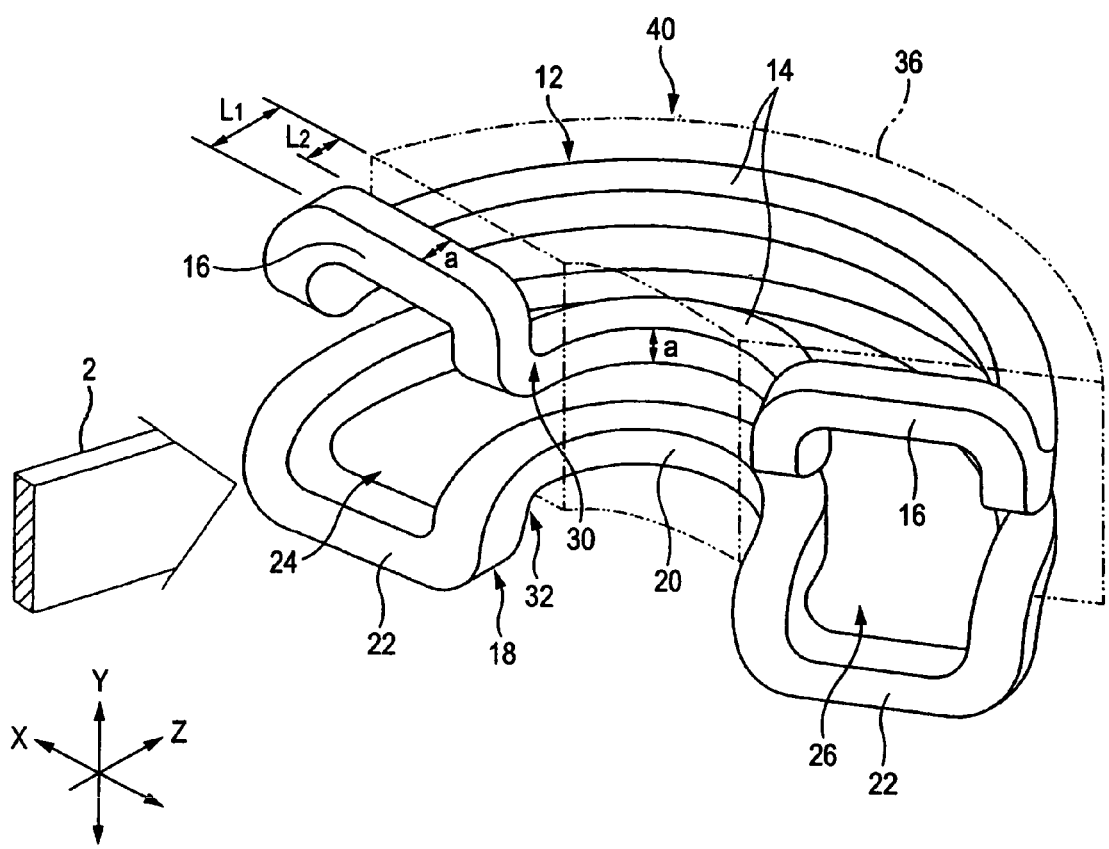
FIG. 56 is a perspective view showing an example of a conventional analyzing electromagnet in which a yoke is indicated by two-dot chain lines in order to facilitate the understanding of the shapes of coils.

The winding manner and number of the coils, the DC power sources for the coils, and the like are not restricted to those of the example. For example, all the coils 834 to 837 may be connected in series, and excited by a single DC power source. Alternatively, coils may be wound only on one of the right and left magnetic poles 812, and one of the right and left magnetic poles 822, or coils may be wound on an intermediate portion of both or one of yokes 830, 832 which will be described later. In any case, the magnetic fields $B_1$, $B_2$ that are opposite to each other are generated. Examples shown in FIGS. 53 to 55 are configured in a similar manner.

In the deflecting electromagnet 800, as shown in FIG. 51, lengths $L_6$, $L_7$ in the ion beam traveling direction Z of the magnetic poles 812, 822 constituting the first and second magnetic pole pairs 810, 820 are made larger as being further outward (vertically) separated in the Y direction from the center 804 of the beam path 802. Therefore, a side-view shape of each of the magnetic poles 812, 822 has a shape similar to a triangular or wedge-like shape in which the outside in the Y direction is wider. Preferably, the magnetic poles 812 and the magnetic poles 822 have a shape which is substantially plane-symmetrical in the Y direction about a symmetry plane 806 that passes the center 804 in the Y direction of the beam path 802, and that is parallel to the XZ plane. This example is configured in this manner.

In the case where the deflecting electromagnet 800 is dedicated to form the divergent ion beam 50 as a parallel beam, as in the example shown in FIG. 51, it is preferable that inlet planes 813, 823 of the magnetic poles 812, 822 are formed into an arcuate shape which is swollen in the ion beam traveling direction Z, and outlet plane 814, 824 are formed into a linear shape. According to the configuration, the incidence and emission angles of the ion beam 50 with respect to the inlet planes 813, 823 and the outlet plane 814, 824 can be made close to a right angle in any position of the Y direction. Therefore, the ion beam 50 can be easily formed into a parallel beam.

In the example, the coils 834 to 837 are wound along the magnetic poles 812, 822, and have a shape which is obtained by deforming a rectangle. However, it is not necessary to wind the coils along the magnetic poles. In the same manner as the example shown in FIG. 54, for example, the coils may have a shape which is similar to a rectangle. This is because the shapes of the magnetic poles 812, 822 are important.

In the deflecting electromagnet 800, the magnetic fields $B_1$, $B_2$ that are opposite to each other as described above are generated in the gap 816 between the first magnetic pole pair 810, and the gap 826 between the second magnetic pole pair 820. Therefore, Lorentz forces $F_1$, $F_2$ which are applied to the ion beam 50 passing through the gaps 816, 826 are inward directed as shown in FIG. 51. Consequently, a function of confining the ion beam 50 is exerted.

Furthermore, the lengths $L_6$, $L_7$ in the ion beam traveling direction Z of the magnetic poles 812, 822 constituting the first and second magnetic pole pairs 810, 820 are made larger as being further outward separated in the Y direction from the center 804 of the beam path 802. Therefore, the ion beam 50 passes through a longer distance between the magnetic poles 812, 822 to be bent more strongly as being further outward separated in the Y direction from the center 804 of the beam path 802. As a result, it is possible to control the orbit state in the Y direction of the ion beam 50.

When attention is focused on the Y direction, for example, the ion beam 50 has a property that the beam is diverged in the Y direction by the space charge effect. As shown in, for example, FIG. 51, usually, the divergence angle of the ion beam is small in the vicinity of the center 804 in the Y direction, and becomes larger as being further separated from the center 804 toward the outside. This is caused because, in a diverging beam, the degree of divergence is larger as further advancing toward the end.

By contrast, when the lengths $L_6$, $L_7$ in the ion beam traveling direction Z of the magnetic poles 812, 822 are changed as described above, the ion beam 50 is bent more strongly as the ion beam is further outward separated from the center 804. Therefore, the divergence of the ion beam 50 can be adequately compensated (canceled) and the ion beam can be formed into a parallel beam. Namely, the ion beam 50 which is diverged in the Y direction can be derived while being substantially formed into a parallel beam.

The degree of changing the lengths $L_6$, $T_7$ in the ion beam traveling direction Z of the magnetic poles 812, 822 may be determined in accordance with the degree of divergence of the incident ion beam 50, or the like. Namely, in the case where the ion beam 50 which is largely diverged is handled, the change of the lengths $L_6$, $L_7$ may be made large, and, in the case where the ion beam 50 which is slightly diverged is handled, the change of the lengths $L_6$, $L_7$ may be made small.

When the ion beam 50 which is substantially parallel in the Y direction is incident on the deflecting electromagnet 800, it is possible to derive the ion beam 50 which is converged in the Y direction. The ion beam 50 has a property that the beam is diverged by the space charge effect. In the ion beam 50 which has a low energy and a large beam current, particularly, the property is strongly exhibited. When the ion beam 50 which is converged is taken out from the deflecting electromagnet 800 to be balanced (offset) with the divergence due to the space charge effect between the deflecting electromagnet 800 and the substrate 60, therefore, the ion beam 50 in the incident on the substrate 60 can be formed as a substantially parallel beam.

Figure 52:
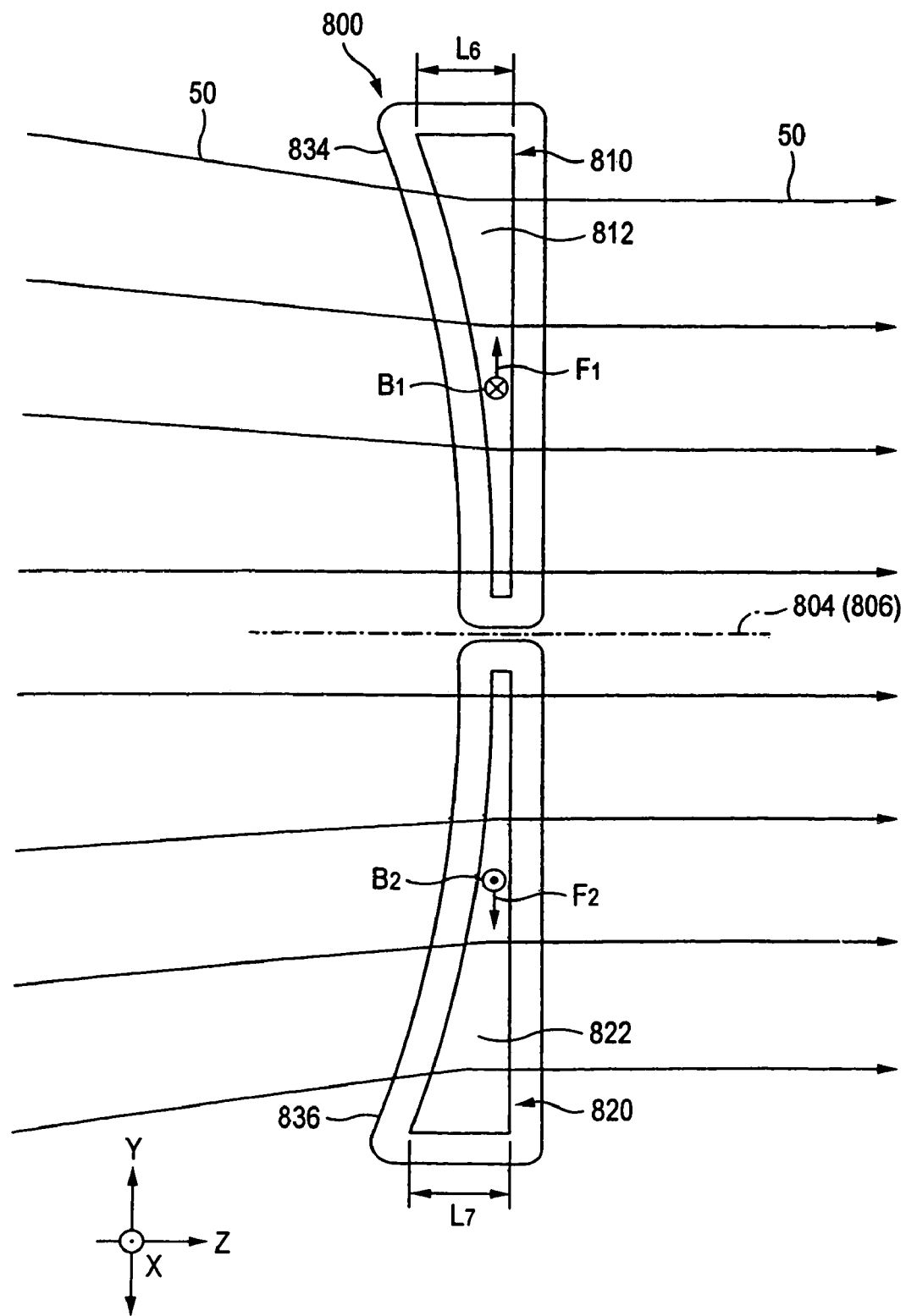
FIG. 52 is a side view taken along the line M-M of FIG. 50 and showing a case where a converging beam is formed as a parallel beam.

The directions of the currents flowing through the coils 834 to 837 may be made opposite to those of the above-described case, by, for example, reversely connecting the DC power sources 840, 842, so that, as in the example shown in FIG. 52, the directions of the magnetic fields $B_1$, $B_2$ are opposite to those of the examples of FIGS. 50 and 51. However, the directions of the magnetic fields $B_1$, $B_2$ remain to be opposite to each other.

In the example of FIG. 52, Lorentz forces $F_1$, $F_2$ which are applied to the ion beam 50 passing through the gaps 816, 826 are outward directed. Consequently, a function of spreading the ion beam 50 is exerted. Also in this example, the ion beam 50 passes through a longer distance between the magnetic poles 812, 822 to be bent more strongly as being further outward separated in the Y direction from the center 804 of the beam path 802. As a result, it is possible to control the orbit state in the Y direction of the ion beam 50.

For example, attention is focused on the Y direction. In the case where, for example, the ion beam 50 passes through another apparatus to be converged (confined) in the Y direction, usually, the convergence angle of the ion beam is small in the vicinity of the center 804 in the Y direction as shown in, for example, FIG. 52, and becomes larger as being further separated from the center 804 toward the outside. This is caused because, in a converging beam, the degree of convergence is larger as further advancing toward the end.

By contrast, when the lengths $L_6$, $L_7$ in the ion beam traveling direction Z of the magnetic poles 812, 822 are changed as described above, the ion beam 50 is bent more strongly as the ion beam is further outward separated from the center 804. Therefore, the convergence of the ion beam 50 can be adequately compensated (canceled) and the ion beam can be formed into a parallel beam. Namely, the ion beam 50 which is converged in the Y direction can be derived while being substantially formed into a parallel beam.

The degree of changing the lengths $L_6$, $L_7$ in the ion beam traveling direction Z of the magnetic poles 812, 822 may be determined in accordance with the degree of convergence of the incident ion beam 50, or the like. Namely, in the case where the ion beam 50 which is largely converged is handled, the change of the lengths $L_6$, $L_7$ may be made large, and, in the case where the ion beam 50 which is slightly converged is handled, the change of the lengths $L_6$, $L_7$ may be made small.

When the ion beam 50 which is substantially parallel in the Y direction is incident on the deflecting electromagnet 800, it is possible to derive the ion beam 50 which is diverged in the Y direction. For example, on the downstream side of the deflecting electromagnet 800, a beam converging device is disposed. The divergence due to the former, and the convergence due to the latter are combined with each other, so that the ion beam 50 can be formed as a parallel beam. According to the configuration, the dimension $W_Y$ in the Y direction of the ion beam 50 can be further increased.

The deflecting electromagnet 800 has a feature that, in any of the above cases, an unwanted lens function hardly appears in the X direction as compared with the case where an electrostatic field is used.

The deflecting electromagnet 800 further comprises: a first yoke 830 which magnetically connects the back face (the face opposite to the gap 816, the same shall apply hereinafter) in the X direction of one (in the left side of FIG. 50, the same shall apply hereinafter) of the magnetic poles 812 constituting the first magnetic pole pair 810, with the back face in the X direction of one of the magnetic poles 822 that is on the same side in the X direction as the magnetic pole 812, and that constitutes the second magnetic pole pair 820; and a second yoke 832 which magnetically connects the back face in the X direction of the other (in the right side of FIG. 50, the same shall apply hereinafter) of the magnetic poles 812 constituting the first magnetic pole pair 810, with the back face in the X direction of the other magnetic pole 822 that is on the same side in the X direction as the magnetic pole 812, and that constitutes the second magnetic pole pair 820.

According to the configuration, a loop-like magnetic circuit is formed so that the magnetic flux forms a loop (see magnetic fields $B_1$ to $B_4$), by the first magnetic pole pair 810, the second magnetic pole pair 820, the first yoke 830, and the second yoke 832. Therefore, a leakage magnetic field to the outside can be reduced, and the magnetic fields $B_1$, $B_2$ can be efficiently generated in the gap 816 between the first magnetic pole pair 810 and gap 826 between the second magnetic pole pair 820 in which a magnetic field is required.

FIG. 53 is a front view showing another example of the deflecting electromagnet together with a power source, and FIG. 54 is a side view taken along the line N-N of FIG. 53 and showing a case where a diverging beam is formed as a parallel beam. The portions which are identical or corresponding to those of the example shown FIGS. 50 to 52 are denoted by the same reference numerals. In the following description, emphasis is placed on differences from the example.

In the deflecting electromagnet 800, as shown in FIG. 54, the lengths $L_6$, $L_7$ in the ion beam traveling direction Z of the magnetic poles 812, 822 constituting the first and second magnetic pole pairs 810, 820 are made substantially constant in the Y direction. Preferably, the lengths $L_6$, $L_7$ are substantially equal to each other. This example is configured in this manner.

To comply with the above, as shown in FIG. 53, the gap length $G_1$ of the first magnetic pole pair 810, and the gap length $G_2$ of the second magnetic pole pair 820 are made smaller as being further outward (vertically) separated in the Y direction from the center 804 of the beam path 802. preferably, the gap 816 of the first magnetic pole pair 810, and the gap 826 of the second magnetic pole pair 820 have a shape which is substantially plane-symmetrical in the Y direction about the symmetry plane 806 that passes the center 804 in the Y direction of the beam path 802, and that is parallel to the XZ plane. This example is configured in this manner.

When the gap lengths $G_1$, $G_2$ in the Y direction are changed as described above, the magnetic flux density is low in a place close to the center 804 of the beam path 802, and becomes higher as being further outward separated from the center 804. Therefore, the ion beam 50 is bent more strongly as the ion beam is further outward separated in the Y direction from the center 804 of the beam path 802. As a result, in the same manner as the previous example, it is possible to control the orbit state in the Y direction of the ion beam 50.

As in the example shown in FIG. 54, for example, a diverging incident ion beam 50 can be derived as a substantially parallel beam. FIG. 54 corresponds to FIG. 51. When the ion beam 50 which is substantially parallel in the Y direction is incident on the deflecting electromagnet 800, it is possible to derive the ion beam 50 which is converged in the Y direction. The object and function of the configuration are as described above.

The directions of the currents flowing through the coils 834 to 837 may be made opposite to those of the above-described case, so that, as in the example shown in FIG. 52, the directions of the magnetic fields $B_1$, $B_2$ are opposite to those of the example of FIG. 54. However, the directions of the magnetic fields $B_1$, $B_2$ remain to be opposite to each other. FIG. 55 corresponds to FIG. 52.

In the case of FIG. 55, an incident ion beam 50 which is converged in the Y direction can be derived as a substantially parallel beam. When the ion beam 50 which is substantially parallel in the Y direction is incident on the deflecting electromagnet 800, it is possible to derive the ion beam 50 which is diverged in the Y direction. The object and function of the configuration are as described above.

The degree of changing the gap lengths $G_1$, $G_2$ in the Y direction may be determined in accordance with the degree of divergence (or convergence) of the incident ion beam, or the like. Namely, in the case where the ion beam 50 which is largely diverged (or converged) is handled, the change of the gap lengths $G_1$, $G_2$ may be made large, and, in the case where the ion beam 50 which is slightly diverged (or converged) is handled, the change of the gap lengths $G_1$, $G_2$ may be made small.

When the deflecting electromagnet 800 is disposed in the ion implanter shown in FIG. 1, the parallelism in the Y direction of the ion beam 50 in the incident on the substrate 60 can be enhanced. As a result, ion implantation of high homogenization can be performed on the substrate 60.

In the case where, as in an electric field lens, an orbit is changed by accelerating or decelerating an ion beam, there is a possibility that particles (for example, neutral particles) of an energy which is different by the accelerated or decelerated energy from that of the incident ion beam are generated and enter the substrate 60 (this is called energy contamination). By contrast, in the deflecting electromagnet 800, the orbit of an ion beam is bent by means of a magnetic field, and, unlike an electric field lens, the orbit is not changed by accelerating or decelerating the ion beam. Therefore, energy contamination does not occur. Consequently, the deflecting electromagnet 800 may be disposed between the accelerating/decelerating device 400 and the implanting position, or disposed in a place close to the substrate 60. Namely, in the deflecting electromagnet 800, energy contamination is not caused, and hence the parallelism of the ion beam 50 can be enhanced in the vicinity of the substrate 60. Therefore, the parallelism of the ion beam 50 in the incident on the substrate 60 can be enhanced more surely.

What is claimed is:

1. An ion implanter in which a traveling direction of an ion beam is set as a Z direction, two directions which are substantially orthogonal to each other in a plane that is substantially orthogonal to the Z direction are set as X and Y directions, respectively, and a ribbon-like ion beam in which a dimension in the Y direction is larger than a dimension in the X direction is transported to irradiate a substrate, thereby performing ion implantation, wherein said ion implanter comprising:

an ion source that generates the ribbon-like ion beam in which the Y-direction dimension is larger than a dimension in the Y direction of said substrate;

an analyzing electromagnet which, bends the ion beam from said ion source in the X direction to analyze a momentum, and which forms a focus of an ion beam of a desired momentum, in a downstream side;

an analysis slit which is disposed in a vicinity of the focus of the ion beam from said analyzing electromagnet, and which cooperates with said analyzing electromagnet to analyze the momentum of the ion beam;

an accelerating/decelerating device which bends the ion beam passed through said analysis slit, in the X direction by means of an electrostatic field, and which accelerates or decelerates the ion beam by means of the electrostatic field; and a substrate driving device which, at an implanting position where the ion beam passed through said accelerating/decelerating device is caused to be incident on the substrate, moves the substrate in a direction intersecting with a principal face of the ion beam, wherein said analyzing electromagnet comprises:

a first coil which is a saddle-shaped coil having: one set of body portions that are opposed to each other in the X direction across the beam path through which the ion beam passes, and that cover about a half or more of one side of the ion beam in the Y direction; and one set of connecting portions that connect end portions of said body portions in the Z direction with each other, while avoiding said beam path, said first coil cooperating with a second coil to generate a magnetic field which bends the ion beam in the X direction; and said second coil which is a saddle-shaped coil having: one set of body portions that are opposed to each other in the X direction across the beam path, and that cover about a half or more of another side of the ion beam in the Y direction; and one set of connecting portions that connect end portions of said body portions in the Z direction with each other, while avoiding said beam path, said second coil being disposed overlappingly with said first coil in the Y direction, and cooperating with said first coil to generate a magnetic field which bends the ion beam in the X direction, a yoke which collectively surrounds outer sides of said body portions of said first and second coils, and wherein each of said first and second coils of said analyzing electromagnet has a configuration in which a notched portion is disposed in a fan-shaped cylindrical stacked coil while leaving said body portions and said connecting portions, said stacked coil being configured by: stacking laminations of an insulation sheet and conductor sheet in which a principal face extends along the Y direction, on an outer peripheral face of a laminated insulator, while winding the laminations in multiple turns; and forming a laminated insulator on an outer peripheral face of the stack.

2. An ion implanter according to claim 1, wherein said analyzing electromagnet further comprises one set of magnet poles which are inwardly projected from said yoke so as to be opposed to each other in the Y direction across the beam path.

3. An ion implanter according to claim 1, further comprising:

a focus correction lens which is disposed in at least one of between said ion source and said analyzing electromagnet, and between said analyzing electromagnet and said analysis slit, and which performs a correction of making a position of the focus of the ion beam coincident with a position of said analysis slit, by means of an electrostatic field.

4. An ion implanter according to claim 3, wherein said focus correction lens has inlet, intermediate, and outlet electrodes which are arranged in the ion beam traveling direction while forming gaps therebetween, each of said inlet, intermediate, and outlet electrodes of said focus correction lens has a pair of electrodes that are opposed to each other in the X direction across a gap through which the ion beam passes, and that are electrically conductive to each other, said inlet and outlet electrodes of said focus correction lens are maintained to a same potential, and said intermediate electrode is maintained to a potential which is different from the potential of said inlet and outlet electrodes, and which causes the focus of the ion beam to coincide with the position of said analysis slit.

5. An ion implanter according to claim 1, wherein said accelerating/decelerating device has first to third electrodes which are arranged in a sequence of said first electrode, said second electrode, and said third electrode in the ion beam traveling direction with starting from an upstream side, and accelerates or decelerates the ion beam in two stages between said first and second electrodes, and said second and third electrodes, said second electrode is configured by two electrode members which are opposed to each other in the X direction across the path of the ion beam, and to which different potentials are applied to deflect the ion beam in the X direction, and said third electrode is disposed along an orbit of an ion beam having a specific energy after the deflection.

6. An ion implanter according to claim 1, further comprising:
an orbit control lens which is disposed between said analyzing electromagnet and said accelerating/decelerating device, which bends the ion beam in the Y direction by means of an electrostatic field, and which has inlet, intermediate, and outlet electrodes that are arranged in the ion beam traveling direction while forming gaps therebetween,
wherein each of said inlet, intermediate, and outlet electrodes of said orbit control lens has a pair of electrodes that are opposed to each other in the X direction across a gap through which the ion beam passes, and that are electrically conductive to each other,
said intermediate electrode of said orbit control lens has a convex surface which is curved in the Y direction, in each of upstream and downstream side faces in the ion beam traveling direction,
each of said inlet and outlet electrodes of said orbit control lens has a concave surface in a face opposed to said convex surface of said intermediate electrode, said concave surface extending along said convex surface, and
said inlet and outlet electrodes of said orbit control lens are maintained to a same potential, and said intermediate electrode is maintained to a potential which is different from the potential of said inlet and outlet electrodes, and which makes an orbit state in the Y direction of the ion beam derived from said orbit control lens to a desired state.

7. An ion implanter according to claim 1, further comprising:
an orbit control lens which is disposed between said analyzing electromagnet and said accelerating/decelerating device, which bends the ion beam in the Y direction by means of an electrostatic field, and which has inlet, intermediate, and outlet electrodes that are arranged in the ion beam traveling direction while forming gaps therebetween,
wherein each of said inlet, intermediate, and outlet electrodes of said orbit control lens has a pair of electrodes that are opposed to each other in the X direction across a gap through which the ion beam passes, and that are electrically conductive to each other,
said intermediate electrode of said orbit control lens has a concave surface which is curved in the Y direction, in each of upstream and downstream side faces in the ion beam traveling direction,
each of said inlet and outlet electrodes of said orbit control lens has a convex surface in a face opposed to said concave surface of said intermediate electrode, said convex surface extending along said concave surface,
said inlet and outlet electrodes of said orbit control lens are maintained to a same potential, and said intermediate electrode is maintained to a potential which is different from the potential of said inlet and outlet electrodes, and which makes an orbit state in the Y direction of the ion beam derived from said orbit control lens to a desired state.

8. An ion implanter according to claim 1, further comprising
a homogenizing lens which is disposed between said analyzing electromagnet and said accelerating/decelerating device, which, in the Y direction, has plural pairs of electrodes that are opposed to each other in the X direction across a gap through which the ion beam passes, and that are electrically conductive to each other, which bends orbits in plural places in the Y direction of the ion beam by means of an electrostatic field, and which homogenizes a beam current density distribution in the Y direction of the ion beam at the implanting position.

9. An ion implanter according to claim 1, further comprising:
a deflecting electromagnet that is disposed between said analyzing electromagnet and the implanting position, that generates a magnetic field extending along the X direction, in the beam path through which the ion beam passes,
wherein said deflecting electromagnet comprises:
a first magnetic pole pair having a pair of magnetic poles that are opposed to each other in the X direction across the beam path, and that cover about a half or more of one side of the ion beam in the Y direction;
a second magnetic pole pair having a pair of magnetic poles that are opposed to each other in the X direction across the beam path, and that cover about a half or more of another side of the ion beam in the Y direction; and
coils that generate opposite magnetic fields in a gap in said first magnetic pole pair, and in a gap in said second magnetic pole pair,
wherein lengths in the ion beam traveling direction of said magnetic poles constituting said first and second magnetic pole pairs being larger as being further outward separated in the Y direction from a center of the beam path.

10. An ion implanter according to claim 1, further comprising:
a deflecting electromagnet that is disposed between said analyzing electromagnet and the implanting position, that generates a magnetic field extending along the X direction, in the beam path through which the ion beam passes,
wherein said deflecting electromagnet comprises:
a first magnetic pole pair having a pair of magnetic poles that are opposed to each other in the X direction across the beam path, and that cover about a half or more of one side of the ion beam in the Y direction;
a second magnetic pole pair having a pair of magnetic poles that are opposed to each other in the X direction across the beam path, and that cover about a half or more of another side of the ion beam in the Y direction; and
coils that generate opposite magnetic fields in a gap in said first magnetic pole pair, and in a gap in said second magnetic pole pair, and
wherein gap lengths in said first and second magnetic pole pairs are smaller as being further outward separated in the Y direction from a center of the beam path.

11. An ion implanter in which a traveling direction of an ion beam is set as a Z direction, two directions which are substantially orthogonal to each other in a plane that is substantially orthogonal to the Z direction are set as X and Y directions, respectively, and a ribbon-like ion beam in which a dimension in the Y direction is larger than a dimension in the X direction is transported to irradiate a substrate, thereby performing ion implantation, wherein said ion implanter comprising:

an ion source that generates the ribbon-like ion beam in which the Y-direction dimension is larger than a dimension in the Y direction of said substrate;

an analyzing electromagnet which, bends the ion beam from said ion source in the X direction to analyze a momentum, and which forms a focus of an ion beam of a desired momentum, in a downstream side;

an analysis slit which is disposed in a vicinity of the focus of the ion beam from said analyzing electromagnet, and which cooperates with said analyzing electromagnet to analyze the momentum of the ion beam;

an accelerating/decelerating device which bends the ion beam passed through said analysis slit, in the X direction by means of an electrostatic field, and which accelerates or decelerates the ion beam by means of the electrostatic field; and a substrate driving device which, at an implanting position where the ion beam passed through said accelerating/decelerating device is caused to be incident on the substrate, moves the substrate in a direction intersecting with a principal face of the ion beam, wherein said analyzing electromagnet comprises:

a first inner coil which is a saddle-shaped coil having: one set of body portions that are opposed to each other in the X direction across the beam path through which the ion beam passes, and that cover about a half or more of one side of the ion beam in the Y direction; and one set of connecting portions that connect end portions of said body portions in the Z direction with each other, while avoiding said beam path, said first coil cooperating with a second inner coil to generate a main magnetic field which bends the ion beam in the X direction;

said second inner coil which is a saddle-shaped coil having: one set of body portions that are opposed to each other in the X direction across the beam path, and that cover about a half or more of another side of the ion beam in the Y direction; and one set of connecting portions that connect end portions of said body portions in the Z direction with each other, while avoiding said beam path, said second inner coil being disposed overlappingly with said first inner coil in the Y direction, and cooperating with said first inner coil to generate the main magnetic field which bends the ion beam in the X direction;

one or more first outer coils which are saddle-shaped coils having: one set of body portions that are outside said first inner coil, and that are opposed to each other in the X direction across the beam path; and one set of connecting portions that connect end portions of said body portions in the Z direction with each other, while avoiding said beam path, said first outer coils generating a sub-magnetic field which assists or corrects the main magnetic field;

one or more second outer coils which are saddle-shaped coils having: one set of body portions that are outside said second inner coil, and that are opposed to each other in the X direction across the beam path; and one set of connecting portions that connect end portions of said body portions in the Z direction with each other, while avoiding said beam path, said second outer coils being disposed overlappingly with said first outer coils in the Y direction, and generating a sub-magnetic field which assists or corrects the main magnetic field, a yoke which collectively surrounds outer sides of said body portions of said first and second inner coils, and said first and second outer coils, wherein each of said first inner coil and said first outer coil of said analyzing electromagnet has a configuration in which a notched portion is disposed in a fan-shaped cylindrical stacked coil while leaving said body portions and said connecting portions, said stacked coil being configured by: stacking laminations of an insulation sheet and conductor sheet in which a principal face extends along the Y direction, on an outer peripheral face of a laminated insulator, while winding the laminations in multiple turns; forming a laminated insulator on an outer peripheral face of the stack; stacking laminations of an insulation sheet and conductor sheet in which a principal face extends along the Y direction, on an outer peripheral face of the stack, while winding the laminations in multiple turns; and forming a laminated insulator on an outer peripheral face of the stack, and wherein each of said second inner coil and said second outer coil of said analyzing electromagnet has a configuration in which a notched portion is disposed in a fan-shaped cylindrical stacked coil while leaving said body portions and said connecting portions, said stacked coil being configured by: stacking laminations of an insulation sheet and conductor sheet in which a principal face extends along the Y direction, on an outer peripheral face of a laminated insulator, while winding the laminations in multiple turns; forming a laminated insulator on an outer peripheral face of the stack; stacking laminations of an insulation sheet and conductor sheet in which a principal face extends along the Y direction, on an outer peripheral face of the stack, while winding the laminations in multiple turns; and forming a laminated insulator on an outer peripheral face of the stack.

12. An ion implanter according to claim 11, wherein said analyzing electromagnet further comprises one set of magnet poles which are inwardly projected from said yoke so as to be opposed to each other in the Y direction across the beam path.

13. An ion implanter according to claim 11, further comprising:

a focus correction lens which is disposed in at least one of between said ion source and said analyzing electromagnet, and between said analyzing electromagnet and said analysis slit, and which performs a correction of making a position of the focus of the ion beam coincident with a position of said analysis slit, by means of an electrostatic field.

14. An ion implanter according to claim 13, wherein said focus correction lens has inlet, intermediate, and outlet electrodes which are arranged in the ion beam traveling direction while forming gaps therebetween, each of said inlet, intermediate, and outlet electrodes of said focus correction lens has a pair of electrodes that are opposed to each other in the X direction across a gap through which the ion beam passes, and that are electrically conductive to each other, said inlet and outlet electrodes of said focus correction lens are maintained to a same potential, and said intermediate electrode is maintained to a potential which is different from the potential of said inlet and outlet electrodes, and which causes the focus of the ion beam to coincide with the position of said analysis slit.

15. An ion implanter according to claim 11, wherein said accelerating/decelerating device has first to third electrodes which are arranged in a sequence of said first electrode, said second electrode, and said third electrode in the ion beam traveling direction with starting from an upstream side, and accelerates or decelerates the ion beam in two stages between said first and second electrodes, and said second and third electrodes, said second electrode is configured by two electrode members which are opposed to each other in the X direction across the path of the ion beam, and to which different potentials are applied to deflect the ion beam in the X direction, and said third electrode is disposed along an orbit of an ion beam having a specific energy after the deflection.

16. An ion implanter according to claim 11, further comprising:
an orbit control lens which is disposed between said analyzing electromagnet and said accelerating/decelerating device, which bends the ion beam in the Y direction by means of an electrostatic field, and which has inlet, intermediate, and outlet electrodes that are arranged in the ion beam traveling direction while forming gaps therebetween,
wherein each of said inlet, intermediate, and outlet electrodes of said orbit control lens has a pair of electrodes that are opposed to each other in the X direction across a gap through which the ion beam passes, and that are electrically conductive to each other,
said intermediate electrode of said orbit control lens has a convex surface which is curved in the Y direction, in each of upstream and downstream side faces in the ion beam traveling direction,
each of said inlet and outlet electrodes of said orbit control lens has a concave surface in a face opposed to said convex surface of said intermediate electrode, said concave surface extending along said convex surface, and
said inlet and outlet electrodes of said orbit control lens are maintained to a same potential, and said intermediate electrode is maintained to a potential which is different from the potential of said inlet and outlet electrodes, and which makes an orbit state in the Y direction of the ion beam derived from said orbit control lens to a desired state.

17. An ion implanter according to claim 11, further comprising:
an orbit control lens which is disposed between said analyzing electromagnet and said accelerating/decelerating device, which bends the ion beam in the Y direction by means of an electrostatic field, and which has inlet, intermediate, and outlet electrodes that are arranged in the ion beam traveling direction while forming gaps therebetween,
wherein each of said inlet, intermediate, and outlet electrodes of said orbit control lens has a pair of electrodes that are opposed to each other in the X direction across a gap through which the ion beam passes, and that are electrically conductive to each other,
said intermediate electrode of said orbit control lens has a concave surface which is curved in the Y direction, in each of upstream and downstream side faces in the ion beam traveling direction,
each of said inlet and outlet electrodes of said orbit control lens has a convex surface in a face opposed to said concave surface of said intermediate electrode, said convex surface extending along said concave surface,
said inlet and outlet electrodes of said orbit control lens are maintained to a same potential, and said intermediate electrode is maintained to a potential which is different from the potential of said inlet and outlet electrodes, and which makes an orbit state in the Y direction of the ion beam derived from said orbit control lens to a desired state.

18. An ion implanter according to claim 11, further comprising
a homogenizing lens which is disposed between said analyzing electromagnet and said accelerating/decelerating device, which, in the Y direction, has plural pairs of electrodes that are opposed to each other in the X direction across a gap through which the ion beam passes, and that are electrically conductive to each other, which bends orbits in plural places in the Y direction of the ion beam by means of an electrostatic field, and which homogenizes a beam current density distribution in the Y direction of the ion beam at the implanting position.

19. An ion implanter according to claim 11, further comprising:
a deflecting electromagnet that is disposed between said analyzing electromagnet and the implanting position, that generates a magnetic field extending along the X direction, in the beam path through which the ion beam passes,
wherein said deflecting electromagnet comprises:
a first magnetic pole pair having a pair of magnetic poles that are opposed to each other in the X direction across the beam path, and that cover about a half or more of one side of the ion beam in the Y direction;
a second magnetic pole pair having a pair of magnetic poles that are opposed to each other in the X direction across the beam path, and that cover about a half or more of another side of the ion beam in the Y direction; and
coils that generate opposite magnetic fields in a gap in said first magnetic pole pair, and in a gap in said second magnetic pole pair,
wherein lengths in the ion beam traveling direction of said magnetic poles constituting said first and second magnetic pole pairs being larger as being further outward separated in the Y direction from a center of the beam path.

20. An ion implanter according to claim 11, further comprising:
a deflecting electromagnet that is disposed between said analyzing electromagnet and the implanting position, that generates a magnetic field extending along the X direction, in the beam path through which the ion beam passes,
wherein said deflecting electromagnet comprises:
a first magnetic pole pair having a pair of magnetic poles that are opposed to each other in the X direction across the beam path, and that cover about a half or more of one side of the ion beam in the Y direction;
a second magnetic pole pair having a pair of magnetic poles that are opposed to each other in the X direction across the beam path, and that cover about a half or more of another side of the ion beam in the Y direction; and
coils that generate opposite magnetic fields in a gap in said first magnetic pole pair, and in a gap in said second magnetic pole pair, and
wherein gap lengths in said first and second magnetic pole pairs are smaller as being further outward separated in the Y direction from a center of the beam path.

* * * * *